(12) United States Patent
Cheng et al.

(10) Patent No.: US 12,131,695 B2
(45) Date of Patent: Oct. 29, 2024

(54) DISPLAY PANEL, DISPLAY DEVICE AND TERMINAL DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yudiao Cheng, Beijing (CN); Yue Long, Beijing (CN); Yuanyou Qiu, Beijing (CN); Qiwei Wang, Beijing (CN); Chao Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 527 days.

(21) Appl. No.: 17/423,885

(22) PCT Filed: Nov. 6, 2020

(86) PCT No.: PCT/CN2020/127256
§ 371 (c)(1),
(2) Date: Jul. 18, 2021

(87) PCT Pub. No.: WO2022/067967
PCT Pub. Date: Apr. 7, 2022

(65) Prior Publication Data
US 2022/0376015 A1 Nov. 24, 2022

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *G09G 3/3275* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS 9,153,169 B2  10/2015  Yamashita et al.
10,186,191 B2  1/2019  Kang et al.
(Continued)

FOREIGN PATENT DOCUMENTS

CN  106469743 A  3/2017
CN  107610635 A  1/2018
(Continued)

OTHER PUBLICATIONS

Written Opinion for International Application No. PCT/CN2020/119673 mailed Jun. 23, 2021.
(Continued)

*Primary Examiner* — Benyam Ketema
(74) *Attorney, Agent, or Firm* — Perilla Knox & Hildebrandt LLP; Kenneth A. Knox

(57) ABSTRACT

A display panel includes: a drive backplane having a transparent region and a pixel region surrounding the transparent region, wherein a plurality of pixel circuits are provided in the pixel region, and the pixel circuits include a plurality of columns of first pixel circuits and a plurality of columns of second pixel circuits distributed along a row direction; and a light-emitting layer including a plurality of light-emitting devices, wherein the light-emitting devices include a plurality of first light-emitting devices located in the transparent region and a plurality of second light-emitting devices
(Continued)

located in the pixel region, each of the first light-emitting devices is connected to one of the first pixel circuits via one of transparent electric conductors, and a deviation between delay time of a signal transmitted by any of the electric conductors and a standard delay time is not greater than a deviation threshold.

19 Claims, 47 Drawing Sheets

(51) Int. Cl.
    *G09G 3/3275*     (2016.01)
    *H10K 50/86*     (2023.01)
    *H10K 59/12*     (2023.01)
    *H10K 59/121*     (2023.01)
    *H10K 59/131*     (2023.01)
    *H10K 59/35*     (2023.01)
    *H10K 59/65*     (2023.01)
    *H10K 59/88*     (2023.01)
    *H10K 71/00*     (2023.01)

(52) U.S. Cl.
    CPC ......... *H10K 50/865* (2023.02); *H10K 59/121* (2023.02); *H10K 59/1213* (2023.02); *H10K 59/1216* (2023.02); *H10K 59/131* (2023.02); *H10K 59/351* (2023.02); *H10K 59/65* (2023.02); *H10K 59/88* (2023.02); *H10K 71/00* (2023.02); *H10K 71/621* (2023.02); *G09G 2300/0413* (2013.01); *G09G 2300/0426* (2013.01); *G09G 2300/0819* (2013.01); *G09G 2300/0842* (2013.01); *G09G 2310/0272* (2013.01); *G09G 2310/08* (2013.01); *H10K 59/1201* (2023.02); *H10K 59/353* (2023.02)

(58) Field of Classification Search
    CPC ............... G09G 3/3225; G09G 3/3275; G09G 2300/0413; G09G 2310/0272; G09G 2310/08; G09G 2300/0452; G09G 2340/0407; G09G 2354/00; H10K 59/121; H10K 59/1213; H10K 59/131; H10K 59/351; H10K 59/65; H10K 59/88; H10K 71/00; H10K 71/621; H10K 59/1201; H10K 59/353; H10K 59/00
    See application file for complete search history.

(56) References Cited

U.S. PATENT DOCUMENTS

| | | | |
|---|---|---|---|
| 10,290,694 B2 | 5/2019 | Xiang et al. | |
| 10,409,099 B2 | 9/2019 | Hsiao | |
| 10,482,811 B2 | 11/2019 | Kang et al. | |
| 10,672,340 B2 | 6/2020 | Li et al. | |
| 10,733,931 B2* | 8/2020 | Jung | H10K 71/00 |
| 10,756,136 B1* | 8/2020 | Ma | H10K 59/60 |
| 10,854,124 B2* | 12/2020 | Yang | G09G 3/20 |
| 11,114,032 B2* | 9/2021 | Bian | G09G 3/325 |
| 11,183,544 B2* | 11/2021 | Zhang | H10K 59/131 |
| 11,227,538 B2* | 1/2022 | Yang | H10K 59/121 |
| 11,727,849 B2* | 8/2023 | Lu | G09G 3/2074 |
| | | | 345/694 |
| 11,810,505 B2 | 11/2023 | Lee et al. | |
| 11,847,964 B2* | 12/2023 | Huang | H10K 59/1213 |
| 11,862,081 B2 | 1/2024 | Cheng et al. | |
| 2009/0179838 A1 | 7/2009 | Yamashita et al. | |
| 2013/0083080 A1* | 4/2013 | Rappoport | G09G 3/30 |
| | | | 345/698 |
| 2016/0358576 A1* | 12/2016 | Lee | G09G 3/3674 |
| 2017/0162111 A1* | 6/2017 | Kang | G09G 3/3225 |
| 2017/0200777 A1 | 7/2017 | Li et al. | |
| 2018/0166017 A1 | 6/2018 | Li et al. | |
| 2018/0219058 A1 | 8/2018 | Xiang et al. | |
| 2018/0293936 A1* | 10/2018 | Fujioka | G09G 3/3208 |
| 2018/0308417 A1* | 10/2018 | Xie | G09G 3/3266 |
| 2018/0366066 A1* | 12/2018 | Kim | H10K 59/1216 |
| 2019/0004354 A1 | 1/2019 | Hsiao | |
| 2019/0096962 A1 | 3/2019 | Han et al. | |
| 2019/0122608 A1 | 4/2019 | Kang et al. | |
| 2020/0051497 A1 | 2/2020 | Kang et al. | |
| 2020/0052048 A1* | 2/2020 | Kuo | H10K 59/123 |
| 2020/0194532 A1 | 6/2020 | Lee et al. | |
| 2020/0251539 A1 | 8/2020 | Fu | |
| 2020/0312209 A1 | 10/2020 | Yang et al. | |
| 2020/0411610 A1* | 12/2020 | Zhang | H10K 59/131 |
| 2021/0043135 A1* | 2/2021 | Zhao | G09G 3/3266 |
| 2021/0090501 A1* | 3/2021 | Wu | G09G 3/3258 |
| 2021/0351255 A1* | 11/2021 | Chang | H10K 50/84 |
| 2022/0069047 A1* | 3/2022 | Yang | H10K 59/88 |
| 2022/0093682 A1* | 3/2022 | Chang | H10K 59/00 |
| 2022/0189394 A1 | 6/2022 | Yang | |
| 2022/0293692 A1* | 9/2022 | Xu | H10K 71/00 |
| 2022/0343862 A1* | 10/2022 | Cheng | H10K 71/621 |
| 2022/0376000 A1* | 11/2022 | Du | G09G 3/3225 |
| 2022/0376015 A1* | 11/2022 | Cheng | H10K 50/865 |
| 2023/0410719 A1* | 12/2023 | Park | G09G 3/3233 |

FOREIGN PATENT DOCUMENTS

| | | |
|---|---|---|
| CN | 107610645 A | 1/2018 |
| CN | 108010947 A | 5/2018 |
| CN | 207425860 U | 5/2018 |
| CN | 108365123 A | 8/2018 |
| CN | 108389879 A | 8/2018 |
| CN | 108445684 A | 8/2018 |
| CN | 108922482 A | 11/2018 |
| CN | 109037287 A | 12/2018 |
| CN | 109671759 A | 4/2019 |
| CN | 109742128 A | 5/2019 |
| CN | 109801950 A | 5/2019 |
| CN | 109904214 A | 6/2019 |
| CN | 109950288 A | 6/2019 |
| CN | 110061014 A | 7/2019 |
| CN | 110232892 A | 9/2019 |
| CN | 110265455 A | 9/2019 |
| CN | 110459175 A | 11/2019 |
| CN | 110603578 A | 12/2019 |
| CN | 110634930 A | 12/2019 |
| CN | 209731298 U | 12/2019 |
| CN | 110767157 A | 2/2020 |
| CN | 110767174 A | 2/2020 |
| CN | 110767681 A | 2/2020 |
| CN | 110767720 A | 2/2020 |
| CN | 110825264 A | 2/2020 |
| CN | 110874990 A | 3/2020 |
| CN | 110890026 A | 3/2020 |
| CN | 110969982 A | 4/2020 |
| CN | 111048005 A | 4/2020 |
| CN | 210245501 U | 4/2020 |
| CN | 111180494 A | 5/2020 |
| CN | 111211152 A | 5/2020 |
| CN | 210515985 U | 5/2020 |
| CN | 111261677 A | 6/2020 |
| CN | 111261684 A | 6/2020 |
| CN | 111326560 A | 6/2020 |
| CN | 111402743 A | 7/2020 |
| CN | 111446282 A | 7/2020 |
| CN | 111508377 A | 8/2020 |
| CN | 111725287 A | 9/2020 |
| CN | 107610635 B | 3/2021 |
| EP | 3176772 A1 | 6/2017 |
| EP | 3176772 B1 | 4/2019 |
| JP | 2016001303 A | 1/2016 |
| JP | 2018180110 A | 11/2018 |
| JP | 2020038758 A | 3/2020 |
| WO | 2018196149 A1 | 11/2018 |
| WO | 2020049811 A1 | 3/2020 |
| WO | 2020155555 A1 | 8/2020 |

(56) References Cited

FOREIGN PATENT DOCUMENTS

| WO | 2021000625 A1 | 1/2021 |
| WO | 2021016926 A1 | 2/2021 |

OTHER PUBLICATIONS

Written Opinion for International Application No. PCT/CN2020/127256 mailed Jul. 6, 2021.
International Search Report and Written Opinion for International Application No. PCT/CN2021/080494 mailed Apr. 7, 2022.
International Search Report and Written Opinion for International Application No. PCT/CN2020/127186 mailed Apr. 7, 2022.
International Search Report and Written Opinion for International Application No. PCT/CN2020/124401 mailed Apr. 7, 2022.
Non-Final Office Action for U.S. Appl. No. 17/433,292 mailed Feb. 17, 2023.
Notice of Allowance for U.S. Appl. No. 17/789,007 of Aug. 1, 2023.
Non-Final Office Action for U.S. Appl. No. 18/477,479 of May 3, 2024.
Non-Final Office Action for U.S. Appl. No. 18/385,071 of Jun. 4, 2024.
First Office Action for JP Patent Application No. 2023-518291 of Jul. 7, 2024.

* cited by examiner

The 14th column of first pixel circuits

The 40th column of first pixel circuits

The 40th column of first pixel circuits

The 40th column of first pixel circuits

DISPLAY PANEL, DISPLAY DEVICE AND TERMINAL DEVICE

CROSS-REFERENCE TO RELATED APPLICATIONS

The present disclosure is a national phase application under 35 U.S.C. § 371 of International Application No. PCT/CN2020/127256 entitled "DISPLAY PANEL, DISPLAY DEVICE AND TERMINAL DEVICE," filed Nov. 6, 2020, which claims the benefit of and priority to International Application No. PCT/CN2020/119673 entitled "DISPLAY PANEL AND DISPLAY DEVICE," filed Sep. 30, 2020, the contents of both which are hereby incorporated by reference in their entireties herein.

TECHNICAL FIELD

The present disclosure relates to display technologies and, more particularly, to a display panel, a display device, and a terminal device.

BACKGROUND

For a screen of an electronic device having a camera, such as a mobile phone, a tablet computer, etc., a region of the screen corresponding to the camera usually needs to be perforated. Thus, it is impossible to emit light, which is not conducive to increasing the screen-to-body ratio.

It should be noted that information disclosed in the Background Art are provided only for acquiring a better understanding of the background of the present application, and therefore may include information that is not current technology already known to those of ordinary skill in the art.

SUMMARY

It is an object of the present disclosure to provide a display panel, a display device, and a terminal device.

According to an aspect of the present disclosure, there is provided a display panel including:
  a drive backplane, having a transparent region and a pixel region at least partially surrounding the transparent region, wherein a plurality of pixel circuits distributed in an array is provided in the pixel region, and the pixel circuit includes a plurality of columns of first pixel circuits and a plurality of columns of second pixel circuits distributed along a row direction; and
  a light-emitting layer, provided on one side of the drive backplane, and including a plurality of light-emitting devices distributed in an array, wherein the light-emitting devices includes a plurality of first light-emitting devices located in the transparent region and a plurality of second light-emitting devices located in the pixel region,
  wherein each of the first light-emitting devices is connected to one of the first pixel circuits via one of transparent electric conductors, and each of the second pixel circuits is connected to one of the second light-emitting devices, and
  a deviation between delay time of a signal transmitted by any of the electric conductors and a standard delay time is not greater than a deviation threshold.

In an exemplary embodiment of the present disclosure, for two of the electric conductors connected to two of the first pixel circuits in a same row, an area of the electric conductor of the first pixel circuit closer to the transparent region is greater than an area of the electric conductor of the first pixel circuit farther to the transparent region.

In an exemplary embodiment of the present disclosure, the display panel further includes:
  a transfer layer, disposed on one side of the drive backplane, wherein the light-emitting layer is disposed on a surface of the transfer layer, distal to the drive backplane, the transfer layer includes a plurality of lead layers being mutually insulated, each of the lead layers includes a plurality of leads being mutually insulated, and each of the leads extends from the transparent region to the pixel region,
  wherein one of the first light-emitting devices is connected to one of the first pixel circuits via one of the leads, and
  each of the electric conductors includes at least one of the leads.

In an exemplary embodiment of the present disclosure, the lead layer includes at least a first lead layer, a second lead layer and a third lead layer distributed sequentially from the drive backplane towards the light-emitting layer, and
  the transfer layer further includes:
  a first planarization layer, covering the first lead layer and a surface of the drive backplane, close to the light-emitting layer, and the second lead layer is provided on a surface of the first planarization layer, distal to the drive backplane;
  a second planarization layer, covering the second lead layer and a surface of the first planarization layer, close to the light-emitting layer, wherein the third lead layer is disposed on a surface of the second planarization layer, distal to the drive backplane; and
  a third planarization layer, covering the third lead layer and a surface of the second planarization layer, close to the light-emitting layer, wherein the light-emitting layer is provided on a surface of the third planarization layer, distal to the drive backplane.

In an exemplary embodiment of the present disclosure, at least a part of the electric conductors further include a first compensation portion connected to the lead of the electric conductor, and the first compensation portion and one of the lead layers are provided on a same layer, and made of a same material.

In an exemplary embodiment of the present disclosure, at least a part of the electric conductors further include a second compensation portion connected to the lead of the electric conductor, and the second compensation portion is provided in the drive backplane, and located in the pixel region, and
  in the row direction, an orthographic projection of the second compensation portion on the drive backplane and at least one of the first pixel circuits have an overlapping region.

In an exemplary embodiment of the present disclosure, the pixel circuit includes at least a drive transistor, a first reset transistor and a storage capacitor, wherein a first electrode plate of the storage capacitor is multiplexed as a control terminal of the drive transistor, and a first terminal of the first reset transistor is connected to the first electrode plate via a transmission line, and
  the drive backplane further includes:
  a shielding layer, provided on one side of the drive transistor, close to the light-emitting layer, for receiving a shielding signal,
  wherein an orthographic projection of the shielding layer on the light-emitting layer and an orthographic projection of the transmission line on the light-emitting layer are at least partially overlapped.

In an exemplary embodiment of the present disclosure, the shielding layer includes:
- a shielding portion, wherein the orthographic projection of the transmission line on the light-emitting layer is located within an orthographic projection of the shielding portion on the light-emitting layer; and
- a connection portion, wherein the connection portion and the shielding portion are provided on a same layer, and made of a same material, the connection portion is connected to the shielding portion, the connection portion and a second electrode plate of the storage capacitor are connected to a same power supply terminal, and the shielding signal is a power supply signal output from the power supply terminal.

In an exemplary embodiment of the present disclosure, the shielding layer and the second compensation portion are provided on a same layer, and made of a same material, the second compensation portion is provided with a hollow portion, and the shielding layer is disposed in the hollow portion, and spaced apart from an inner wall of the hollow portion.

In an exemplary embodiment of the present disclosure, a length of the lead of at least a part of the electric conductors is greater than a distance between the first pixel circuit and the first light-emitting device in the row direction, to which the lead is connected.

In an exemplary embodiment of the present disclosure, the electric conductors include a first electric conductor, the lead of the first electric conductor is a first lead, the first lead extends along the row direction, and has a length greater than a distance between the first pixel circuit and the first light-emitting device in the row direction, to which the first lead is connected, and
- the first electric conductor includes the first compensation portion and the second compensation portion, a number of the first compensation portion of the first electric conductor is plural, the first compensation portions are connected to at least one side of the first lead along the row direction, a number of the second compensation portion of the first electric conductor is plural, and the second compensation portions are distributed along the row direction, and are connected to one another.

In an exemplary embodiment of the present disclosure, the first electric conductor further includes a third compensation portion connected to the first lead, wherein the third compensation portion is provided in the drive backplane, and located locally in the transparent region.

In an exemplary embodiment of the present disclosure, the third compensation portion and the second compensation portion are provided on a same layer, and made of a same material.

In an exemplary embodiment of the present disclosure, the electric conductor includes a second electric conductor, the lead of the second electric conductor is a second lead, the second lead extends along the row direction, and has a length greater than a distance between the first pixel circuit and the first light-emitting device in the row direction, to which the second lead is connected, and
- the second electric conductor includes the first compensation portion connected to the second lead.

In an exemplary embodiment of the present disclosure, the electric conductor includes a third electric conductor, and the lead of the third electric conductor is a third lead, and
- the third lead includes a first segment, a second segment and a third segment, the first segment is connected to one of the first light-emitting devices, and extends to the pixel region along a row direction, the first segment has a length greater than a distance between the first pixel circuit and the first light-emitting device in the row direction, to which the third lead is connected, the second segment extends along a column direction, and is connected to one end of the first segment, located in the pixel region, and the third segment extends towards one side of the second segment, close to the transparent region in the row direction, and connected to one of the first pixel circuits.

In an exemplary embodiment of the present disclosure, the electric conductor includes a fourth electric conductor, and the lead of the fourth electric conductor is a fourth lead,
- the fourth lead includes a first segment, a second segment and a third segment, the first segment is connected to one of the first light-emitting devices, and extends to the pixel region along a row direction, the first segment has a length greater than a distance between the first pixel circuit and the first light-emitting device in the row direction, to which the fourth lead is connected, the second segment extends along the column direction, and is connected to one end of the first segment, located in the pixel region, and the third segment extends towards one side of the second segment, close to the transparent region in the row direction, and connected to one of the first pixel circuits, and
- the fourth electric conductor comprises the first compensation portion, the first compensation portion of the fourth electric conductor is located between the first segment and the third segment, and on one side of the second segment, close to the transparent region, and the first compensation portion of the fourth electric conductor is connected to at least one of the first segment, the second segment and the third segment.

In an exemplary embodiment of the present disclosure, a region of the light-emitting layer corresponding to the transparent region is divided into four light-emitting regions along a first central axis and a second central axis, wherein the first central axis is a central axis of the transparent region extending along a column direction, and the second central axis is a central axis of the transparent region along the row direction,
- the light-emitting region includes a first sub-region, a second sub-region, a third sub-region and a fourth sub-region being sequentially close to the first central axis along the row direction,
- the lead connected to the first light-emitting device in the first sub-region is located on the first lead layer,
- the lead connected to the first light-emitting device in the second sub-region is located on the second lead layer,
- the lead connected to the first light-emitting device in the third sub-region is located on the third lead layer, and
- the lead connected to the first light-emitting device in the fourth sub-region is located on at least one of the first lead layer, the second lead layer and the third lead layer.

In an exemplary embodiment of the present disclosure, the pixel circuit includes an active layer, a first gate electrode layer, a second gate electrode layer, a first source and drain layer and a second source and drain layer distributed in a direction close to the light-emitting layer, wherein the shielding layer and the second source and drain layer are provided on a same layer, and made of a same material.

In an exemplary embodiment of the present disclosure, a material of the leads includes at least one of indium tin oxide and indium gallium zinc oxide, and a material of the second source and drain layer comprises metal.

According to an aspect of the present disclosure, there is provided a display device including the display panel of any of the above described; and a photographing device, provided on a backlight side of the display panel, and directly facing the transparent region, for capturing images through the transparent region.

It is to be understood that both the foregoing general description and the following detailed description are exemplary and explanatory only, and are not restrictive of the invention, as claimed.

BRIEF DESCRIPTION OF THE DRAWINGS

The accompanying drawings, which are incorporated in and constitute a part of this specification, illustrate embodiments consistent with the invention, and together with the description, serve to explain the principles of the invention. Understandably, the drawings described below are only some embodiments of the present disclosure, and those of ordinary skill in the art can obtain other drawings based on these drawings without paying any creative labor as well.

DETAILED DESCRIPTION

Figure 1:
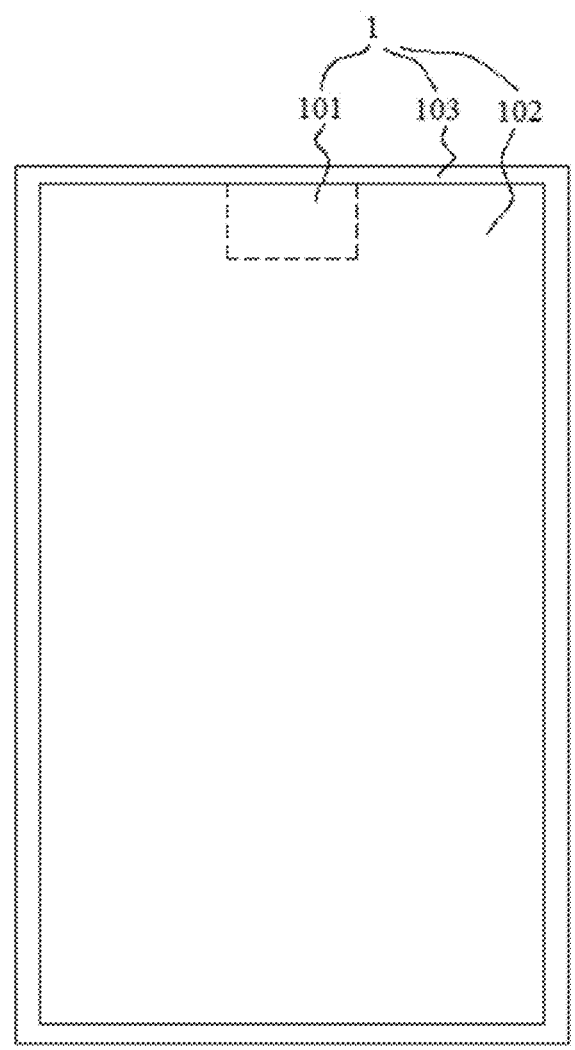
FIG. 1 is a schematic diagram of a drive backplane in an embodiment of a display panel according to the present disclosure.

Exemplary embodiments will now be described more fully by reference to the accompanying drawings. However, the exemplary embodiments can be implemented in various forms and should not be understood as being limited to the examples set forth herein; rather, the embodiments are provided such that this disclosure will be thorough and complete, and the conception of exemplary embodiments will be fully conveyed to those skilled in the art. The same reference signs in the drawings denote the same or similar structures and detailed description thereof will be omitted. Furthermore, the drawings are merely schematic illustrations of the present disclosure and are not necessarily drawn to scale.

Words such as "one", "an/a", "the", "said" and "at least one" are used herein to indicate the presence of one or more elements/component parts/and others. Terms "including" and "having" have an inclusive meaning which means that there may be additional elements/component parts/and others in addition to the listed elements/component parts/and others. Terms "first", "second" and "third" are used herein only as markers, and they do not limit the number of objects modified after them.

Figure 3:
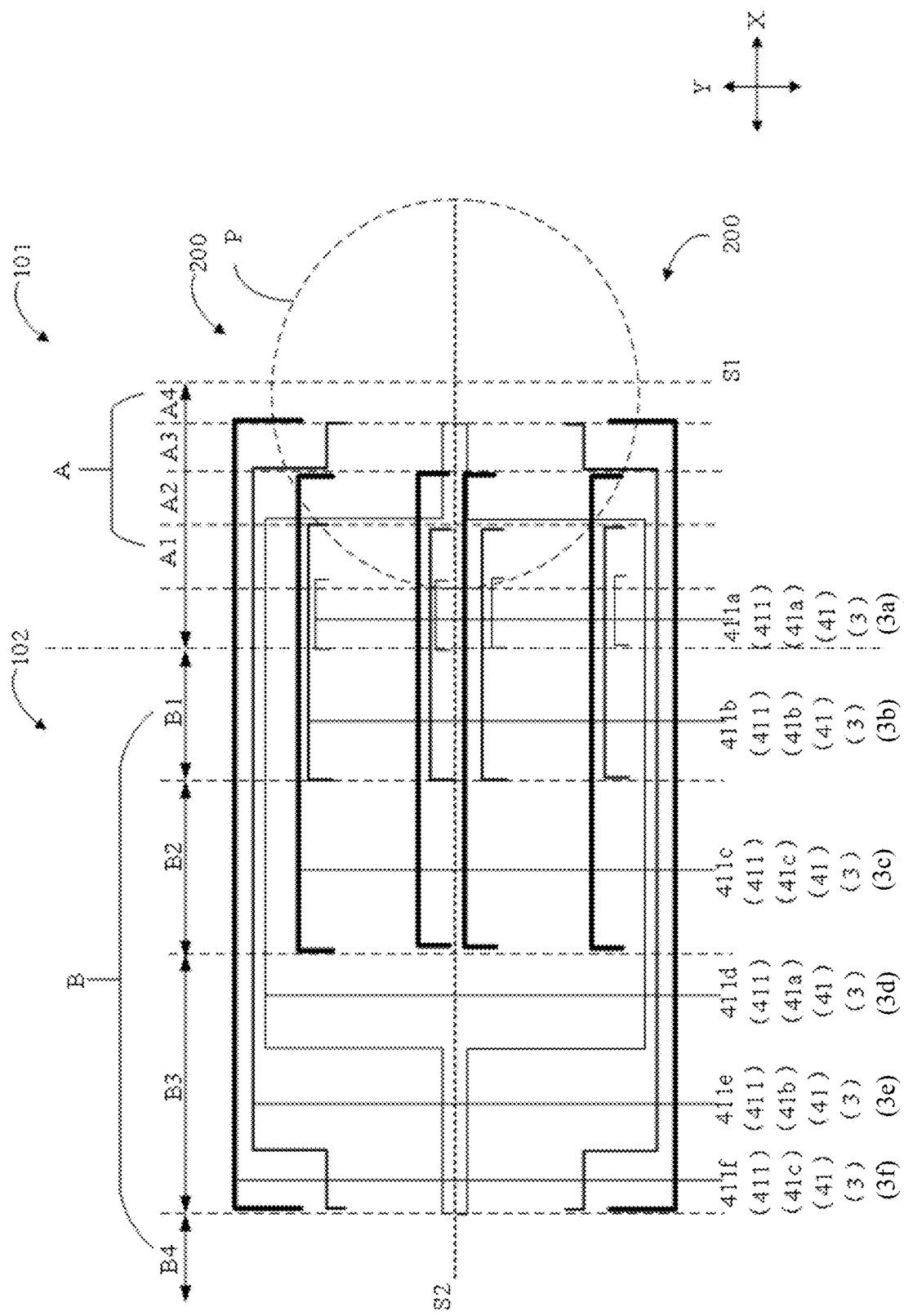
FIG. 3 is a schematic diagram of the distribution of leads in an embodiment of a display panel according to the present disclosure.

Row and column directions are only two directions perpendicular to each other, and their specific orientations are not limited, for example, the row direction may be the horizontal X direction in FIG. 3 and the column direction may be the vertical Y direction in FIG. 3. It will be appreciated by those skilled in the art that the actual orientations of the row and column directions may be changed if the display panel is rotated.

Description of reference signs: 1—drive backplane; 101—transparent region; 102—pixel region; 103—border region; 10—pixel circuit; 110—first pixel circuit; 120—second pixel circuit; 001—active layer; 002—first gate electrode layer; 003—second gate electrode layer; 004—first source and drain layer; 005—second source and drain layer; 300—transfer line; 400—jumper line; 500—lead terminal; 600—transmission line; 2—light-emitting layer; 200—light-emitting region; 20—light-emitting device; 201—first light-emitting device; 202—second light-emitting device; 211—first electrode; 2111—electrode section; 2112—wiring section; 212—light-emitting functional layer; 213—second electrode; 214—pixel definition layer; 3—electric conductor; 31—first compensation portion; 32—second compensation portion; 33—third compensation portion; 3a—first electric conductor; 3b—second electric conductor; 3c—third electric conductor; 3d—fourth electric conductor; 3e—fifth electric conductor; 3f—sixth electric conductor; 321—hollow portion; 322—connecting line; 310—first segment; 320—second segment; and 330—third segment; 4—transfer layer; 41—lead layer; 41a—first lead layer; 41b—second lead layer; 41c—third lead layer; 411—lead; 42—first planarization layer; 43—second planarization layer; 44—third planarization layer; 411a—first lead; 411b—second lead; 411c—third lead; 411d—fourth lead; 411e—fifth lead; 411f—sixth lead; 401—first transfer hole; 402—second transfer hole; 403—third transfer hole; 5—shielding layer; 51—shielding portion; 52—connection portion; and 100—display panel; 700—photographing device.

At present, although there are under-screen camera technologies, by which, images may be displayed in the region where the camera is located, perforation may be avoided, and normal photographing may be performed, in the display region corresponding to the camera, lighting-up times of the light-emitting devices in the same row are not consistent, thereby affecting the display effect.

Embodiments of the present disclosure provide a display panel, which may be an Organic Light-Emitting Diode (OLED) display panel. As shown in FIGS. 1-4, the display panel of the present disclosure may include a drive backplane 1 and a light-emitting layer 2.

The drive backplane 1 has a transparent region 101 and a pixel region 102 at least partially surrounding the transparent region 101. A plurality of pixel circuits 10 distributed in an array are provided in the pixel region 102. The pixel circuits 10 include a plurality of columns of first pixel circuits 110 and a plurality of columns of second pixel circuits 120, distributed in the row direction.

The light-emitting layer 2 is disposed on one side of the drive backplane 1, and includes a plurality of light-emitting devices 20 distributed in an array; the light-emitting devices 20 include a plurality of first light-emitting devices 201 located in the transparent region 101, and a plurality of second light-emitting devices 202 located in the pixel region 102.

Each of the first light-emitting devices 201 is connected to a first pixel circuit 110 via a transparent electric conductor 3; and each of the second pixel circuits 120 is connected to a second light-emitting device 202.

A deviation between a delay time of a signal transmitted by any of the electric conductors 3 and a standard delay time is not greater than a deviation threshold.

In the display panel of the present disclosure, the first pixel circuits 110 configured to drive the first light-emitting devices 201 in the transparent region 101 are provided in the pixel region 102 outside the transparent region 101, such that light transmittance of the transparent region 101 may be improved without reducing the number of the light-emitting devices 20, which facilitates the photographing device to photograph images. Meanwhile, the deviation of the delay time of the signal transmitted by any of the electric conductors 3 from the standard delay time is not greater than the deviation threshold, which facilitates the reduction of difference between delay times when different electric conductors 3 transmit signals, and for the first light-emitting devices 201 in the same row, their lighting-up times are more consistent, thus improving display effect.

The respective parts of the display panel will be described below:

As shown in FIGS. 1-4, the drive backplane 1 is provided with the pixel circuits 10 configured to drive the light-emitting devices 20 to emit light, and the drive backplane 1 includes at least the transparent region 101 and the pixel region 102, wherein the pixel circuits 10 are located in the pixel region 102 while no pixel circuit 10 is provided in the transparent region 101, so as to improve light transmittance, and the photographing device may photograph images through the transparent region 101, thereby realizing under-screen camera photographing.

A photographing range P of the photographing device may be smaller than the transparent region 101, for example, the transparent region 101 has a square shape, and the photographing range P is an internally tangent circle of the transparent region 101.

Figure 2:
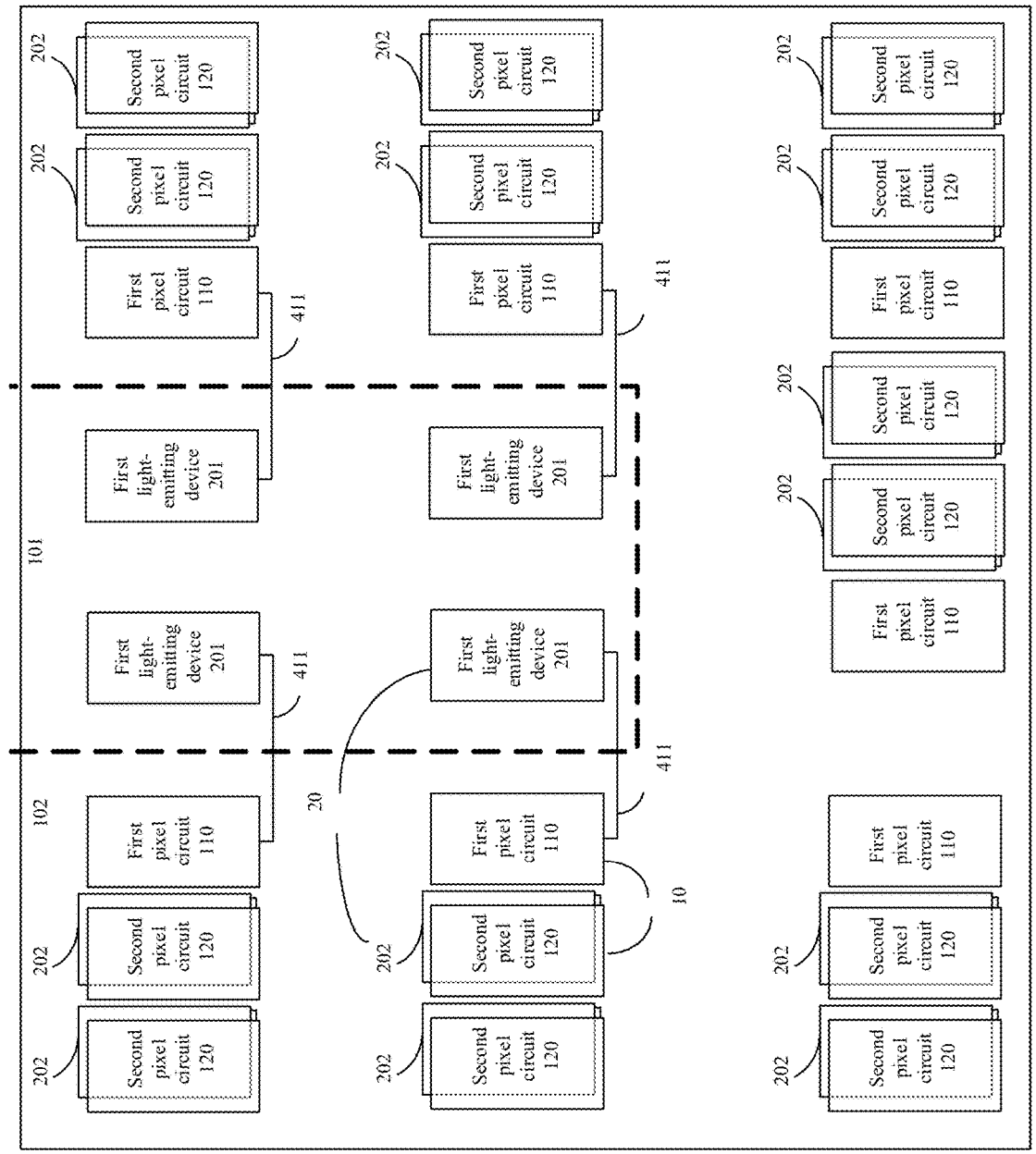
FIG. 2 is a schematic diagram of the connection of a pixel circuit and a light-emitting device in an embodiment of a display panel according to the present disclosure.

As shown in FIG. 2, the pixel circuits 10 in the pixel region 102 include at least the first pixel circuits 110 and the second pixel circuits 120, wherein the first pixel circuits 110 are configured to drive the light-emitting devices corresponding to the transparent region 101, i.e. the first-light-emitting devices 201; and the second pixel circuits 120 are configured to drive the light-emitting devices corresponding to the pixel region 102, the second light-emitting devices 202.

In some embodiments of the present disclosure, as shown in FIGS. 1-3, the pixel region 102 is at least partially surrounding the transparent region 101, and one side edge of the transparent region 101 may at least partially overlap one side edge of the pixel region 102. The pixel region 102 may completely surround the transparent region 101. In addition, the drive backplane 1 may further include a border region 103, which may surround the pixel region 102. The border region 103 may be provided with a peripheral circuit configured to input drive signals to the pixel circuits 10. The peripheral circuit may include a gate drive circuit, a light-emitting control circuit etc., which is not particularly limited herein.

Further, all of the first pixel circuits 110 may be distributed in the pixel region 102, and all of the second pixel circuits 120 may be distributed in the pixel region 102 as well. Some of the first pixel circuits 110 may be provided in the pixel region 102, all of the second pixel circuits 120 are distributed in the pixel region 102, and the rest of the first pixel circuits 110 are provided in the border region 103 as well. In addition, all of the first pixel circuits 110 may be provided within the border region 103 as well, and illustration will be made by taking an example in which only at least part of the first pixel circuits 110 are provided in the pixel region 102 in this text.

Further, the first pixel circuits 110 and the second pixel circuits 120 in the pixel region 102 are distributed in an array. The respective columns of first pixel circuits 110 are located among the respective columns of second pixel circuits 120, and at most one column of first pixel circuits 110 is provided between two adjacent columns of second pixel circuits 120; and a plurality of columns of second pixel circuits 120 may be provided between two adjacent columns of first pixel circuits 110.

In addition, one or more columns of second pixel circuits 120 nearest to the transparent region 101 in the row direction may not be connected to the first light-emitting devices 201 or the second light-emitting devices 202, and these second pixel circuits 120 are used as dummy pixel circuits, so as to increase the distance between the first pixel circuit 110 nearest to the transparent region 101, connected to the first light-emitting device 201, and the transparent region 101, thus increasing the minimum length of the corresponding electric conductor 3, so as to avoid the difference in lighting-up times of different columns of first light-emitting devices 201 due to too great differences in the lengths of the electric conductors 3, thereby improving image quality.

In order to enable the pixel region 102 to have sufficient space for the first pixel circuits 110 and the second pixel circuits 120 without reducing the number of the pixel circuits 10 and without increasing the size of the drive backplane 1, the pixel circuits 10 may be compressed in the row direction to reduce the width of the pixel circuits 10 in the row direction, then there may be more regions in the pixel region 102 with the same size of the drive backplane 1, to dispose the second pixel circuits 120. The width of the pixel circuits 10 is a length of an orthographic projection of the pixel circuits 10 in the row direction on the drive backplane 1.

The structure of the pixel circuit 10 will be exemplarily described below.

Figure 5:
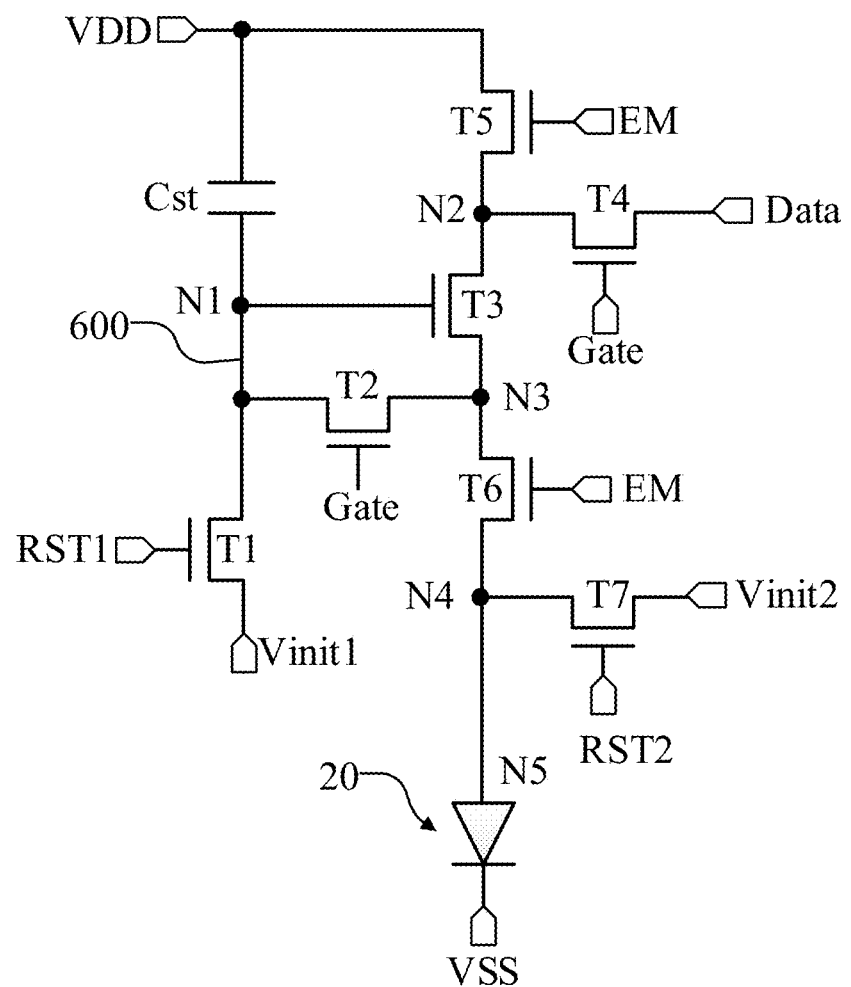
FIG. 5 is an equivalent circuit diagram of a pixel circuit in an embodiment of a display panel according to the present disclosure.

In some embodiments of the present disclosure, as shown in FIG. 5, the pixel circuit 10 (the first pixel circuit 110 or the second pixel circuit 120) may be a 7T1C structure, that is, it includes seven transistors and one capacitor. The 7T1C pixel circuit includes a drive transistor T3, a data writing transistor T4, a threshold compensation transistor T2, a first light-emitting control transistor T5, a second light-emitting control transistor T6, a first reset transistor T1, a second reset transistor T7 and a storage capacitor Cst. The pixel circuit may be connected to a gate signal terminal Gate, a data signal terminal Data, reset signal terminals RST1 and RST2, a light-emitting control signal terminal EM, a power supply terminal VDD, initial power supply terminals Vinit1 and Vinit2, and the light-emitting device 20 that may further be connected to the power supply terminal VSS. The pixel circuit 10 may be configured to drive the connected light-emitting device 20 to emit light in response to signals provided by the connected respective signal terminals.

In FIG. 5, the power supply terminal VDD may be connected to a first electrode plate of the storage capacitor Cst and a first terminal of the first light-emitting control transistor T5; the reset signal terminal RST1 may be connected to a control terminal of the first reset transistor T1, and the initial power supply terminal Vinit1 may be connected to a first terminal of the first reset transistor T1; the reset signal terminal RST2 may be connected to a control terminal of the second reset transistor T7, and the initial power supply terminal Vinit2 may be connected to a first terminal of the second reset transistor T7; and the data signal terminal Data may be connected to a first terminal of the data writing transistor T4, and the gate signal terminal Gate may be connected to control terminals of the data writing transistor T4 and the threshold compensation transistor T2.

Figure 6:
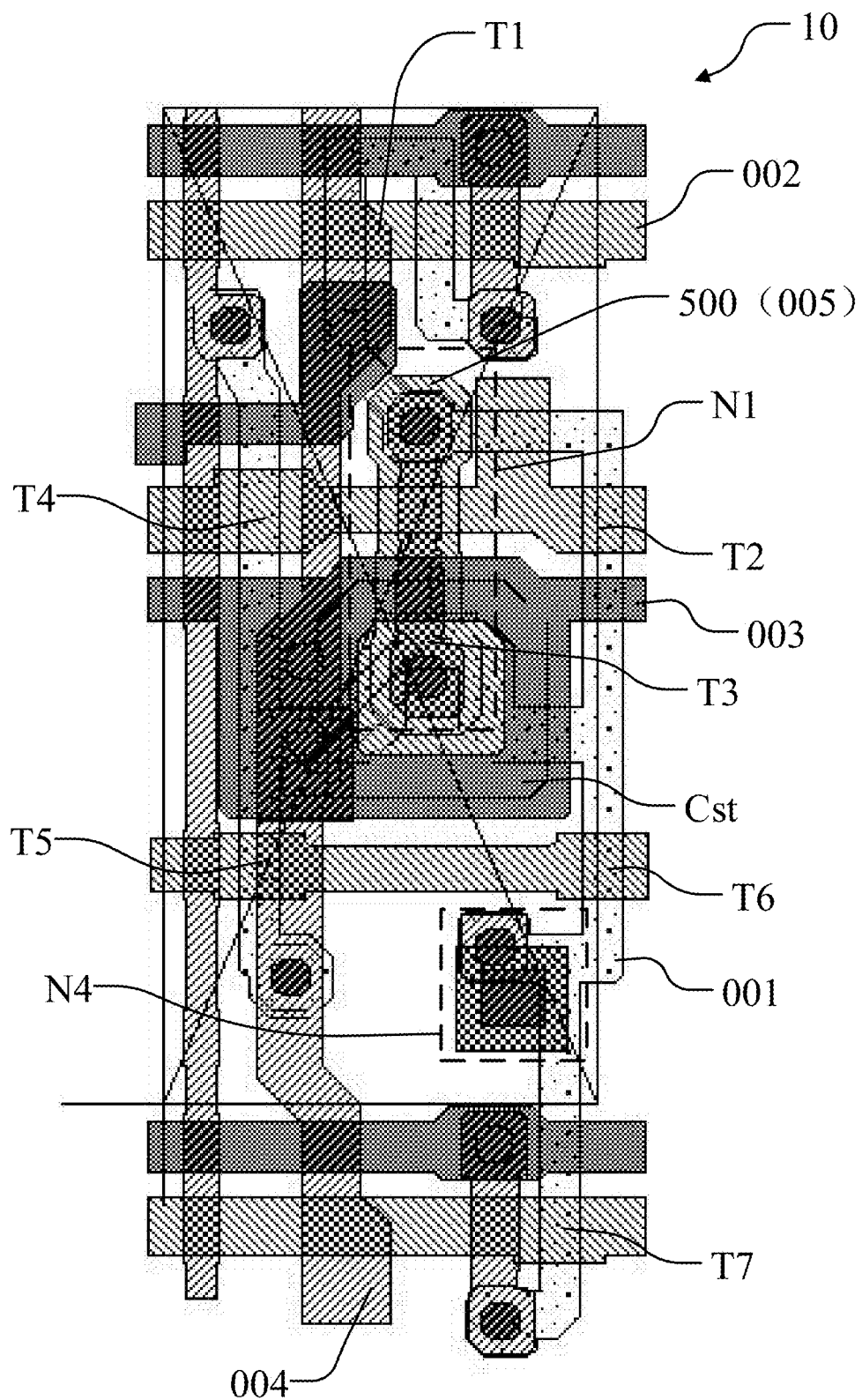
FIGS. 6-11 are structural schematic diagrams of a pixel circuit in an embodiment of a display panel according to the present disclosure.
Figure 7:
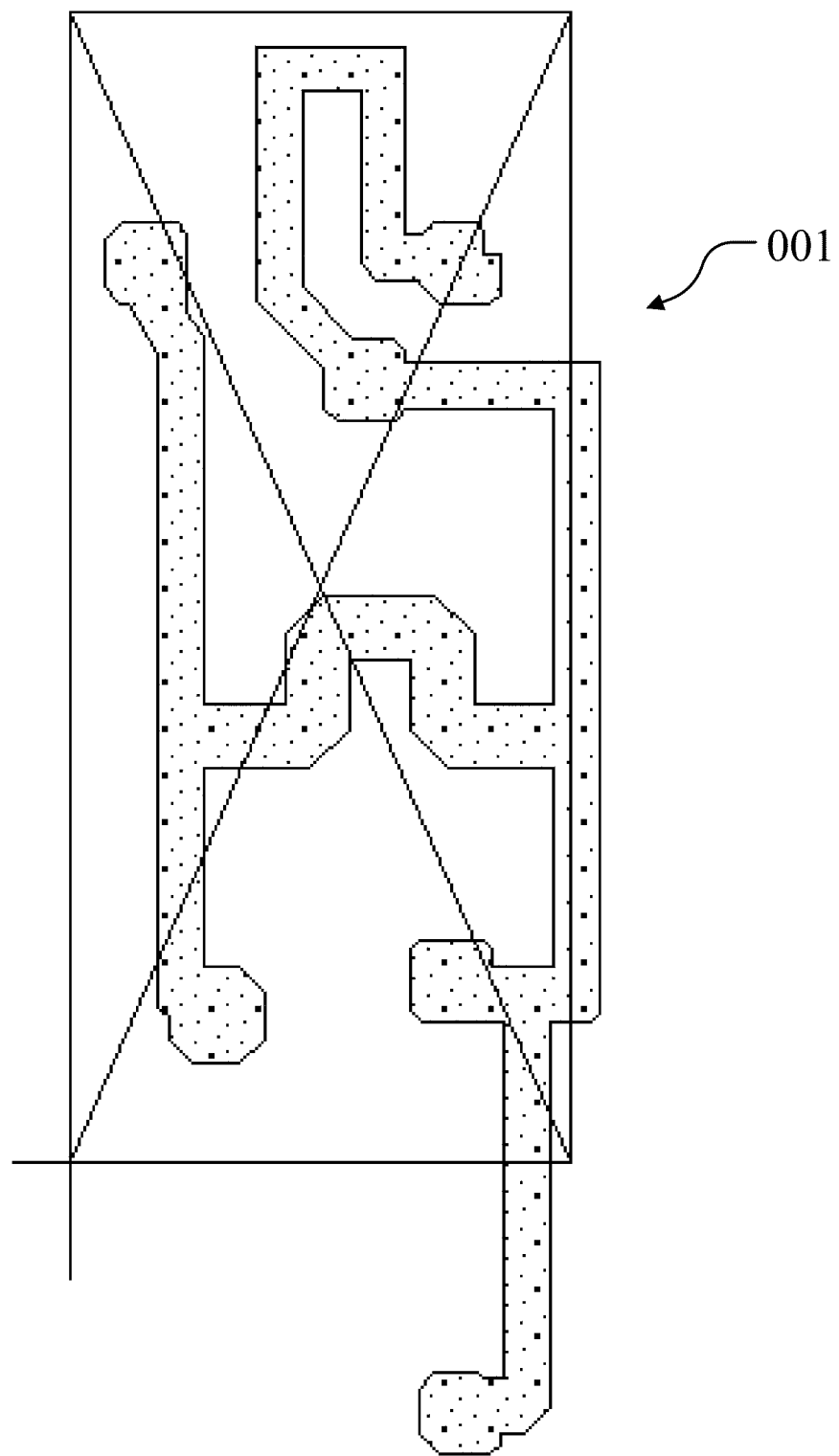
Figure 8:
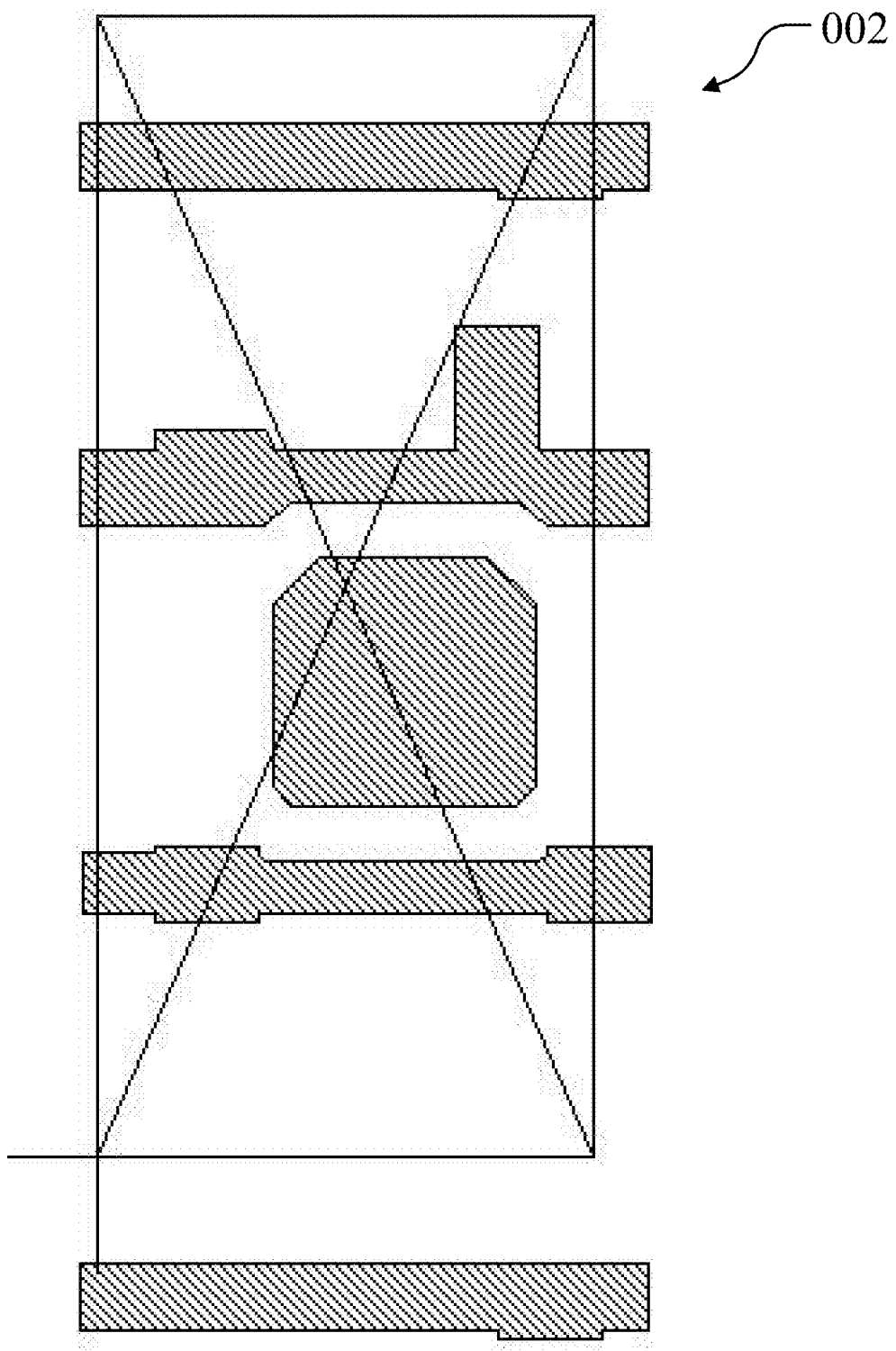
Figure 9:
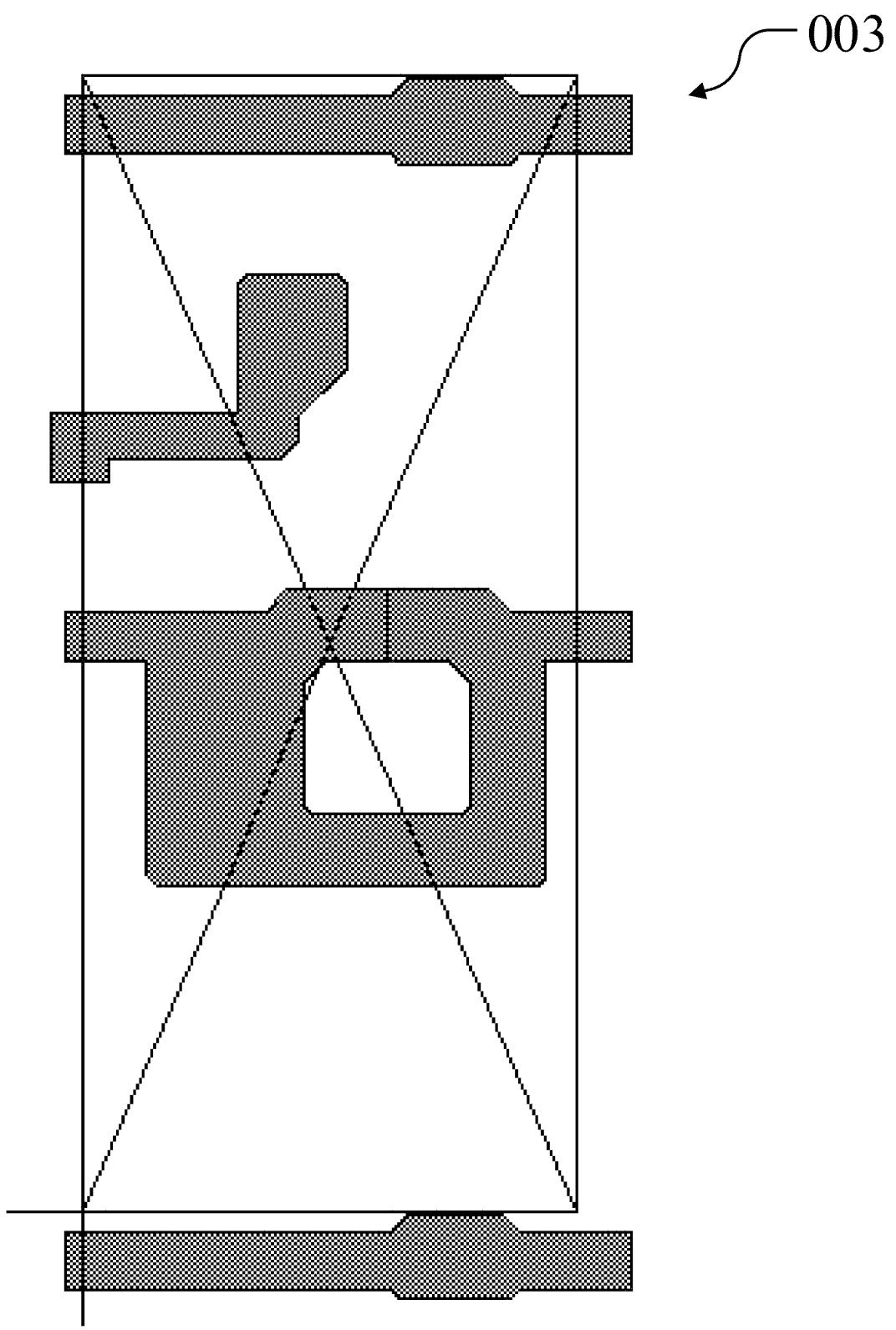
Figure 10:
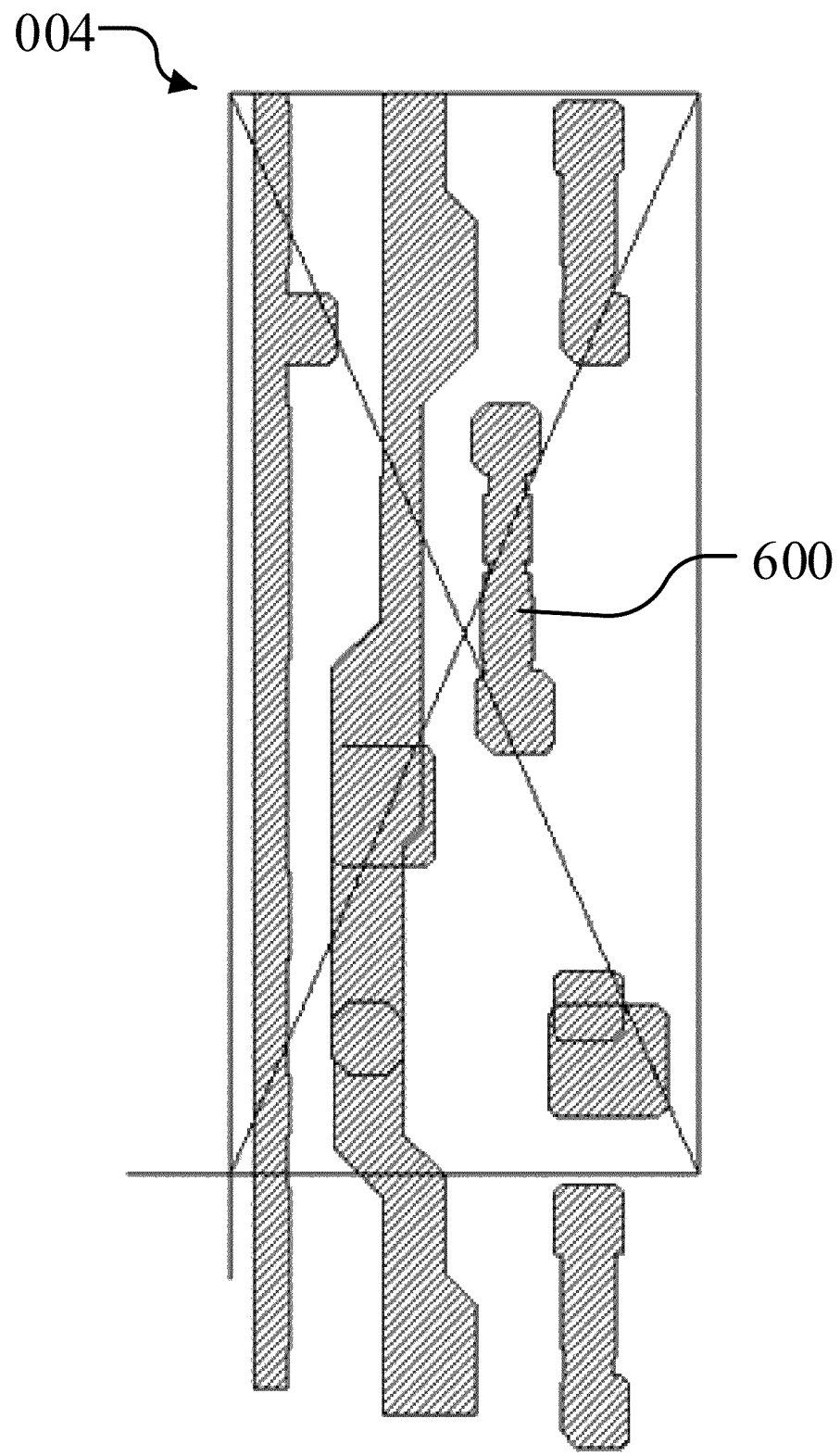

A second electrode plate of the storage capacitor Cst, a second terminal of the first reset transistor T1 and a control terminal of the drive transistor T3 may be connected to a node N1; a second terminal of the data writing transistor T4, a second terminal of the first light-emitting control transistor T5 and a first terminal of the drive transistor T3 may be connected to a node N2; a second terminal of the drive transistor T3, a second terminal of the threshold compensation transistor T2 and a first terminal of the second light-emitting control transistor T6 may be connected to a node N3; and a second terminal of the second light-emitting control transistor T6 and a second terminal of the second reset transistor T7 are connected to a node N4, and are connected to the light-emitting device 20 via a node N5. As shown in FIGS. 6 and 10, the first electrode plate of the storage capacitor Cst is multiplexed as the control terminal of the drive transistor T3, and the first terminal of the first reset transistor T1 is connected to the first electrode plate of the storage capacitor Cst via a transmission line 600.

Furthermore, the transistors can be classified into N-type and P-type transistors according to their characteristics. The embodiments of the present disclosure will be illustrated by taking P-type transistors as an example. Based on the illustration and teaching of the implementations of the present disclosure, those of ordinary skill in the art would easily contemplate that at least some of the transistors in the structure of the pixel circuit in the embodiments of the present disclosure may adopt N-type transistors, i.e., adopt N-type transistors, or a combination of N-type transistors and P-type transistors, without paying any creative work, therefore, these implementations fall within the scope of protection of the embodiments of the present disclosure as well.

In other embodiments of the present disclosure, the pixel circuit 10 can adopt other structures as well, for example, it may be other types of pixel circuits such as 6T1C, 6T2C or 7T2C, etc., as long as it can drive the light-emitting device 20 to emit light, and its structure is not particularly limited here. nTmC expresses that one pixel circuit 10 includes n transistors (expressed by letter "T") and m capacitors (expressed by letter "C").

Based on the pixel circuit 10 described above, taking the structure of one transistor as an example, as shown in FIGS. 6-11, the pixel circuit 10 may include an active layer 001, a first gate insulating layer, a first gate electrode layer 002, a second gate insulating layer, a second gate electrode layer 003, an interlayer dielectric layer, a first source and drain layer 004, a first planarization layer, a second source and drain layer 005 and a second planarization layer, sequentially laminated on a substrate, to form a transistor, the specific structure of which is not particularly limited. The transmission line 600 and the first source and drain layer 004 may be provided on the same layer, and made of the same material.

Figure 4:
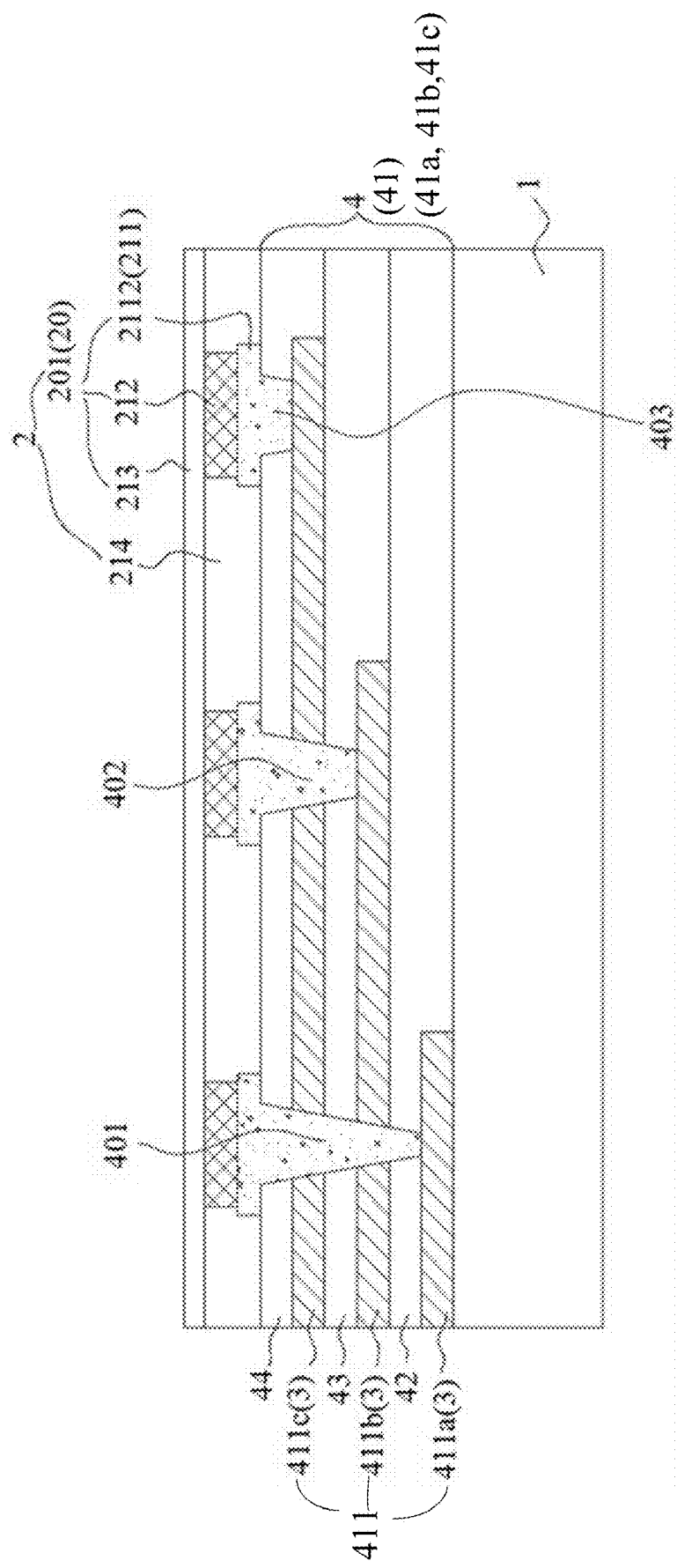
FIG. 4 is a schematic diagram of a cross-section of a display panel in an embodiment of a display panel according to the present disclosure.

As shown in FIGS. 2 and 4, the light-emitting layer 2 may include a plurality of light-emitting devices 20, and each of the light-emitting devices 20 of the transparent region 101 may be connected to a first pixel circuit 110 via a corresponding transparent electric conductor 3. The light-emitting device 20 may be an OLED light-emitting device, which may include a first electrode 211, a light emitting functional layer 212 and a second electrode 213.

Figure 12:
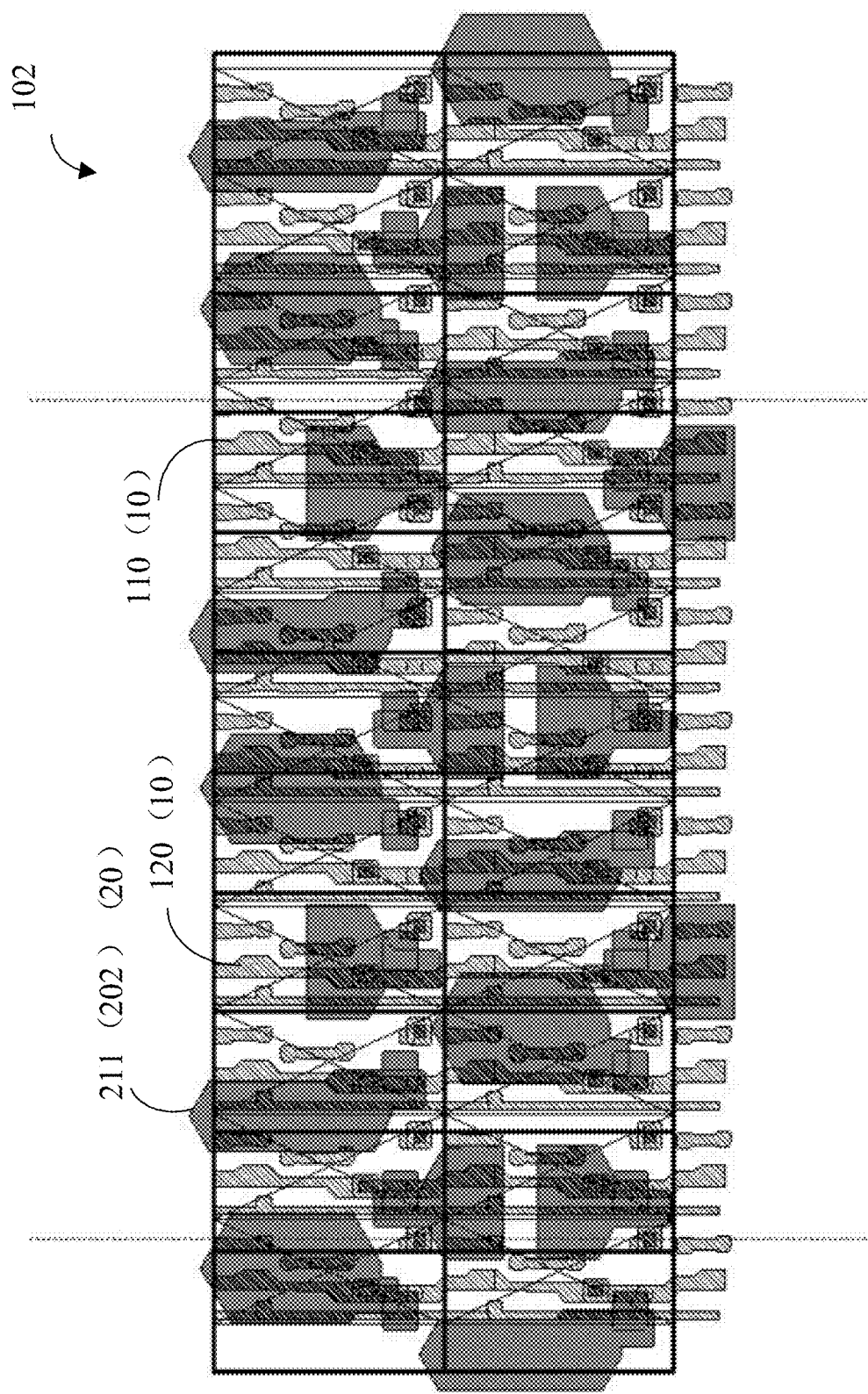
FIGS. 12-15 are schematic diagrams of the distribution of a pixel circuit and a first electrode in an embodiment of a display panel according to the present disclosure.
Figure 13:
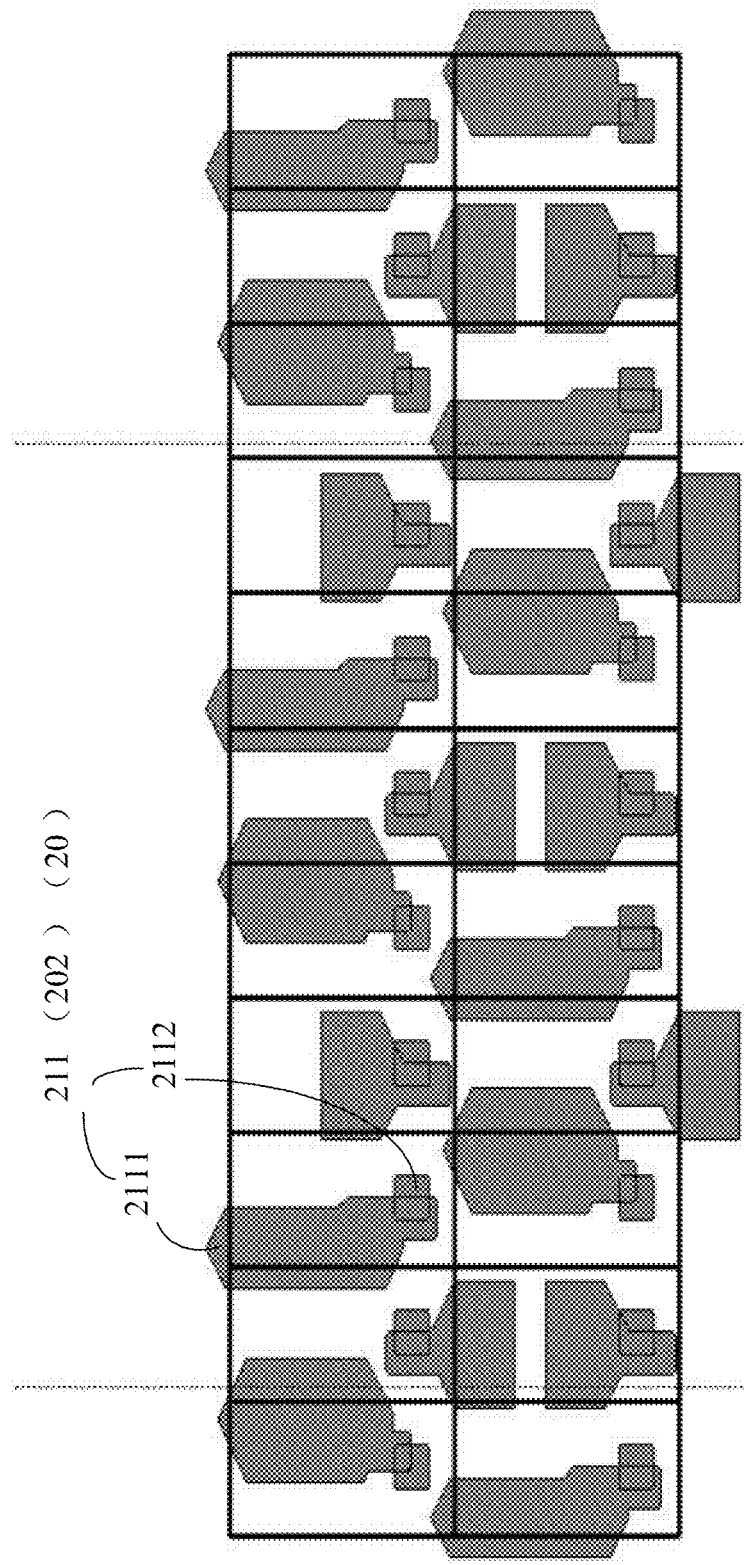
Figure 14:
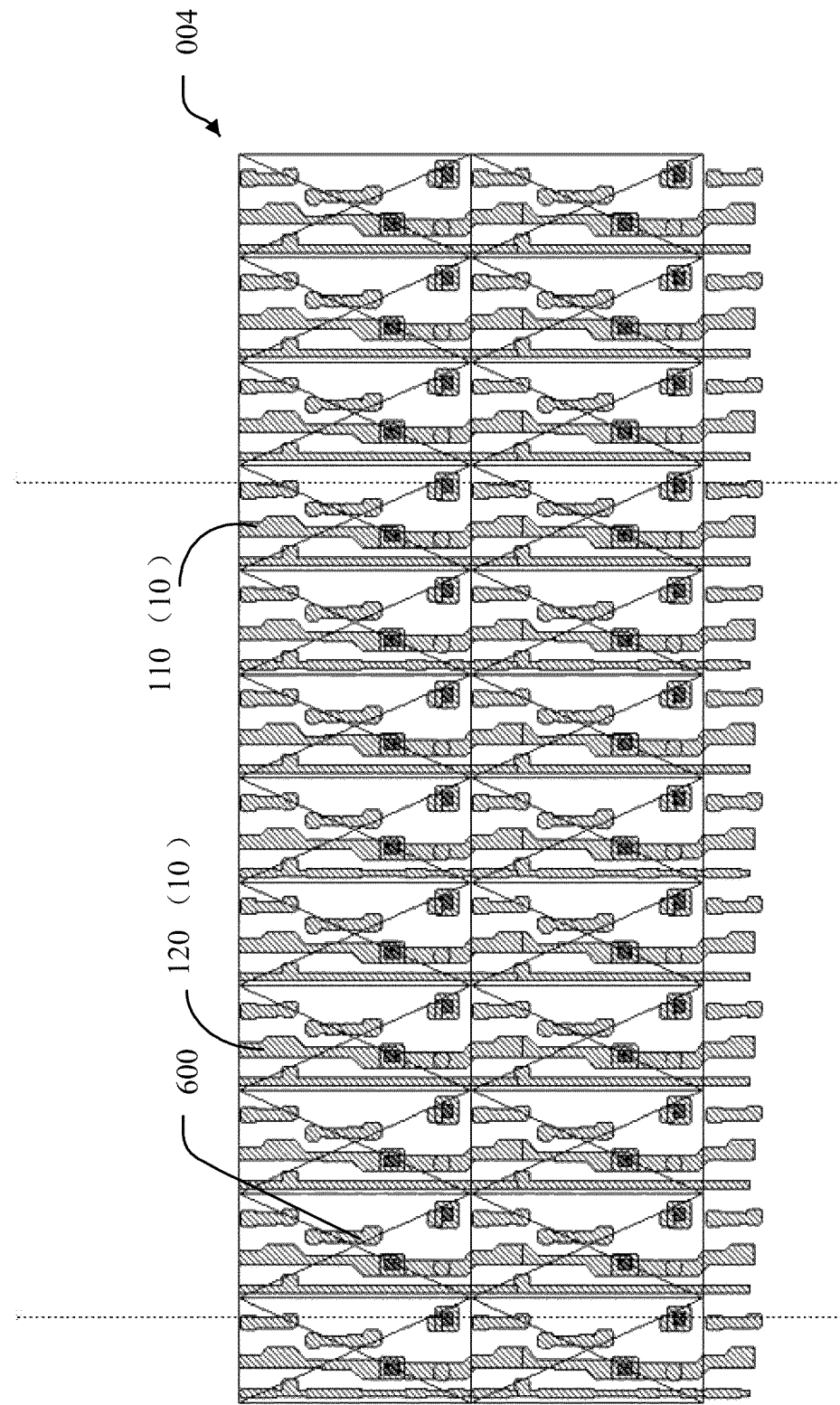
Figure 15:
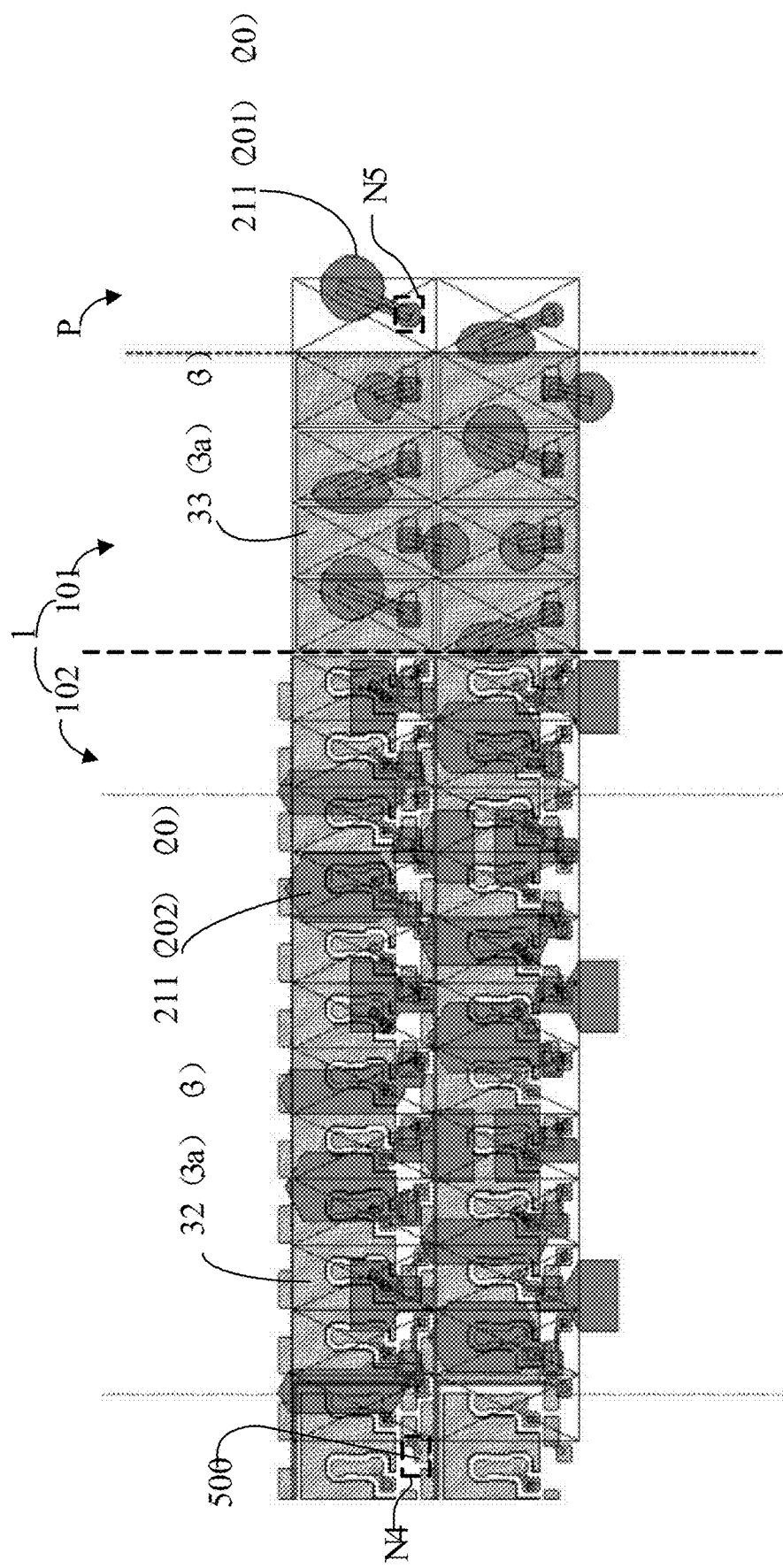
Figure 16:
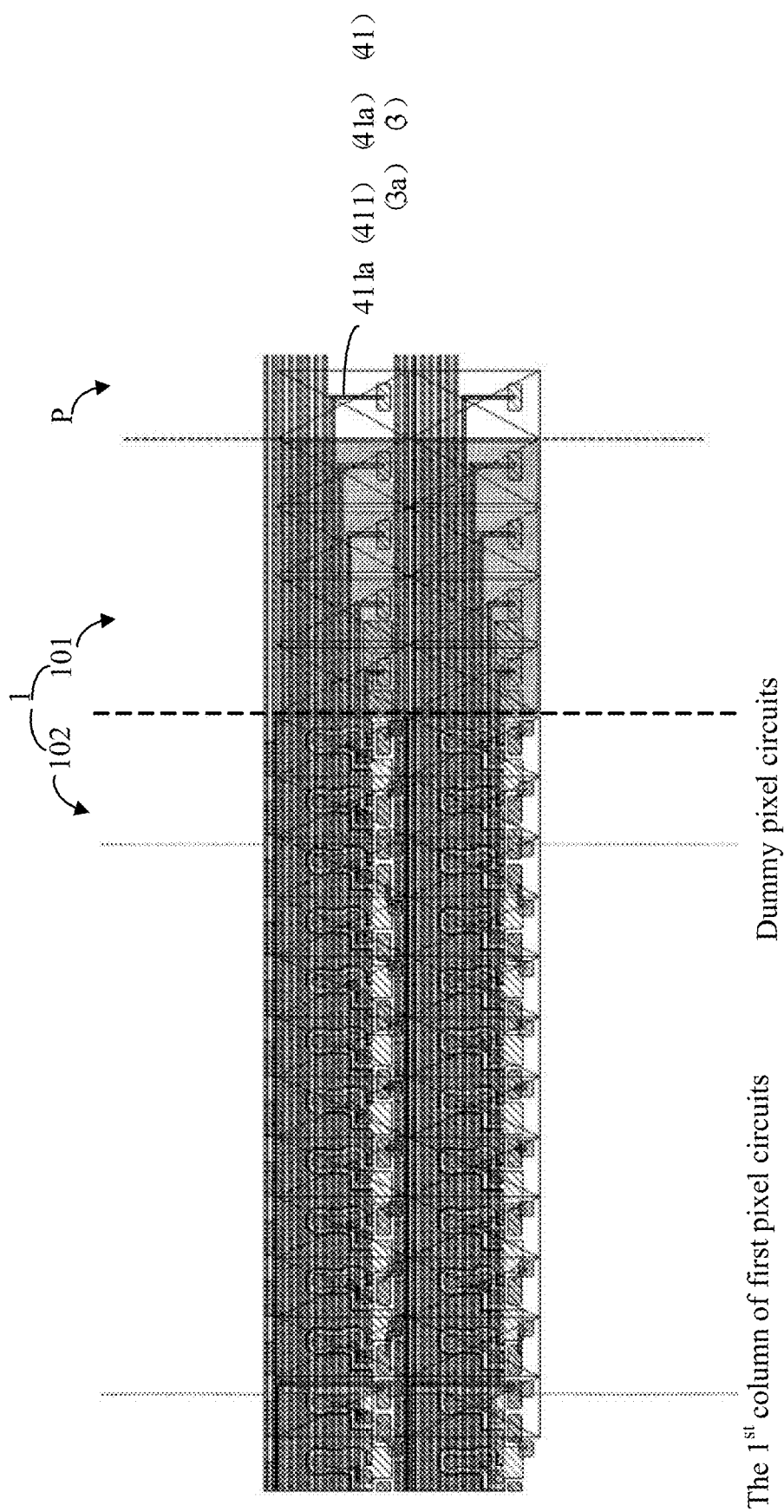
FIGS. 16-23 are schematic diagrams of an electric conductor of the 1$^{st}$ column of pixel circuit in an embodiment of a display panel according to the present disclosure.
Figure 17:
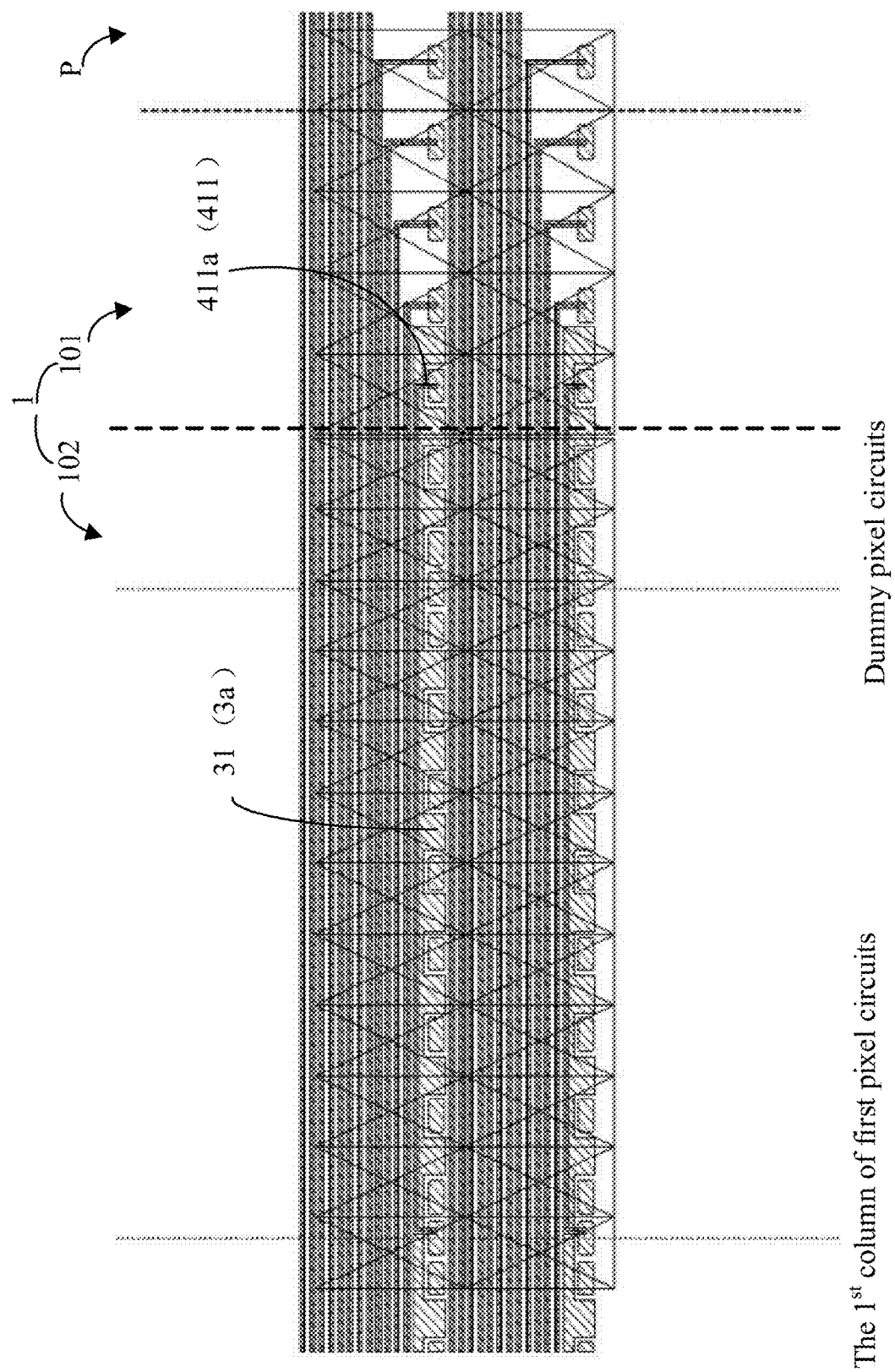

As shown in FIGS. 12-13, the first electrode 211 may be provided on one side of the drive backplane 1. As shown in FIG. 13, the first electrode 211 serves as an anode of the OLED light-emitting device, and has an electrode section 2111 and a wiring section 2112 located outside the edge of the electrode section 2111, wherein the wiring section 2112 and the electrode section 2111 are connected to each other or provided in an integral structure. The electrode section 2111 of each of the first electrodes 211 is connected to a lead 411 (such as leads 411a, 411b or 411c) through the wiring section 2112 and a transfer hole located in a transfer layer 4, thereby connecting the first pixel circuit 110 to the first electrode 211 of the corresponding light-emitting device 20. The wiring section 2112 of any one of the light-emitting devices 20 may serve as the node N5 for connecting the corresponding pixel circuit 10.

The light-emitting functional layer 212 may be provided on a surface of the first electrode 211, distal to the drive backplane 1, and may include a hole injection layer, a hole transport layer, an organic light-emitting layer, an electron transport layer and an electron injection layer sequentially laminated on the first electrode 211.

The second electrode 213, as a cathode of the OLED light-emitting device, may be provided on a surface of the light-emitting functional layer 212, distal to the drive backplane 1. The light-emitting functional layer 212 may be driven to emit light by applying an electrical signal to the first electrode 211 and the second electrode 213.

The above is the structure of one light-emitting device. In the whole display panel, the first electrodes 211 of the respective light-emitting devices may adopt the same material and be formed simultaneously by undergoing one patterning process. Moreover, the respective light-emitting functional layers 212 of the same light-emitting color may adopt the same material and be formed simultaneously by undergoing one patterning process as well, while the light-emitting functional layers 212 of different colors may be formed separately. Furthermore, the respective light-emitting devices 20 may share the same second electrode 213, that is to say, the second electrode 213 may cover the respective light-emitting functional layers 212 at the same time. Moreover, in order to define a light-emitting range of the respective light-emitting devices 20, the light-emitting layer 2 may further include a pixel definition layer 214, which may be provided on a surface of the transfer layer 4, distal to the drive backplane 1, and has openings that expose the first electrodes 211. The light-emitting functional layer 212 may cover the first electrodes 211 within the respective openings and expose the electrode sections 2111, with the wiring sections 2112 located outside the openings.

In order to make the brightness of the region of the light-emitting layer 2 corresponding to the transparent region 101 same as that of the region corresponding to the pixel region 102, the density of the first light-emitting devices 201 in the region corresponding to the transparent region 101 may be the same as that of the second light-emitting devices 202 in the region corresponding to the pixel region 102, such that the display effect of the transparent region 101 and the pixel region 102 will be the same.

As shown in FIG. 3, in order to facilitate wiring, the light-emitting layer 2 and the pixel region 102 may be partitioned, for example, the region of the light-emitting layer 2 corresponding to the transparent region 101 may be divided into four light-emitting regions 200 along a first central axis S1 and a second central axis S2, wherein the first central axis S1 is a central axis of the transparent region 101 extending in the column direction, the second central axis S2 is a central axis of the transparent region 101 in the row direction. Furthermore, the light-emitting region 200 may be divided into a plurality of sub-regions A being sequentially close to the first central axis S1 along the row direction, such as a first sub-region A1, a second sub-region A2, a third sub-region A3 and a fourth sub-region A4. The structure and wiring manner of at least some of the sub-regions A of the two light-emitting regions 200 in the row direction are provided symmetrically about the first central axis S1. Further, at least some of the sub-regions A may be provided symmetrically about the second central axis S2 as well.

Accordingly, in the pixel region 102, sub-pixel regions B in one-to-one correspondence with the sub-regions A may be provided, and the respective sub-pixel regions B corresponding to any of the light-emitting regions 200 are located on one side of the light-emitting region 200, distal to the first central axis S1. Each of the sub-pixel regions B has a plurality of columns of first pixel circuits 110, and the first pixel circuits 110 in each of the sub-pixel regions B are configured to be connected to the first light-emitting devices 201 in one of the sub-regions A. For example, the pixel region 102 may include a first sub-pixel region B1 corresponding to the first sub-region A1, a second sub-pixel region B2 corresponding to the second sub-region A2, a third sub-pixel region B3 corresponding to the third sub-region A3, and a fourth sub-pixel region B4 corresponding to the fourth sub-region A4. The first sub-pixel region B1, the second sub-pixel region B2, the third sub-pixel region B3 and the fourth sub-pixel region B4 are distributed sequentially in a direction distal to the transparent region 101.

The first light-emitting devices 201 in the first sub-region A1 are connected to the first pixel circuits 110 in the first sub-pixel region B1 through the respective electric conductors 3. The first light-emitting devices 201 in the second sub-region A2 are connected to the first pixel circuits 110 in the second sub-pixel region B2 via the respective electric conductors 3. The first light-emitting devices 201 in the first sub-region A3 are connected to the first pixel circuits 110 in the third sub-pixel region B3 via the respective electric conductors 3. The first light-emitting devices 201 in the first sub-region A4 are connected to the first pixel circuits 110 in the fourth sub-pixel region B4 via the respective electric conductors 3.

Exemplarily, as shown in FIG. 3, a light-emitting region 200 is looked as a target light-emitting region which has 48 columns of first light-emitting devices 201, wherein the $1^{st}$ to the $13^{th}$ columns of first light-emitting devices 201 are distributed in the first sub-region A1 along a direction towards the first central axis S1.

The $14^{th}$ to the $26^{th}$ columns of the first light-emitting devices 201 are distributed in the first sub-region A2 along a direction towards the first central axis S1.

The $27^{th}$ to the $39^{th}$ columns of the first light-emitting devices 201 are distributed in the first sub-region A3 along a direction towards the first central axis S1.

The $40^{th}$ to the $48^{th}$ columns of first light-emitting devices 201 are distributed in the first sub-region A4 along a direction towards the first central axis S1.

In the sub-pixel regions B1-B4 corresponding to the above-described target light-emitting region, there are 48 columns of first pixel circuits 110, which are distributed sequentially along a direction being away from the transparent region 101, wherein the $1^{st}$ to the $13^{th}$ columns of first pixel circuits 110 are located in the first sub-pixel region B1, the Pt column of first pixel circuits 110 are connected to the $1^{st}$ column of first light-emitting devices 201, the $2^{nd}$ column of first pixel circuits 110 are connected to the $2^{nd}$ column of first light-emitting devices 201, and so on, the $30^{th}$ column of first pixel circuits 110 are connected to the $30^{th}$ column of first light-emitting devices 201, and so on. At least one column of dummy pixel circuits are provided in the first sub-pixel region B1, and the dummy pixel circuits are located between the $1^{st}$ column of first pixel circuits 110 and the target light-emitting region.

In addition, the second source and drain layer 005 of the pixel circuit 110 may be provided with a lead terminal 500, the lead terminal 500 may serve as an output terminal of the pixel circuit 110, i.e. the node N4 in FIG. 5, and the lead terminal 500 of any of the pixel circuits 10 may be connected to the corresponding light-emitting device 20. For example, the lead terminal 500 of the first pixel circuit 110 may be connected to the first light-emitting device 201 via the lead 411, and the lead terminal 500 of the second pixel circuit 120 may be connected to the corresponding second light-emitting device 202. The structure of the lead terminal 500 is not particularly limited here.

As shown in FIG. 3, there are a number of electric conductors 3 which are configured to connect the first pixel circuits 110 and the first light-emitting devices 201, and each of the first light-emitting devices 201 is connected to the first pixel circuit 110 via a corresponding one of the electric conductors 3. That is, the number of the electric conductors 3, the first light-emitting devices 201 and the first pixel circuits 110 is the same, and each of the electric conductors 3 corresponds to a unique first light-emitting device 201 and a unique first pixel circuit 110. Each of the second pixel circuits 120 is connected to a unique second light-emitting device 202 via the lead terminal 500 in the second source and drain layer 005 rather than via the electric conductor 3.

Furthermore, the deviation of the delay time of the signal transmitted by any of the electric conductors 3 from the standard delay time may not be greater than the deviation threshold, and the signal transmitted by the electric conductor 3 is not particularly limited here. The standard delay time may be the delay time of the signal transmitted by the electric conductor 3 with the largest delay time in all the electric conductors 3, the standard delay time may be greater. In other words, the delay time of any of the electric conductors 3 is not greater than the standard delay time. The deviation of the delay time of the signal transmitted by the electric conductor 3 from the standard delay time may be the difference between the standard delay time and the delay time of the signal transmitted by the electric conductor 3.

The deviation threshold is not particularly limited here, and in some embodiments of the present disclosure, the threshold deviation may be 10% of the standard delay time, that is, the minimum delay time of the electric conductors 3 is not less than 90% of the maximum delay time. In other embodiments of the present disclosure, the deviation threshold may be greater or smaller as well, and it may be, for example, not greater than 30% of the standard delay time.

It was found that the parasitic capacitance of the electric conductor 3 has a large effect on the delay time of the signal transmitted by the electric conductor 3, and the parasitic capacitance may include capacitance between the plurality of electric conductors 3, capacitance between the electric conductors 3 and conductive film layers in the drive backplane 1, etc., which may be considered as the parasitic capacitance as long as capacitance is formed with the electric conductor 3. The manner of determining the parasitic capacitance is not particularly limited here, for example, capacitance between an electric conductor 3 and any conductive film layer may be detected, and the capacitance that may have a detectable influence on the delay time may be selected as the parasitic capacitance of the electric conductor 3. Specifically, for any electric conductor 3, since parasitic capacitance presents between the electric conductor 3 and other conductive structures on the same layer or on different layers, when the drive transistor T3 charges the first electrode 211 of the light-emitting device 20, it will charge the parasitic capacitance at the same time, such that times taken for the light-emitting devices 20 connected to different electric conductors 3 to reach the respective voltages enough to light up the respective light-emitting devices 20 are inconsistent, then times for lighting up the respective light-emitting devices 20 in the transparent region 101 are inconsistent, and then the displaying of the transparent region 101 is uneven within a frame.

Further, the delay time may be restricted by limiting the parasitic capacitance of the electric conductors 3, to improve the consistency of the delay time. That is, by making the parasitic capacitance of the electric conductors 3 close to or equal to a standard parasitic capacitance, the delay time of the electric conductor 3 with its parasitic capacitance equal to the standard parasitic capacitance is the standard delay time described above. Further, the parasitic capacitance may be restricted by limiting the area of the electric conductor 3. Specifically, the greater the distance to the transparent region 101 is, the longer the path of signal transmission is, and the larger the parasitic capacitance is; and the smaller the distance to the transparent region 101 is, the shorter the path of signal transmission is, and the smaller the parasitic capacitance is, therefore, the smaller the delay time is. Thus, for the two electric conductors 3 connected to the two first pixel circuits 110 in the same row, the area of the electric conductor 3 of a first pixel circuit 110, which is closer to the transparent region 101, may be larger than that of the electric conductor 3 of a first pixel circuits 110, which is further to the transparent region 101.

It should be noted that the area of the electric conductor 3 is the sum of the areas of orthographic projections of its respective regions on the drive backplane 1. For example, if the electric conductor 3 is a multi-layer structure, its area is equal to the sum of the areas of orthographic projections of its respective layers.

The specific implementations of the electric conductors 3 will be illustrated in detail below.

As shown in FIG. 4, the display panel may include the transfer layer 4, which is provided on one side of the drive backplane 1, for example, on a surface of the second planarization layer of the drive backplane 1, distal to the substrate. The light-emitting layer 2 is provided on a surface of the transfer layer 4, distal to the drive backplane 1. The transfer layer 4 may cover the transparent region 101 and a pixel region 102, and includes a plurality of lead layers 41 being mutually insulated, each of the lead layers 41 includes a plurality of leads 411 (such as leads 411*a*, 411*b*, or 411*c*) being mutually insulated, and each of the leads 411 extends from the transparent region 101 to the pixel region 102, and is connected to a first pixel circuit 110. That is to say, each of the leads 411 is configured to transmit signals from only one of the first pixel circuits 110. Furthermore, the transfer layer 4 is provided with transfer holes connected to the respective leads 411 in one-to-one correspondence, and any of the first light-emitting devices 201 may be connected to the corresponding first pixel circuit 110 through a transfer hole and a lead 411. The transfer holes may be via-hole structures in the transfer layer 4. Since the leads 411 to which the transfer holes are connected may be located in different lead layers 41, different transfer holes may have different depths.

By way of example, as shown in FIG. 4, a first lead 411*a* is connected to the wiring section 2112 of the first electrode 211 of the corresponding first light-emitting device 201 via a first transfer hole 401, a second lead 411*b* is connected to the wiring section 2112 of the corresponding first light-emitting device 201 via a second transfer hole 402, and a third lead 411*c* is connected to the wiring section 2112 of the corresponding first light-emitting device 201 via a third transfer hole 403. Although it looks like there is interaction between the transfer holes and the leads 411 in FIG. 4, in a plane parallel to the drive backplane 1, both the third lead 411*c* and the second lead 411*b* are located outside the first transfer hole 401, and are not connected to the first transfer hole 401, similarly, the second transfer hole 402 is not connected to the third lead 411*c*. That is to say, each of the leads 411 is connected to the wiring section 2112 of one first light-emitting unit 201 through only one of the transfer holes, and the said one transfer hole is not connected to any other lead 411.

The material of the leads 411 of each of the lead layers 41 may include at least one of indium tin oxide (ITO) and indium gallium zinc oxide (IGZO), and may be other transparent conductive materials. A material of the second source and drain layer may be metal.

In some embodiments of the present disclosure, as shown in FIG. 4, the number of the lead layers 41 may be three, including a first lead layer 41*a*, a second lead layer 41*b* and a third lead layer 41*c* distributed sequentially from the drive backplane 1 towards the light-emitting layer 2.

Exemplarily, the leads 411 connected to the first light-emitting devices 201 in the first sub-region A1 are located in the first lead layer 41*a*; the leads 411 connected to the first light-emitting devices 201 in the second sub-region A2 are located in the second lead layer 41*b*; the leads 411 connected to the first light-emitting devices 201 in the third sub-region A3 are located in the third lead layer 41*c*; and the leads 411 connected to the first light-emitting devices 201 in the fourth sub-region A4 are located in at least one of the first lead layer 41*a*, the second lead layer 41*b* and the third lead layer 41*c*.

It should be noted that FIG. 4 is shown schematically only for illustrating the relationships of the respective film layers of the display panel, and is not intended to limit the specific structures of the lead layers 41.

As shown in FIG. 4, in order to insulate the lead layers 41 from one another, the transfer layer 4 further includes a first planarization layer 42, a second planarization layer 43 and a third planarization layer 44.

The first lead layer 41a may be provided on a surface of the drive backplane 1, close to the light-emitting layer 2. The first planarization layer 42 covers the first lead layer 41a and the surface of the drive backplane 1, close to the light-emitting layer 2.

The second lead layer 41b is provided on a surface of the first planarization layer 42, distal to the drive backplane 1. The second planarization layer 43 covers the second lead layer 41b and a surface of the first planarization layer 42, close to the light-emitting layer 2.

The third lead layer 41c is provided on a surface of the second planarization layer 43, distal to the drive backplane 1. The third planarization layer 44 covers the third lead layer 41c and a surface of the second planarization layer 43, close to the light-emitting layer 2; and the light-emitting layer 2 is provided on a surface of the third planarization layer 44, distal to the drive backplane 1.

Each of the electric conductors 3 includes at least one lead 411 to enable signal transmission.

Since leads 411 connected to different columns of the first light-emitting devices 201 have significantly different lengths, the leads 411 of at least some of the electric conductors 3 may be compensated for, that is, the area of the electric conductors 3 may be increased by providing other conductive structures connected to the leads 411, thereby increasing its parasitic capacitance, such that its delay time may be close to or equal to the standard delay time. There are various manners of increasing the parasitic capacitance, which are illustrated exemplarily below.

As shown in FIGS. 15-19, in some embodiments of the present disclosure, at least some of the electric conductors 3 may further include a first compensation portion 31, the first compensation portion 31 is provided on the same layer as a lead layer 41, and made of the same material as that of the lead 411. Furthermore, the first compensation portion 31 is connected to the lead 411 of the same electric conductor 3, to increase the area of the electric conductor 3 such that the parasitic capacitance is close to or equal to the standard parasitic capacitance, and then the delay time thereof is close to or equal to the standard delay time. Further, for any of the electric conductors 3 having the first compensation portion 31, its first compensation portion 31 and lead 411 may be provided on the same layer, and made of the same material, so as to be made as a whole easily.

In other embodiments of the present disclosure, at least some of the electric conductors 3 further include a second compensation portion 32, the second compensation portion 32 is located in the drive backplane 1, and is connected to the lead 411 of the same electric conductor 3, such that the area of the electric conductor 3 is increased by using the space in the drive backplane 1 to increase its parasitic capacitance, thereby making the delay time closer to the standard delay time. Furthermore, the second compensation portion 32 is located in the pixel region 102 to avoid shielding the transparent region 101, and a orthographic projection of the second compensation portion 32 on the drive backplane 1 and at least one of the first pixel circuits 110 in the row direction have an overlapping region, that is, one second compensation portions 32 may cover the side of a plurality of the first pixel circuits 110, which is close to the light-emitting layer 2. Certainly, one first compensation portions 31 may cover the side of a plurality of the first pixel circuits 110, which is close to the light-emitting layer 2 as well.

For two different electric conductors 3 connected to the first pixel circuits 110 on the same row and having the second compensation portion 32, different parasitic capacitance needs to be compensated, therefore, the numbers and locations of the second compensation portions 32 may be different, and the areas of the second compensation portions 32 may be different as well.

In further embodiments of the present disclosure, the parasitic capacitance of the electric conductor 3 may be increased by extending the length of the lead 411 to increase the area of the lead 411 as well, such that the parasitic capacitance is close to or equal to the standard parasitic capacitance. Specifically, the length of the leads 411 of at least some of the electric conductors 3 is greater than the distance between the first pixel circuit 110 and the first light-emitting device 201 in the row direction, to which the lead 411 is connected, and the specific length is not specifically limited here, depending on the distance from the first pixel circuit 110 to the transparent region 101. If no other conductive structure for increasing the parasitic capacitance is provided, the smaller the distance to the transparent region 101 is, the longer the length of lead 411. The lead 411 may be bent to increase its length if the space is limited.

Any of the electric conductors 3 may adopt at least one of the above-described three manners of increasing the parasitic capacitance of the electric conductors 3. The first compensation portions 31 and the extension of the leads 411 are adopted in order to reduce the technology difficulty and simplify the structure, that is, the compensation structure is provided on the same layer of the leads 411. The second compensation portion 32 may be adopted if the parasitic capacitance cannot be increased to the standard parasitic capacitance by adding the first compensation portion 31. Only the second compensation portion 32 may be adopted as well. In addition, the parasitic capacitance may be increased by increasing the widths of the leads 411, that is, different leads 411 may have different widths.

An exemplary illustration of the electric conductors 3 is given below based on the above-described three manners of increasing the parasitic capacitance.

As shown in FIG. 3, in some embodiments of the present disclosure, each of the electric conductors 3 may include a first electric conductor 3a, a second electric conductor 3b, a third electric conductor 3c and a fourth electric conductor 3d.

The First Electric Conductor 3a

As shown in FIGS. 15-23, the lead 411 of the first electric conductor 3a is the first lead 411a. The first lead 411a may extend along the row direction, and its length may be greater than the distance between the first pixel circuit 110 and the first light-emitting device 201 in the row direction, to which the first lead 411a is connected, thus increasing the parasitic capacitance by increasing the length.

The first electric conductor 3a further includes first compensation portions 31 and second compensation portions 32. A number of first compensation portions 31 are provided, and are connected to at least one side of the lead 411 along the row direction, and the first compensation portions 31 may be convex structures formed integrally with the first leads 411a and protrude along the column direction. A number of second compensation portions 32 are provided, are distributed along the row direction, and connected to one another.

Furthermore, the first electric conductor 3a further includes a third compensation portion 33 connected to the first lead 411a and connected to the first compensation portion 31 via the second compensation portion 32. For example, the third compensation portion 33 and the second compensation portion 32 may be located on the same layer, made of the same material, connected to each other, and located in a part of the transparent region 101 but outside the photographing range P.

Combining with the specific application scenario, for the above-mentioned target light-emitting region having 48 columns of first light-emitting devices 201, as shown in FIGS. 14-23, the $1^{st}$ column of first light-emitting devices 201 are connected to the $1^{st}$ column of first pixel circuits 110 via the first electric conductors 3a. One end of the first lead 411a extends to one side of the first electrode 211 of the first light-emitting device 201, close to the first central axis S1, and the other end extends to a position between the $2^{nd}$ column of first pixel circuits 110 and the $1^{st}$ column of first pixel circuits 110.

A number of first compensation portions 31 are provided, and are distributed on one side of the first lead 411a along the row direction, and are integrally formed with the first lead 411a. Furthermore, the first lead 411a is located on the first lead layer 41a.

The second compensation portion 32 and the second source and drain layer 005 are provided on the same layer and made of the same material, and two second compensation portions 32 are provided, and located on both sides of the $1^{st}$ column of first pixel circuits 110. The second compensation portion 32 located on the side of the $1^{st}$ column of first pixel circuits 110, distal to the first central axis S1 is located between the $14^{th}$ column of first pixel circuits 110 and the $13^{th}$ column of first pixel circuits 110. The second compensation portion 32 located on the side of the $1^{st}$ column of first pixel circuits 110, close to the first central axis S1 and an orthographic projection of a dummy pixel circuit on the light-emitting layer 2 at least partially have an overlapping region. Moreover, the two second compensation portions 32 are connected by a connecting line 322 on the same layer as the second compensation portion 32.

The third compensation portion 33 is located in the transparent region 101 outside the photographing range P, and is connected to the second compensation portion 32.

The Second Electric Conductor 3b

As shown in FIGS. 24-28, the lead 411 of the second electric conductor 3b is the second lead 411b, the second lead 411b extends along the row direction, and has a length greater than the distance between the first pixel circuit 110 and the first light-emitting device 201 in the row direction, to which the second lead 411b is connected.

The second electric conductor 3b further includes the first compensation portion 31 connected to the second lead 411b.

Referring to the specific application scenario, for the above-described target light-emitting region having 48 columns of first light-emitting devices 201, as shown in FIGS. 24-28, the $5^{th}$ column of first light-emitting devices 201 are connected to the $5^{th}$ column of first pixel circuits 110 via the second electric conductors 3b. The second lead 411b extends to one side of the $9^{th}$ column of first pixel circuits 110, distal to the transparent region 101, and a region of the second lead 411b between the $6^{th}$ column of first pixel circuits 110 and the $9^{th}$ column of first pixel circuits 110 is a width increasing region which has a width greater than the width of other regions. A number of first compensation portions 31 are provided, and are connected to both sides of the width increasing region. The second lead 411b is connected to the first pixel circuit 110 by a jumper line 400 which is on the same layer as the second source and drain layer 005.

As shown in FIGS. 29-37, the $9^{th}$ column of first light-emitting devices 201 are connected to the $9^{th}$ column of first pixel circuits 110 via the second electric conductors 3b, but the second electric conductor 3b differs from the second electric conductors 3b of the $5^{th}$ column of first pixel circuits 110 in that the second leads 411b connected to the $9^{th}$ column of first light-emitting devices 201 extends to a position between the $39^{th}$ column of first pixel circuits 110 and the $38^{th}$ column of first pixel circuits 110.

The first compensation portion 31 is located outside one end of the second lead 411b, distal to the transparent region 101, and is connected to the second lead 411 via the transfer line 300 in the drive backplane 1. Specifically, the first compensation portion 31 is located between the $35^{th}$ column of first pixel circuits 110 and the $33^{rd}$ column of first pixel circuits 110, and is connected to the second lead 411b via the transfer line 300 which is on the same layer as the second source and drain layer 005 and made of the same material as the second source and drain layer 005.

The Third Electric Conductor 3c

As shown in FIGS. 38-42, the lead 411 of the third electric conductor 3c is the third lead 411c. The third lead 411c includes a first segment 310, a second segment 320 and a third segment 330, wherein the first segment 310 is connected to a first light-emitting device 201 and extends to the pixel region 102 along the row direction; the length of the first segment 310 is greater than the distance between the first pixel circuit 110 and the first light-emitting device 201 in the row direction, to which the third lead 411c is connected; the second segment 320 extends along the column direction, and is connected to one end of the first segment 310, located in the pixel region 102; and the third segment 330 extends to one side of the second segment 320, close to the transparent region 101 in the row direction, and is connected to a first pixel circuit 110. The third segment 330 may extend along a straight line trajectory, or a stepped trajectory, but its extension tendency is towards the transparent region 101.

Referring to the specific application scenario, for the above-mentioned target light-emitting region having 48 columns of first light-emitting devices 201, as shown in FIGS. 38-42, the $10^{th}$ column of first light-emitting devices 201 are connected to the $10^{th}$ column of first pixel circuits 110 via the third electric conductors 3c, wherein the second segment 320 of the third lead 411c is located on one side of the $33^{rd}$ column of first pixel circuits 110, distal to the transparent region 101.

The Fourth Electric Conductor 3d

Figure 43:
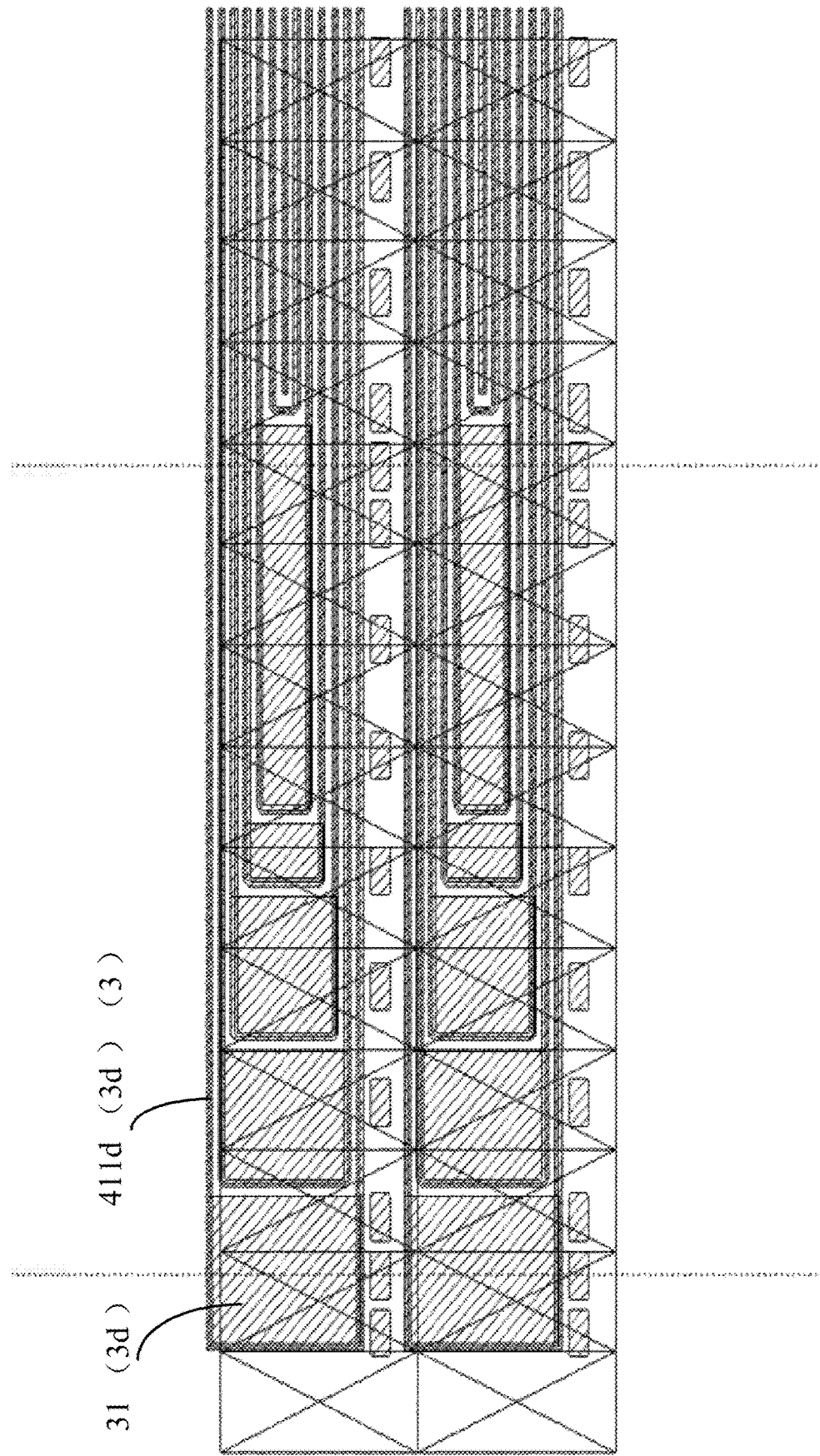
FIG. 43 is a schematic diagram of an electric conductor of the 39$^{th}$ column of pixel circuit in an embodiment of a display panel according to the present disclosure.

As shown in FIG. 43, the lead 411 of the fourth electric conductor 3d is the fourth lead 411d. The fourth lead 411d includes the first segment 310, the second segment 320 and the third segment 330 like that of the third lead 411c as well, its structure is similar to that of the third lead 411c, and will not be described in detail here. Furthermore, the fourth electric conductor 3d includes the first compensation portion 31, which is located between the first segment 310 and the third section 330 and located on one side of the first segment 310, close to the transparent region 101, and the first compensation portion 31 of the fourth electric conductor 3d is connected to at least one of the first segment 310, the second segment 320 and the third section 330.

Referring to the specific application scenario, for the above-mentioned target light-emitting region having 48 columns of first light-emitting devices 201, as shown in FIG. 43, the $39^{th}$ column of first light-emitting devices 201 are connected to the 39$^{th}$ column of first pixel circuits 110 via the fourth electric conductors 3*d*. The second segment 320 of the fourth lead 411*d* is located on one side of the 48$^{th}$ column of first pixel circuits 110, distal to the transparent region 101. The first compensation portion 31 is in a rectangular shape, where a part of the first compensation portion 31 is located on one side of the 48$^{th}$ column of first pixel circuits 110, distal to the transparent region 101, and another part of the first compensation portion 31 is located between the 47$^{th}$ column of first pixel circuits 110 and the 48$^{th}$ column of first pixel circuits 110. Furthermore, the first compensation portion 31 is connected to the first segment 310, the second segment 320 and the third segment 330.

Figure 44:
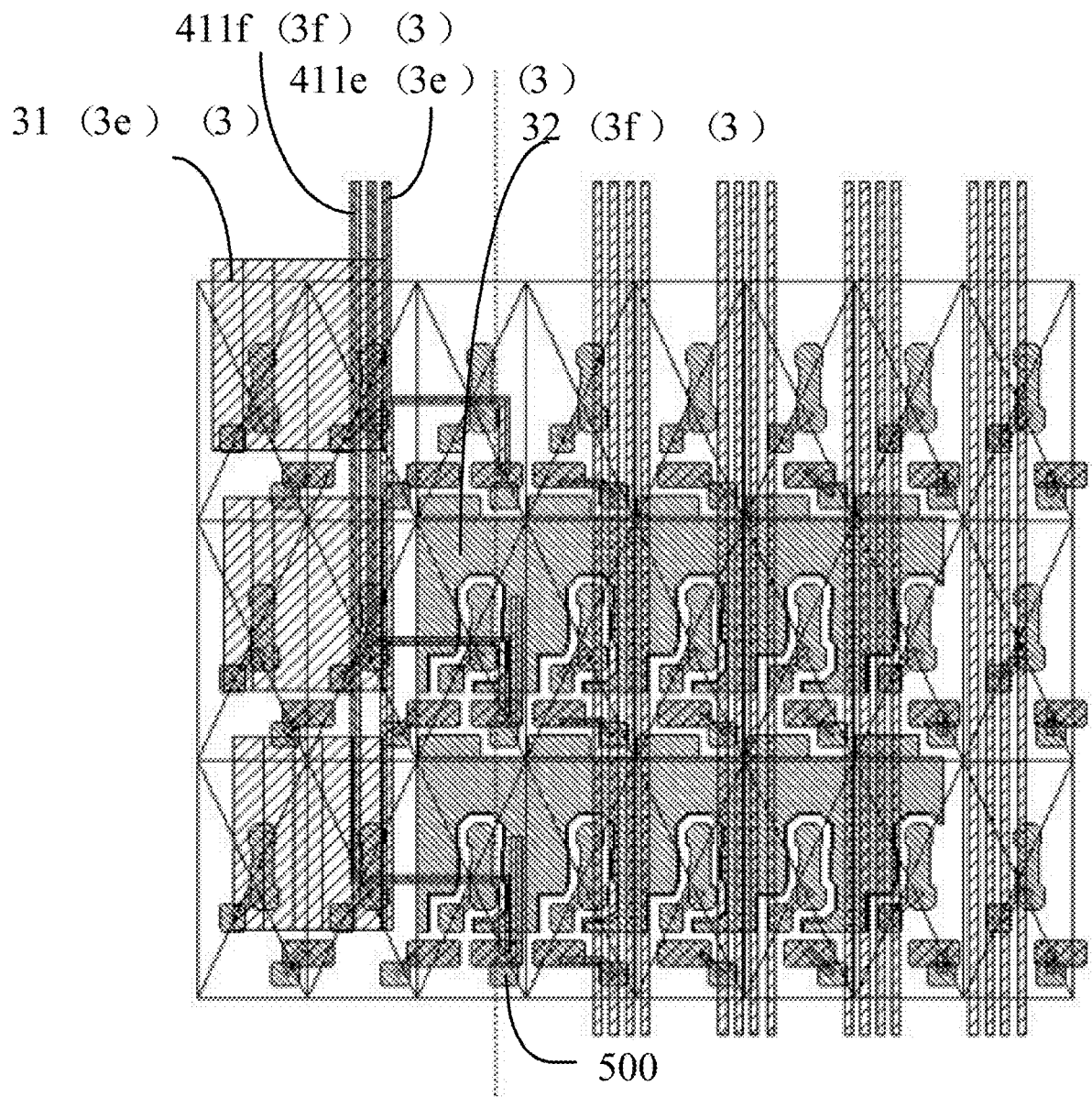
FIGS. 44-46 are schematic diagrams of an electric conductor of the 40$^{th}$ column of pixel circuit in an embodiment of a display panel according to the present disclosure.
Figure 45:
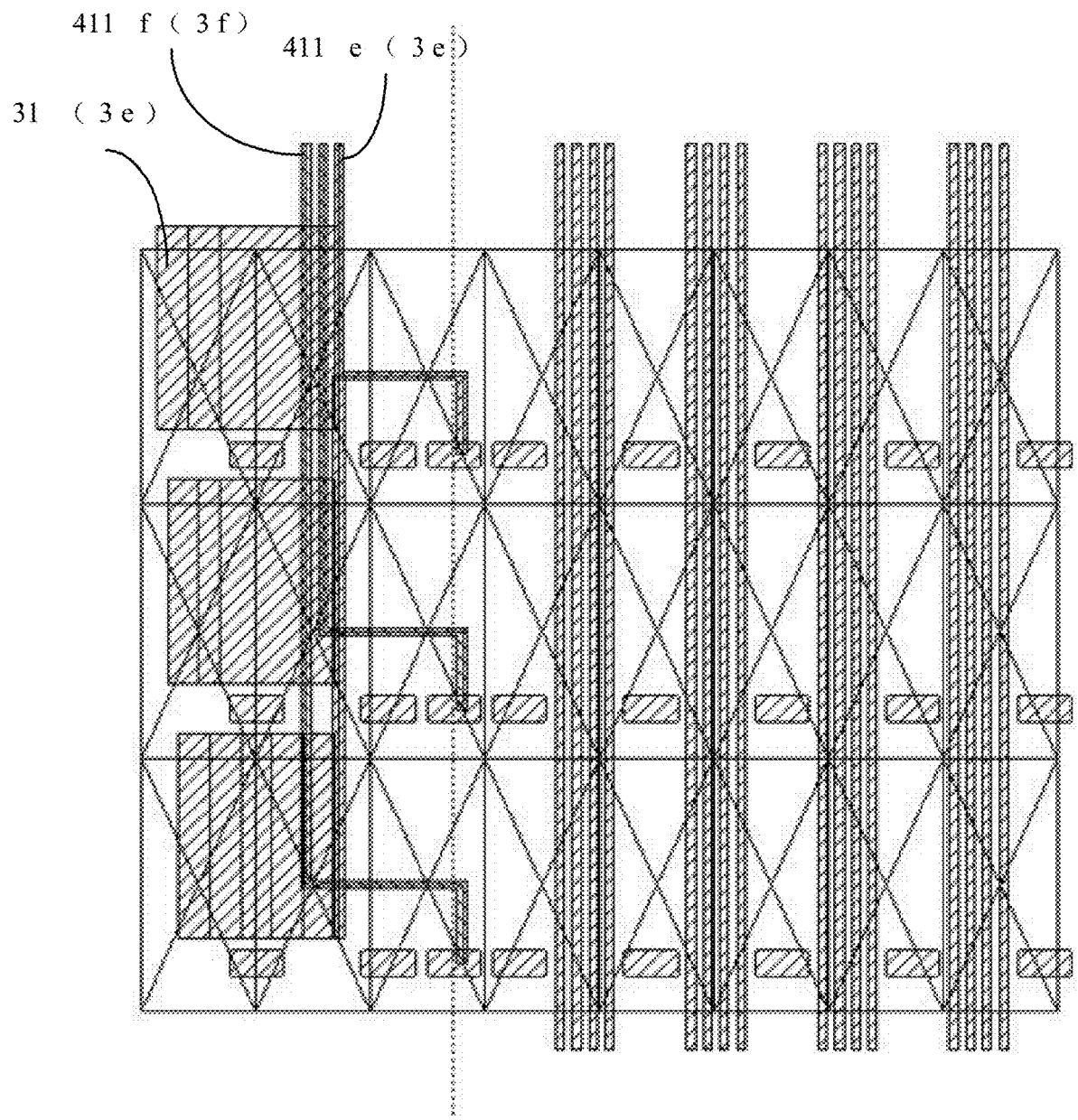
Figure 46:
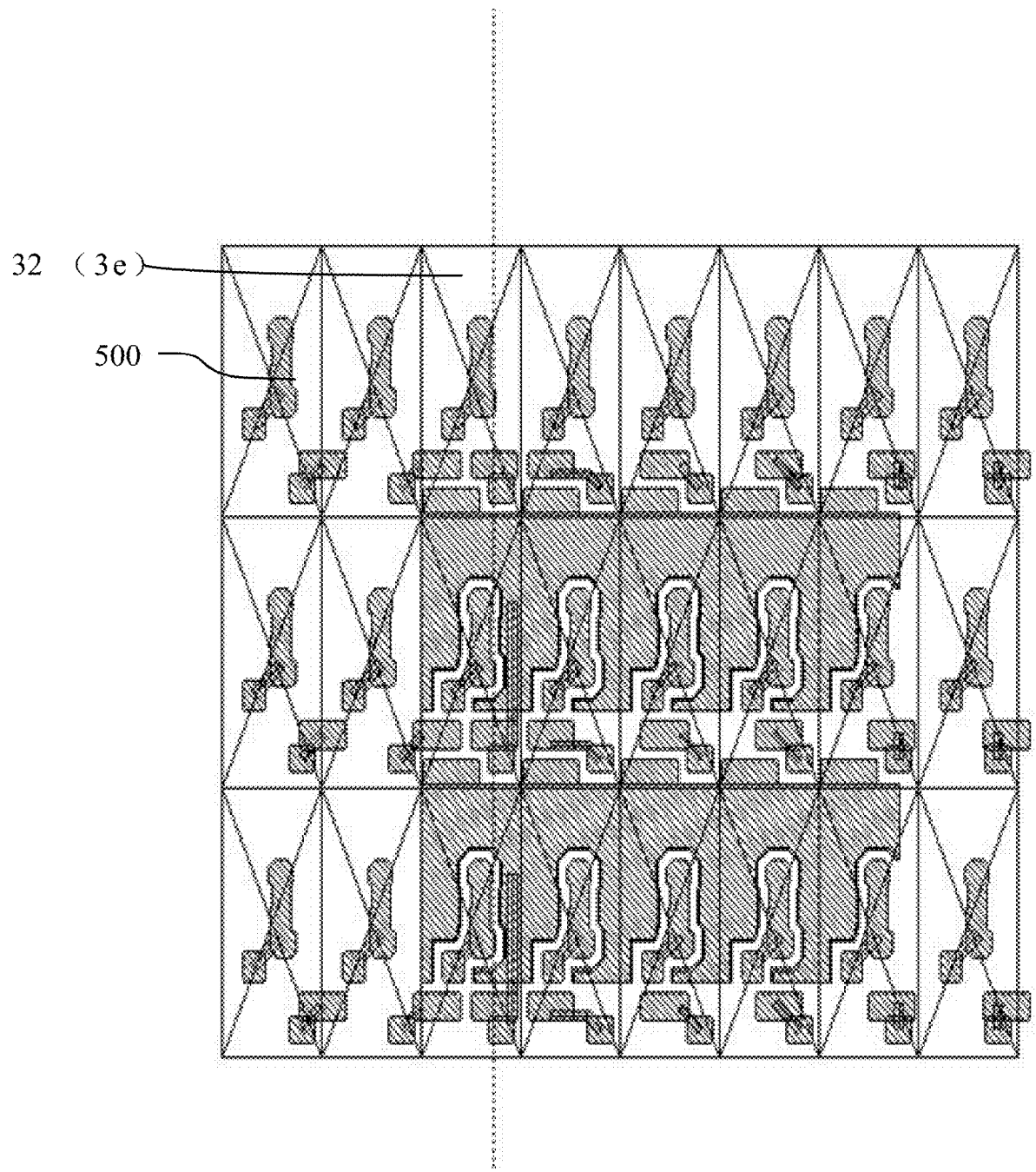

As shown in FIGS. 44-46, a part of the electric conductors 3 connecting the 40$^{th}$ column of first light-emitting devices 201 and the 40$^{th}$ column of first pixel circuits 110 may adopt the first compensation portion 31, and another part of the electric conductors 3 may adopt the second compensation portion 32. Specifically, the fifth electric conductor 3*e* and the sixth electric conductor 3*f* are shown, wherein the lead 411 of the fifth electric conductor 3*e* is the fifth lead 411*e*, and the lead 411 of the sixth electric conductor 3*f* is the sixth lead 411*f*.

The first compensation portion 31 of the fifth electric conductor 3*e* is located on one side of the 40$^{th}$ column of first pixel circuits 110, distal to the transparent region 101, and a plurality of first compensation portions 31 are provided, connected to one another, located on the same layer as the first lead 411*a*, and made of the same material as the first lead 411*a*. The fifth lead 411*e* and the first lead 411*a* are located on the same layer, and made of the same material, and the fifth lead 411*e* is connected to the first compensation portion 31.

A part of the second compensation portion 32 of the sixth electric conductor 3*f* is located on one side of the 40$^{th}$ column of first pixel circuits 110, distal to the transparent region 101, and another part of the second compensation portion 32 is located on one side of the 40$^{th}$ column of first pixel circuits 110, close to the transparent region 101, and the sixth lead 411*f* is connected to the second compensation portion 32.

It should be noted that the person skilled in the art could make reasonable choices and combinations of the above-mentioned ways of increasing parasitic capacitance of the electric conductors 3 according to the actual situation, which is not limited to the embodiments enumerated above.

Furthermore, the first lead 411*a*, the second lead 411*b*, the third lead 411*c*, the fourth lead 411*d*, the fifth lead 411*e* and the sixth lead 411*f* refer to six types of leads 411, rather than six specific leads 411, and the same type of leads 411 may have the same structure or different structures. For example, both the lead 411 connected to the 5$^{th}$ column of first pixel circuit 101 and the 9$^{th}$ column of first pixel circuit 101 are second lead 411*b*, but are not the same one second lead 411*b*, instead, they are two second leads 411*b* that have different structures.

Figure 11:
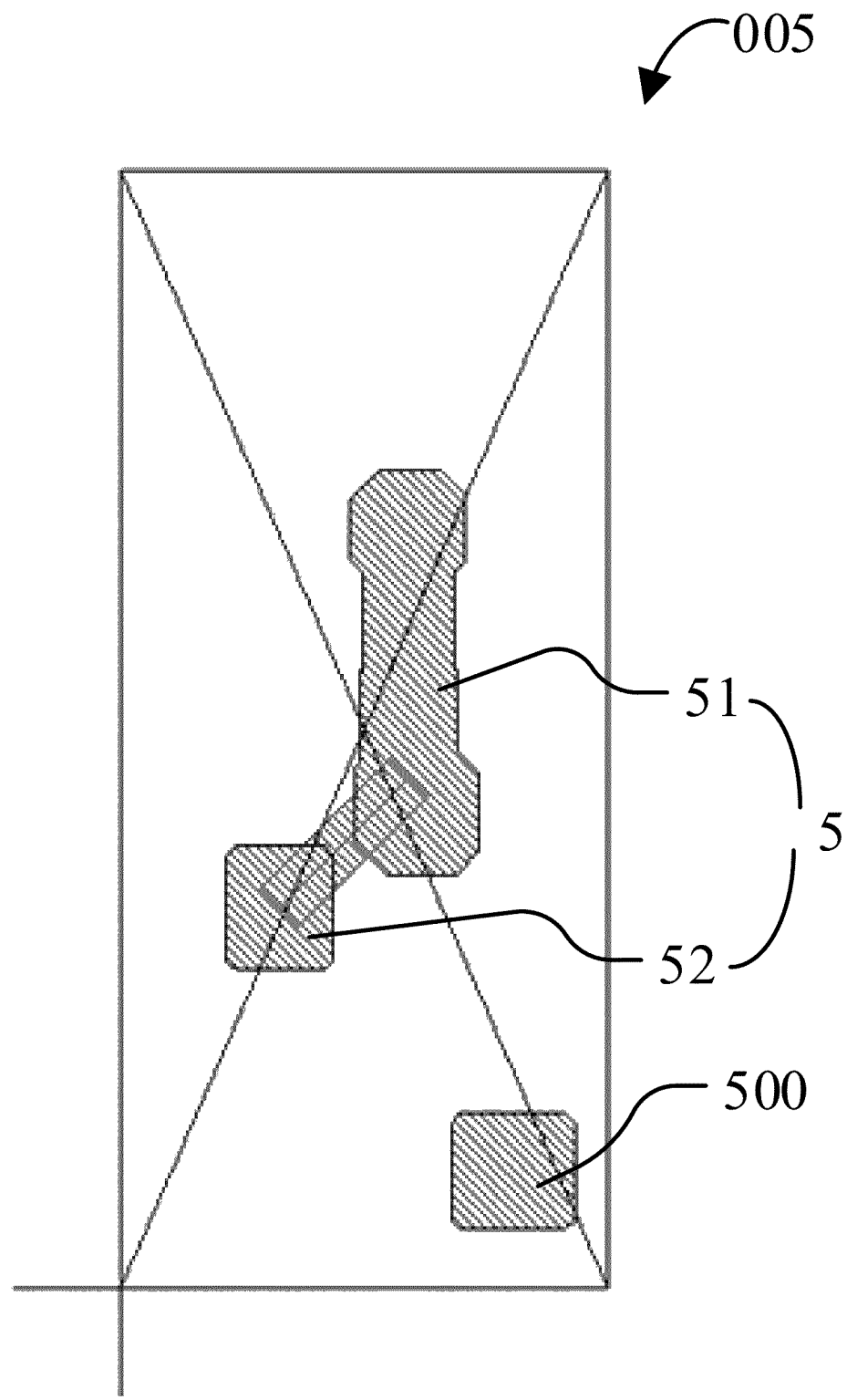
Figure 18:
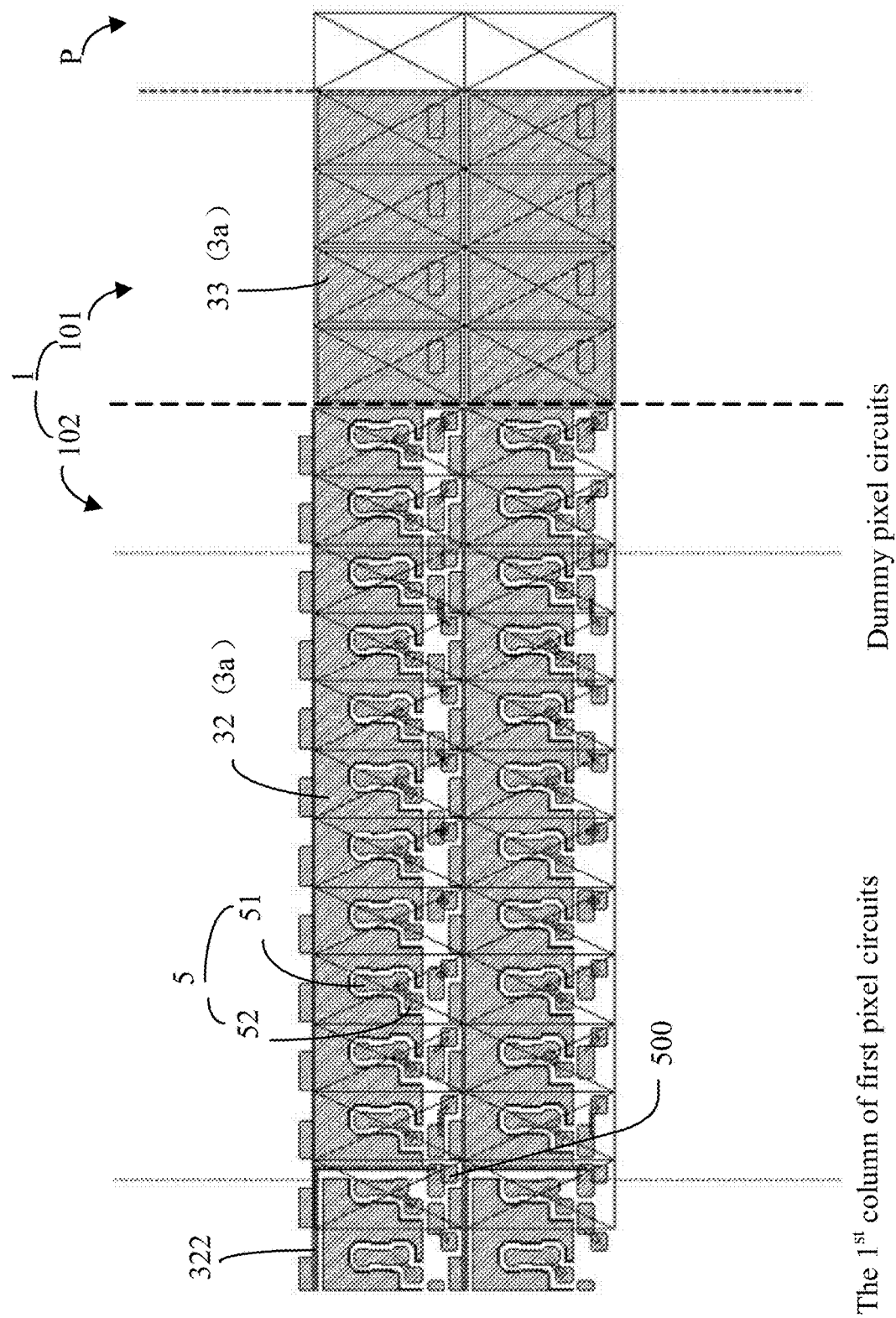
Figure 19:
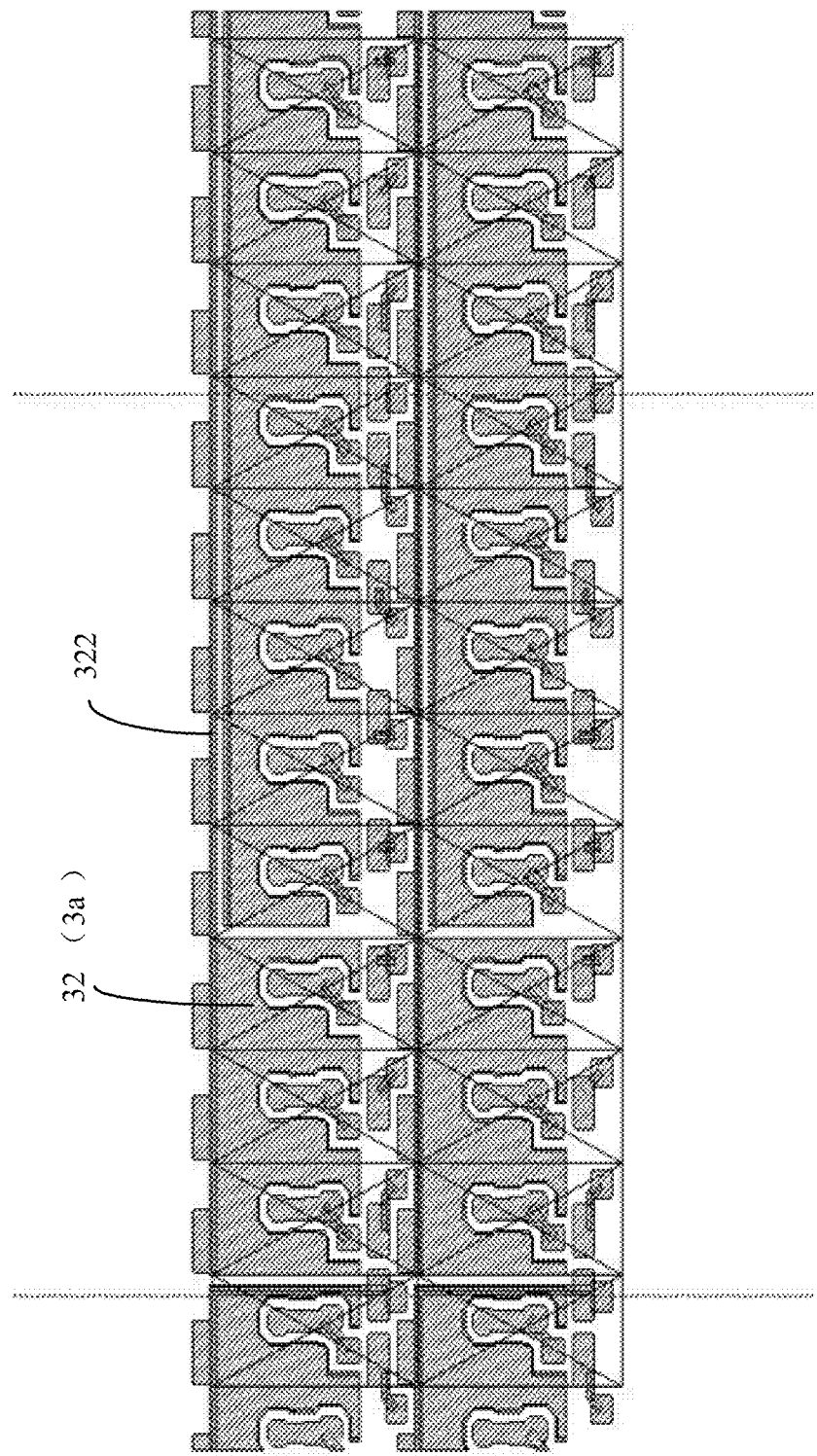
Figure 20:
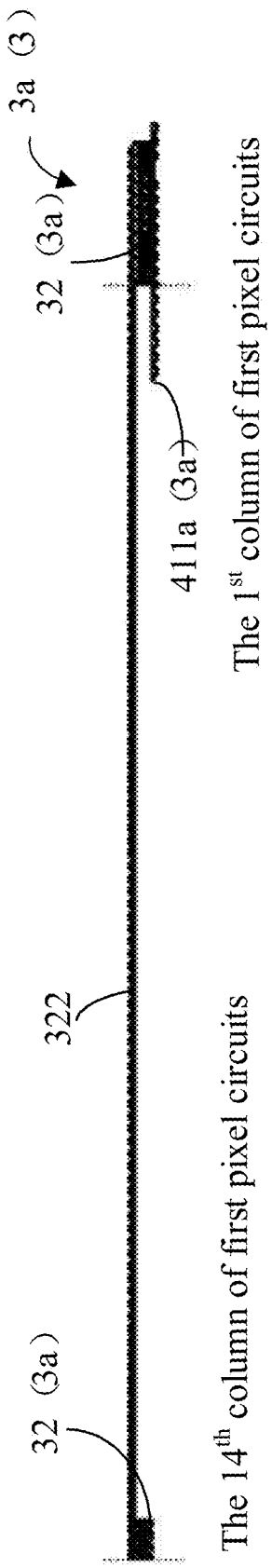
Figure 21:
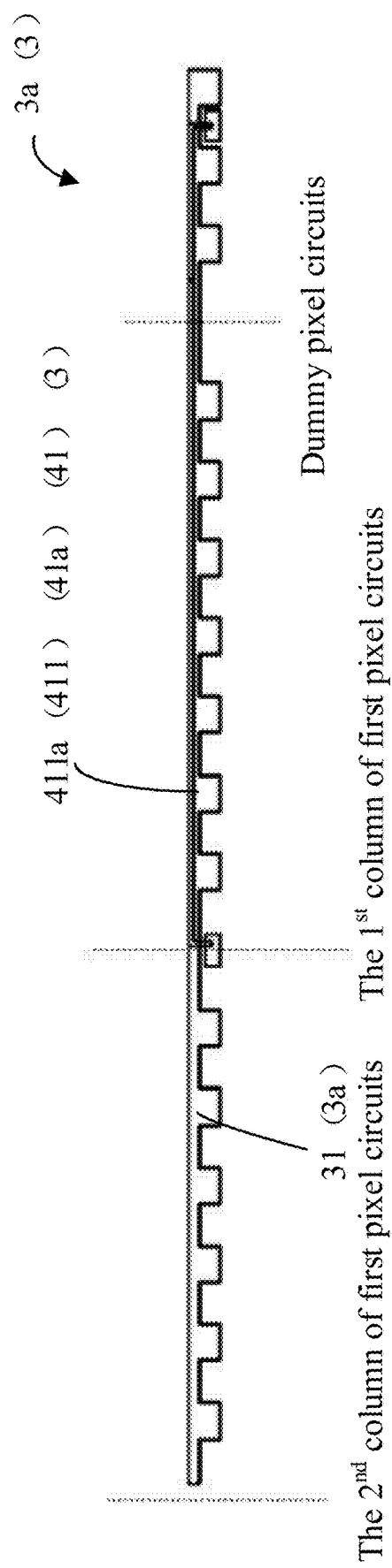
Figure 22:
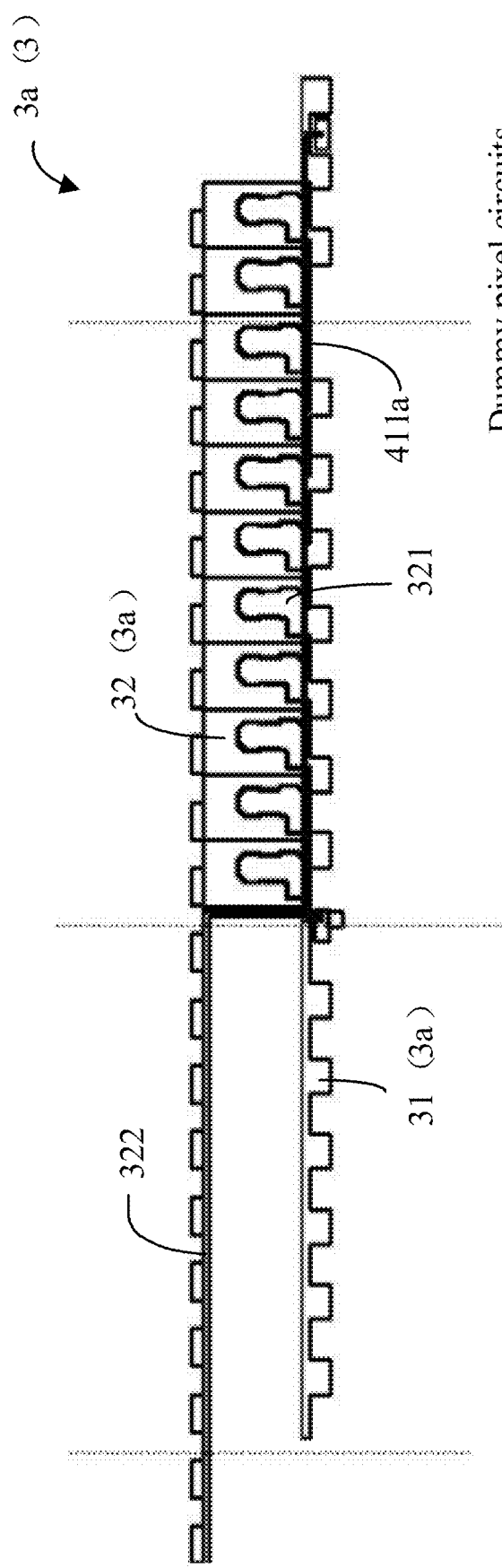
Figure 23:
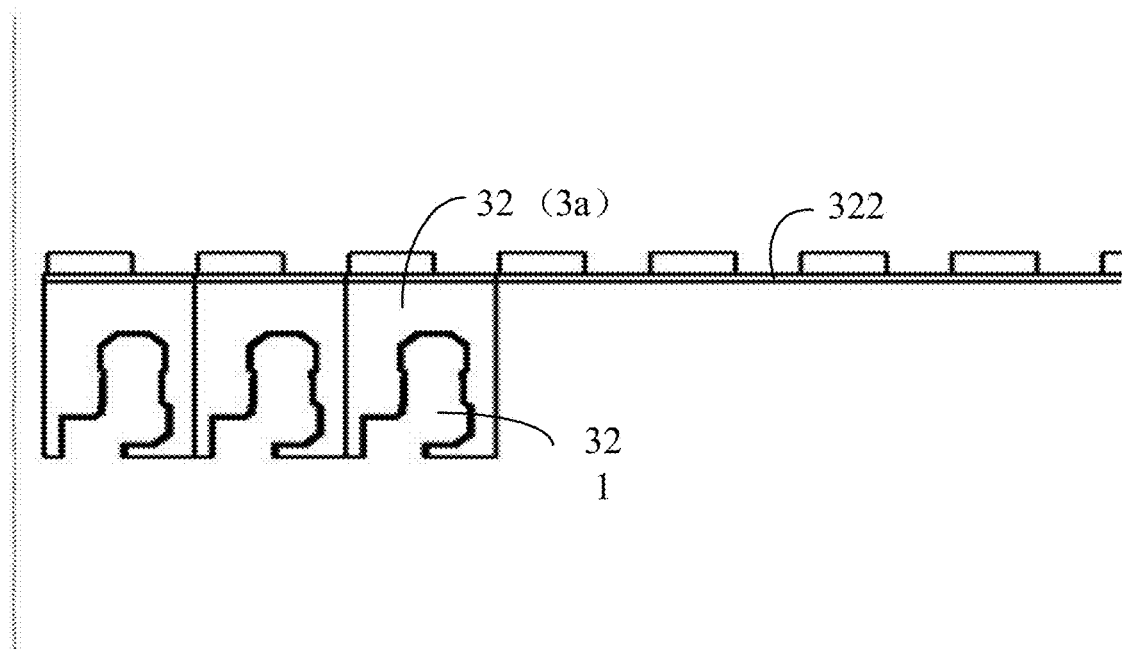
Figure 24:
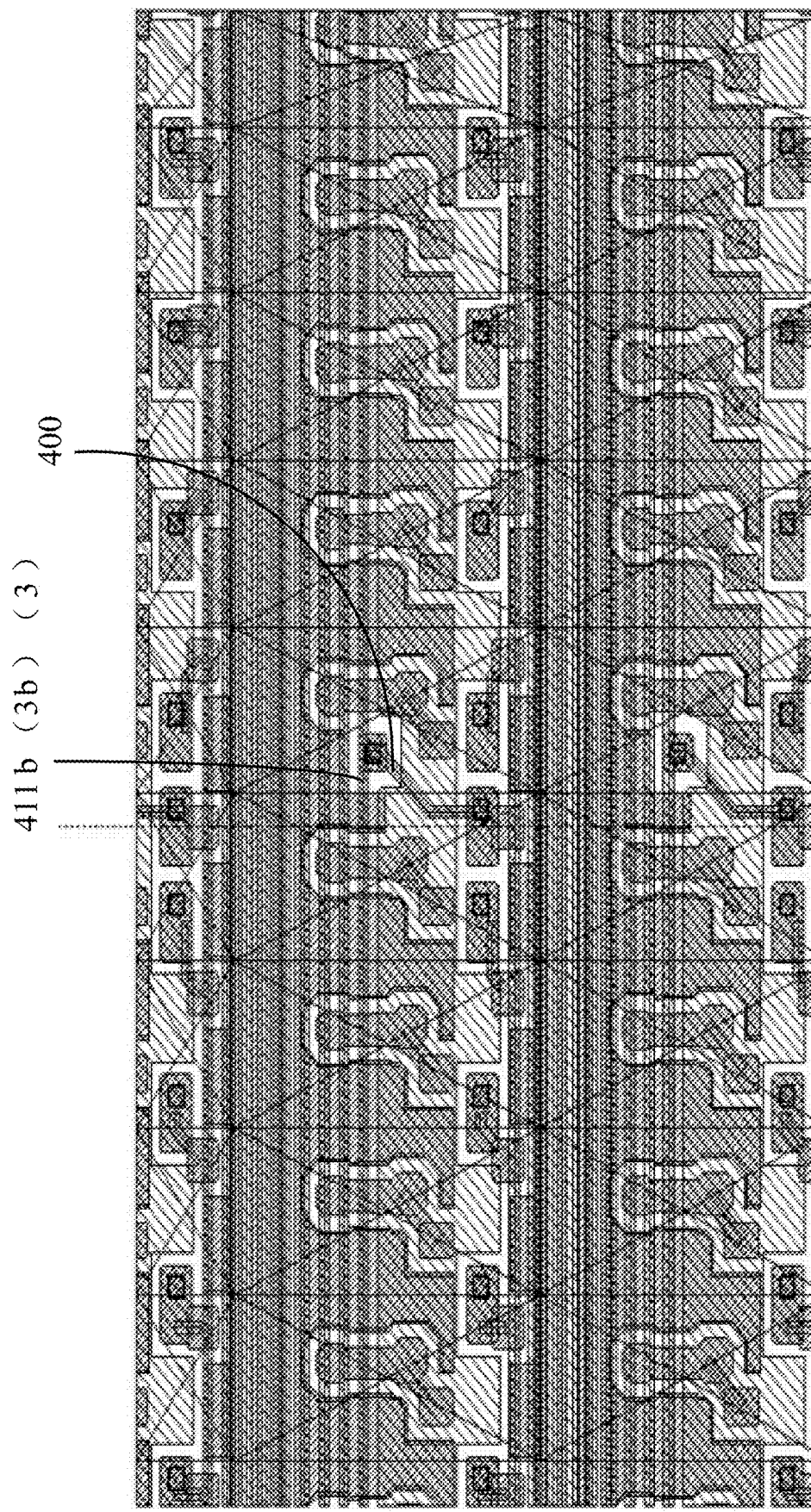
FIGS. 24-28 are schematic diagrams of an electric conductor of the 5$^{th}$ column of pixel circuit in an embodiment of a display panel according to the present disclosure.
Figure 25:
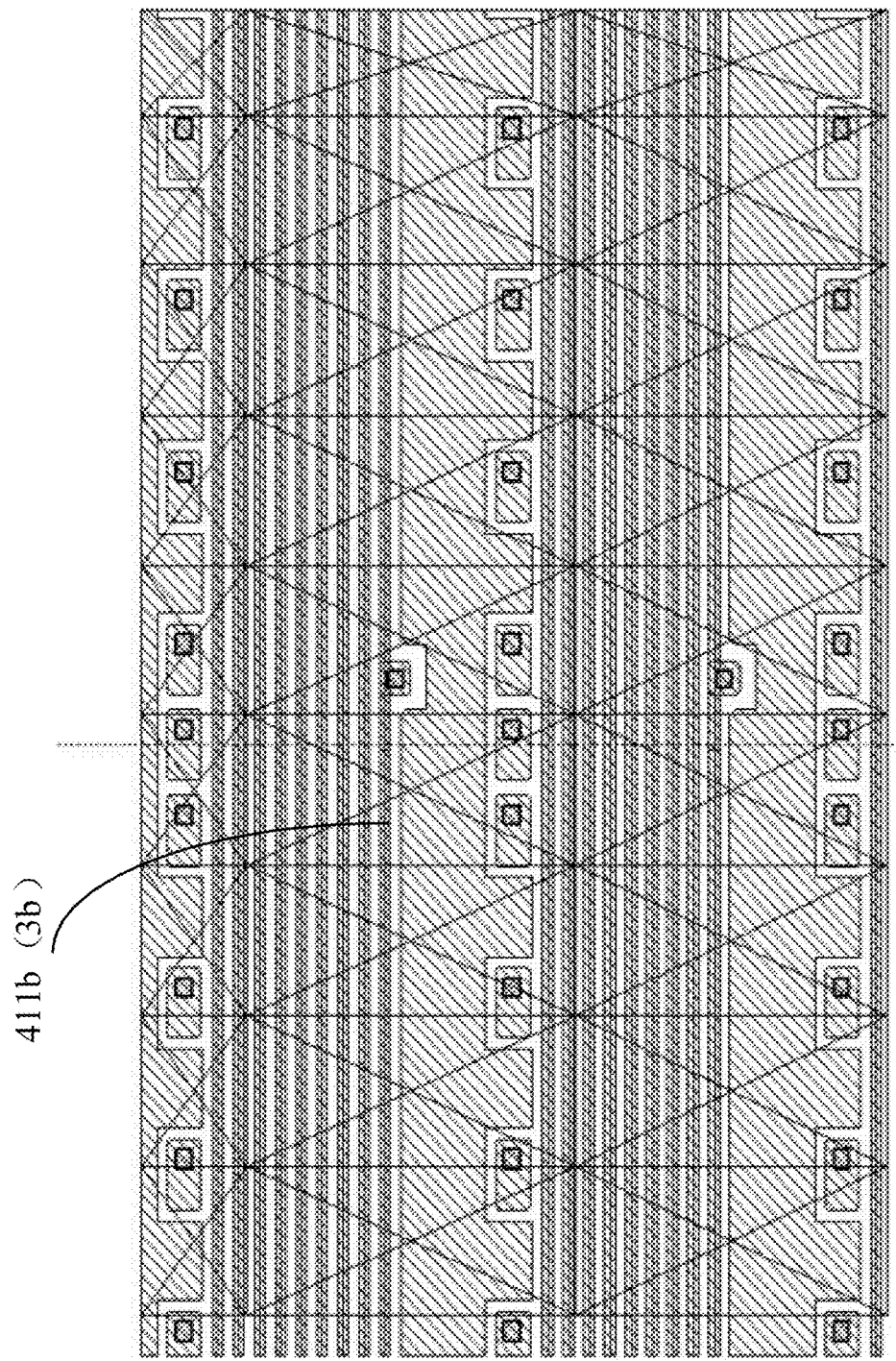
Figure 26:
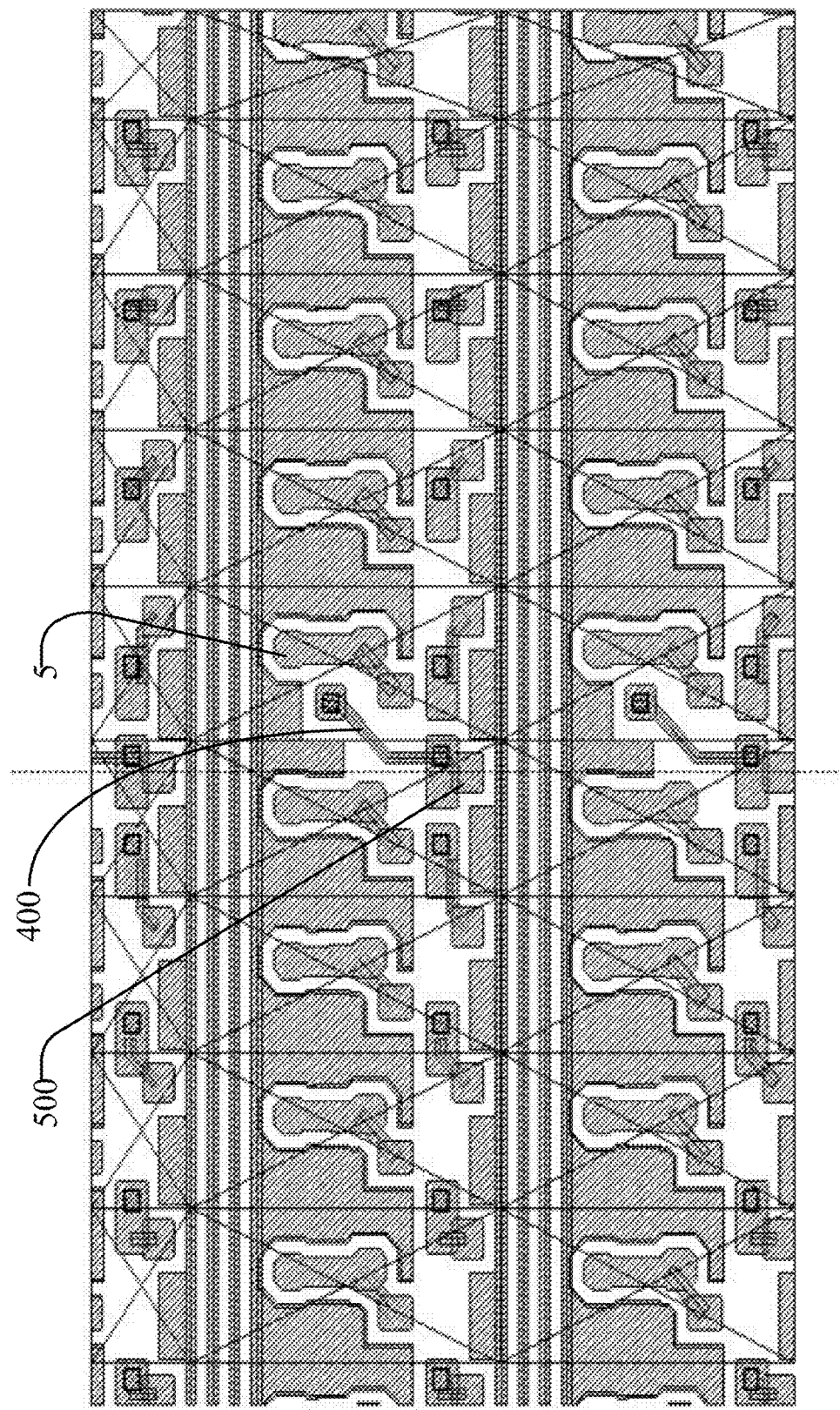
Figure 27:
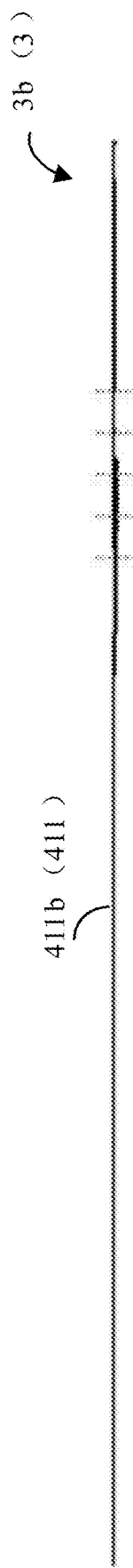
Figure 28:
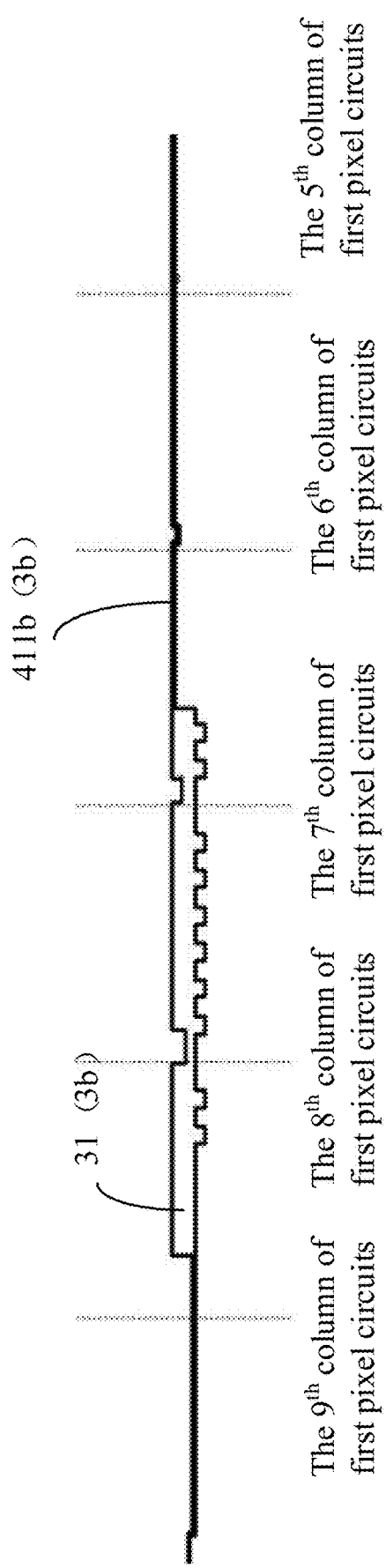
Figure 29:
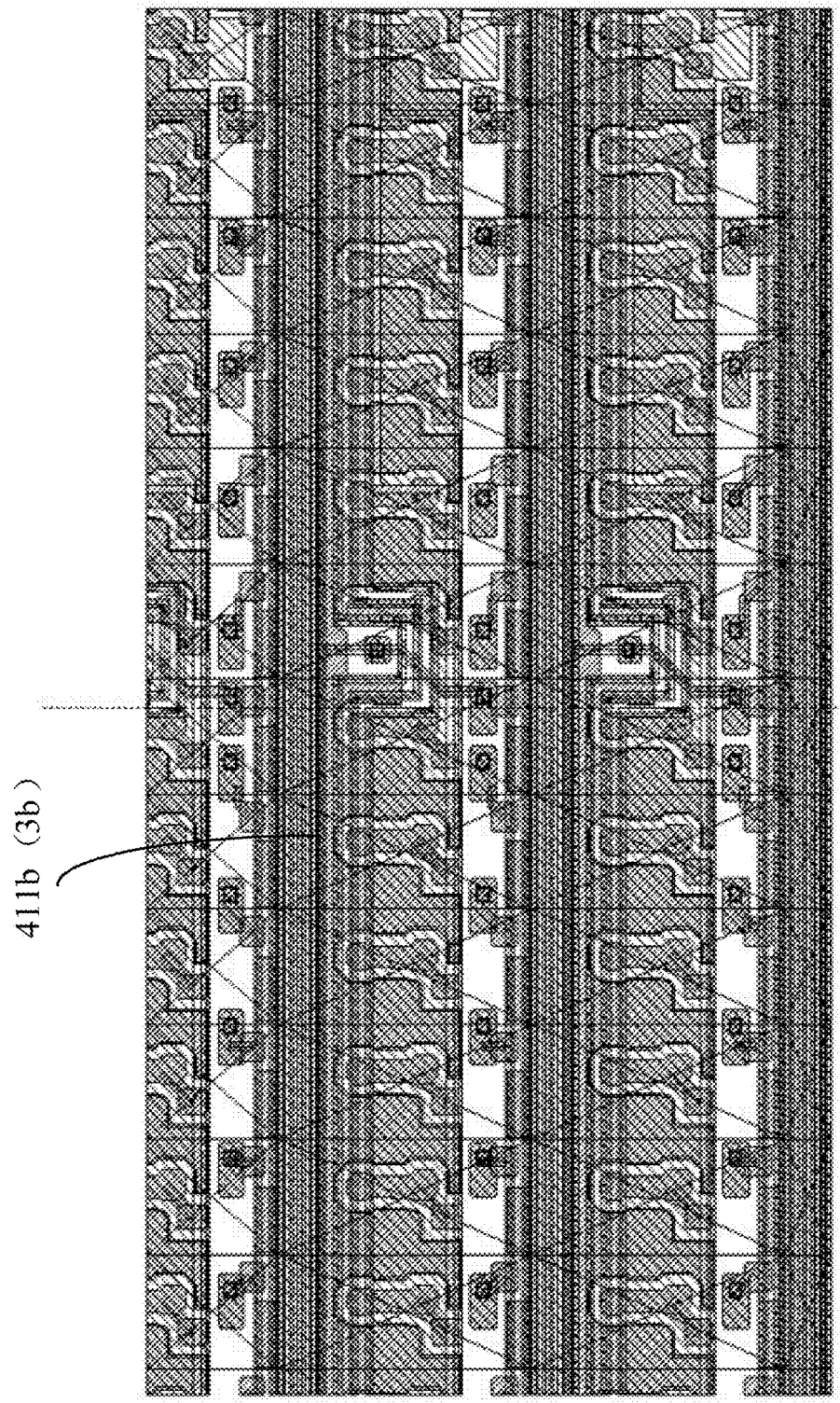
FIGS. 29-37 are schematic diagrams of an electric conductor of the 9$^{th}$ column of pixel circuit in an embodiment of a display panel according to the present disclosure.
Figure 30:
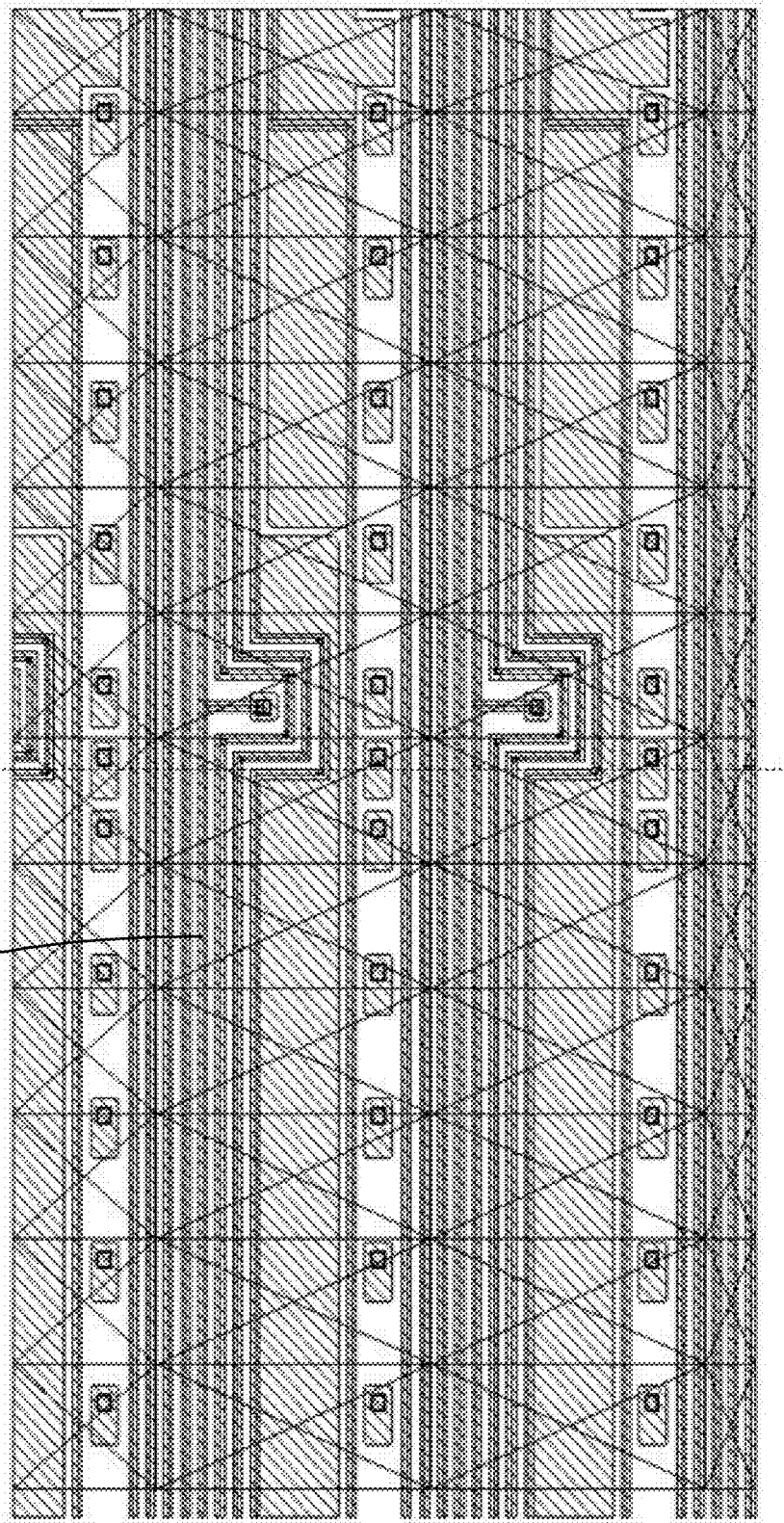
Figure 31:
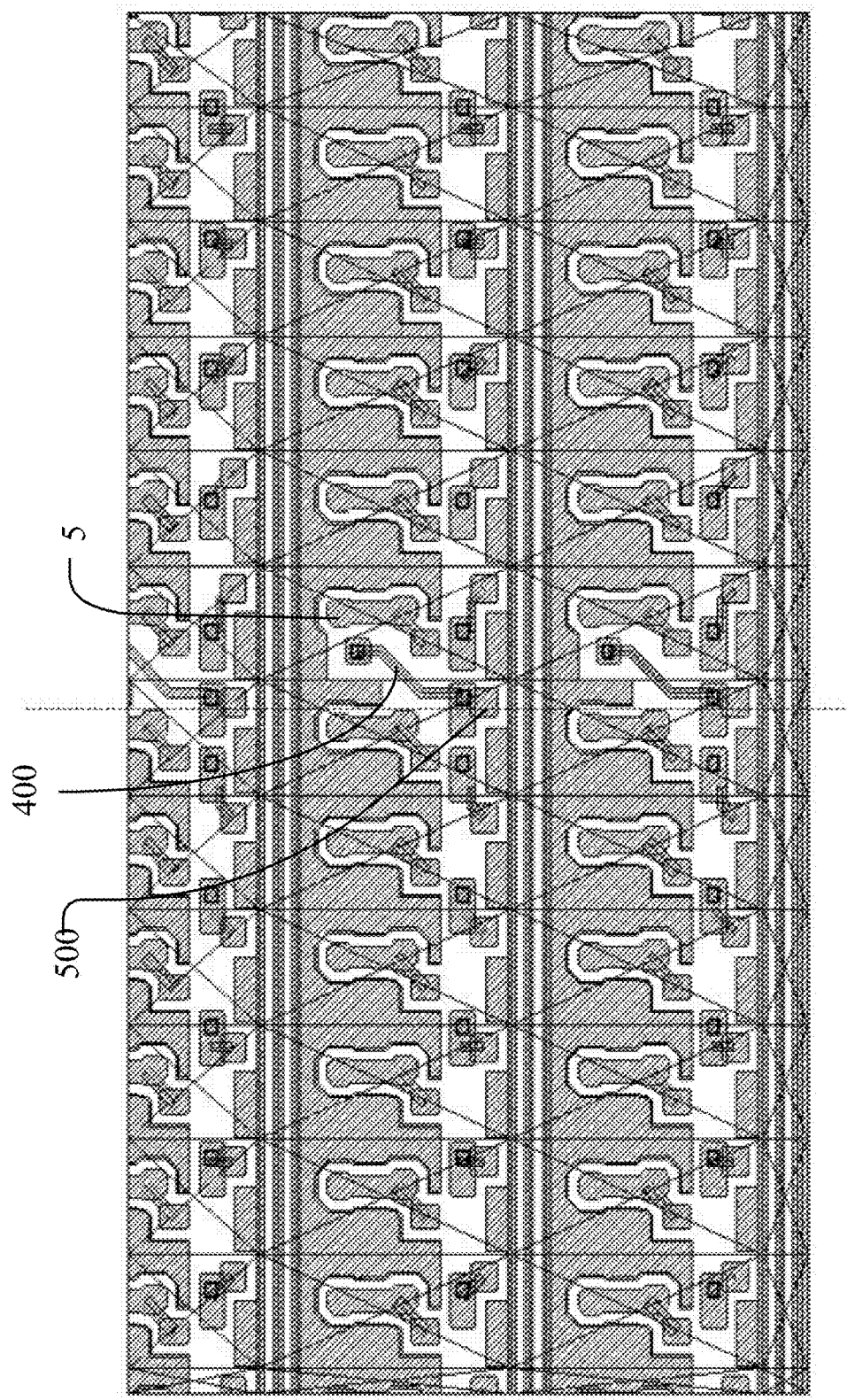
Figure 32:
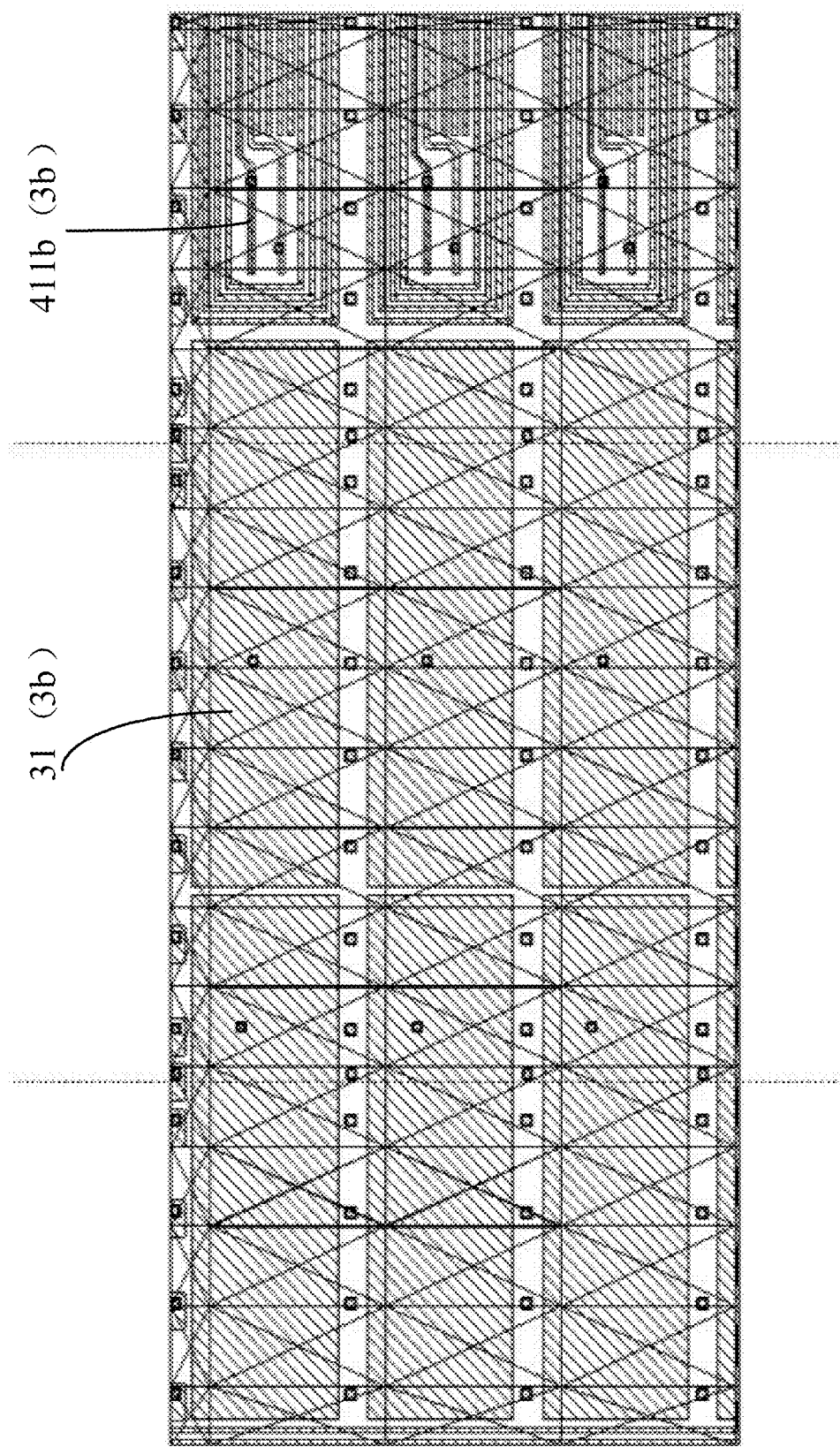
Figure 33:
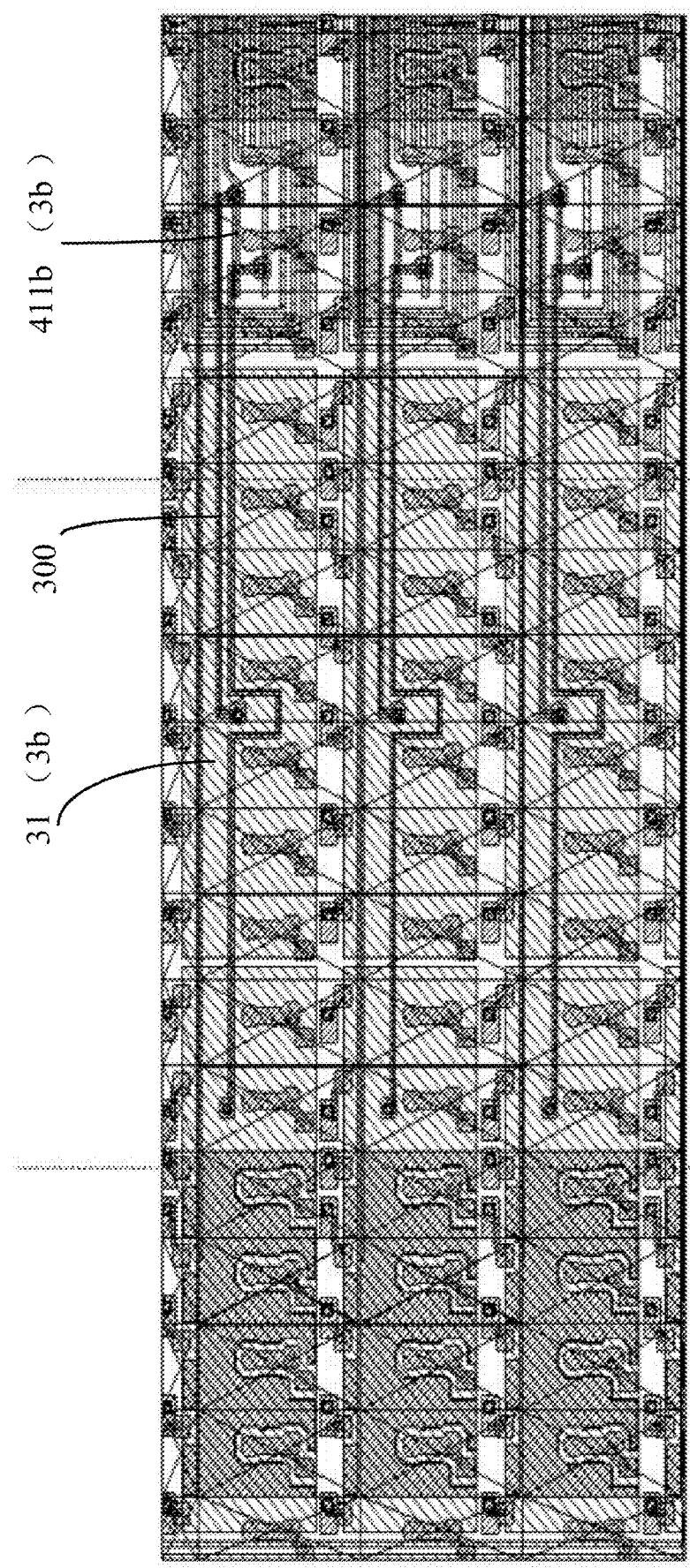
Figure 34:
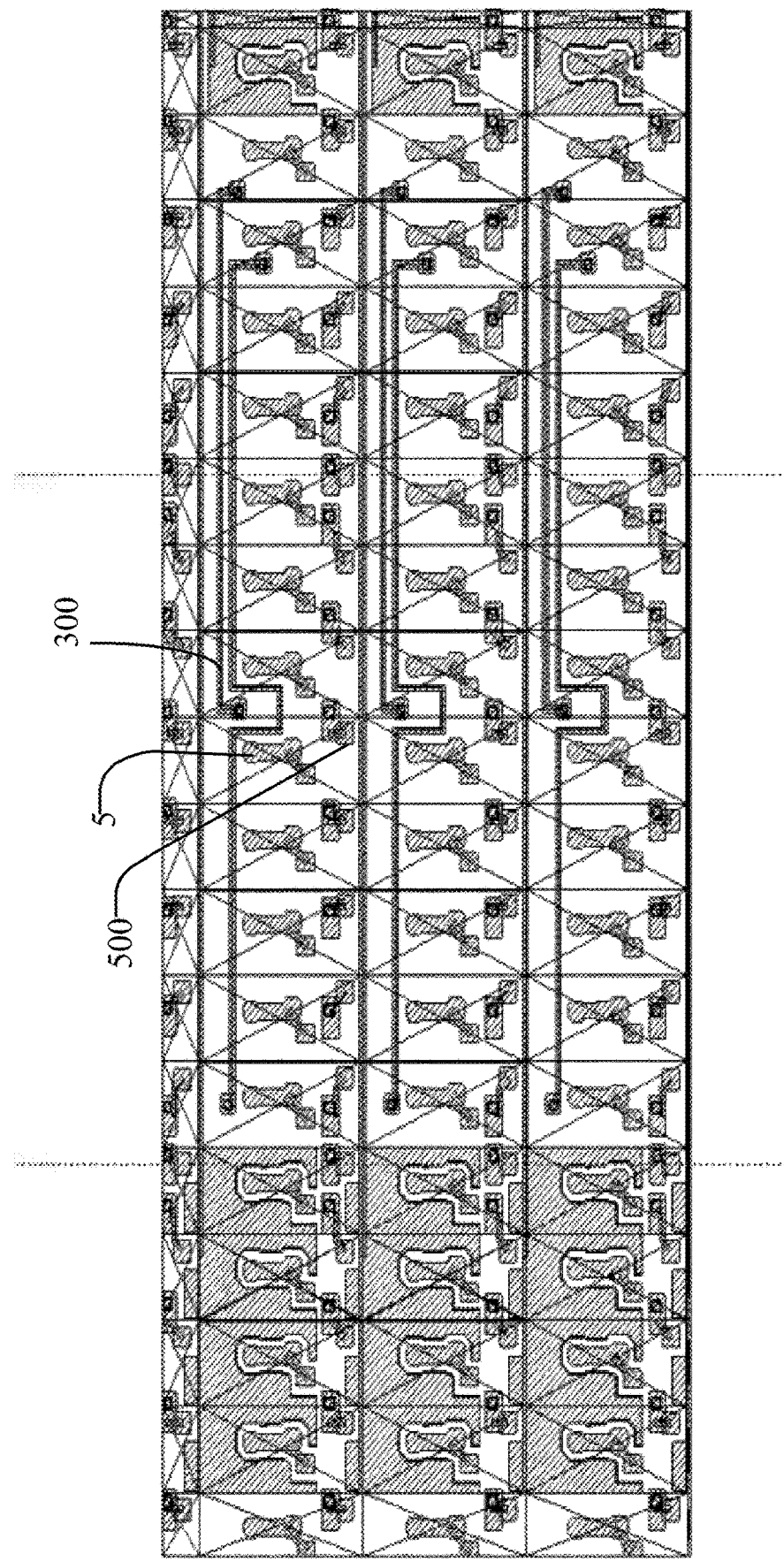
Figure 35:
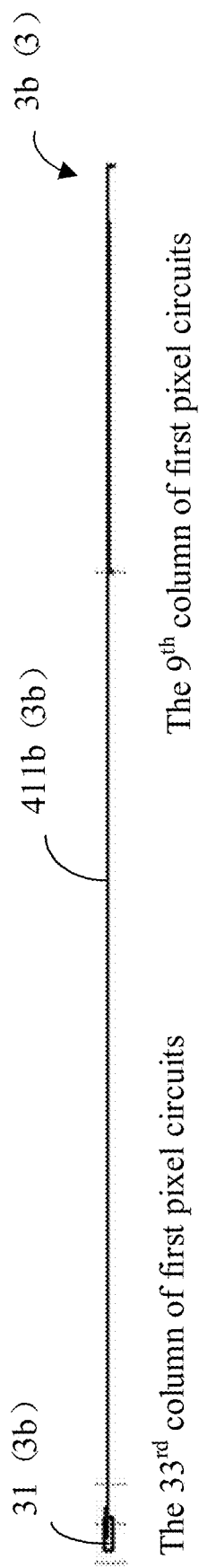
Figure 36:
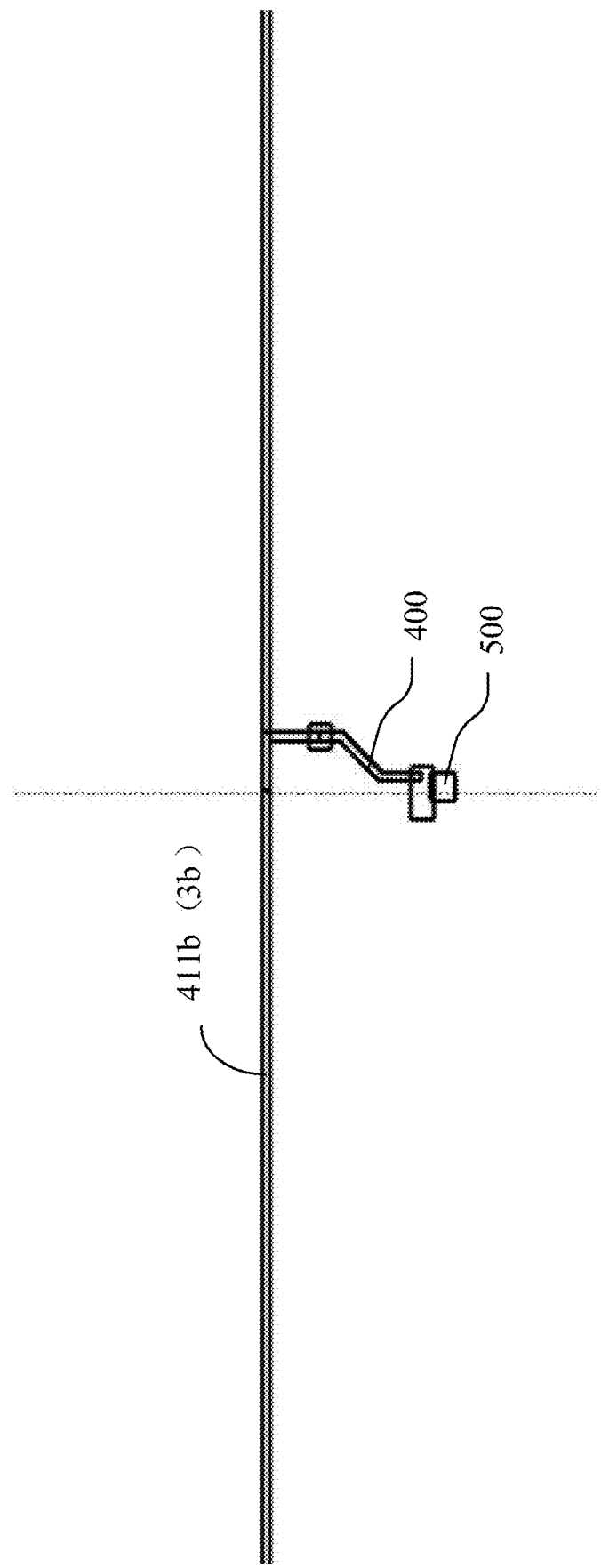
Figure 37:
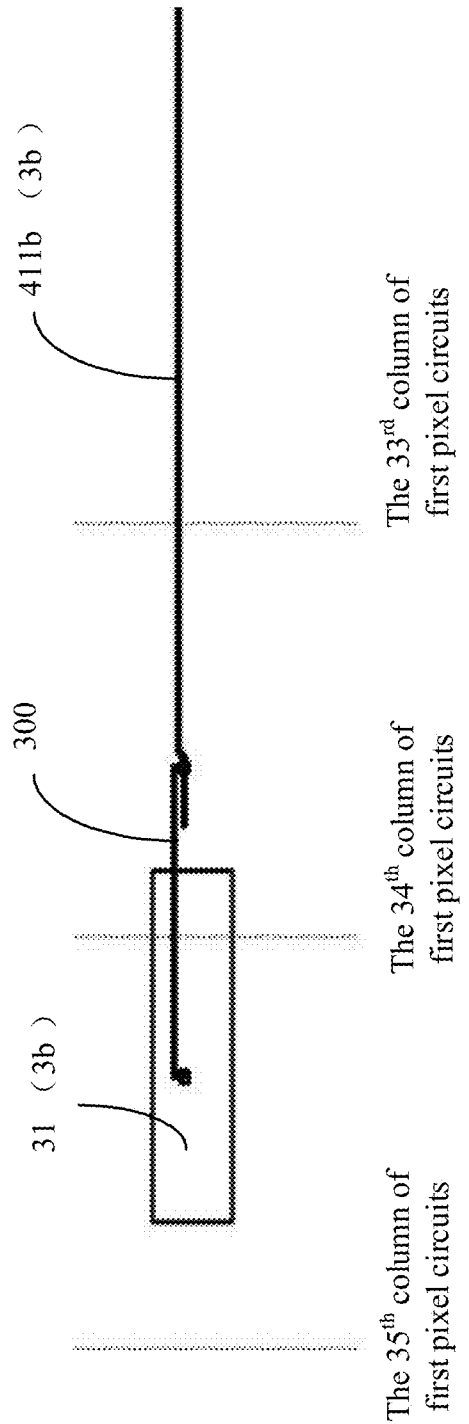
Figure 38:
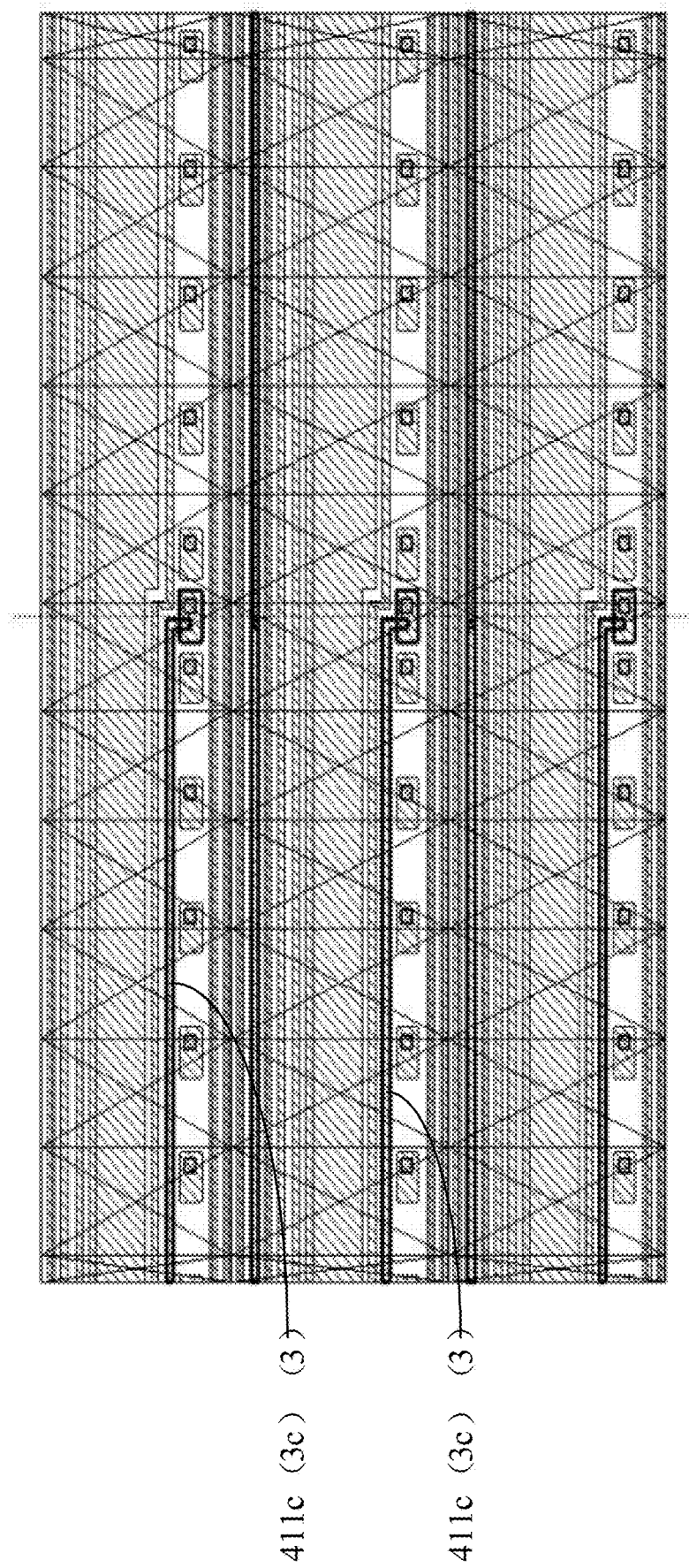
FIGS. 38-42 are schematic diagrams of an electric conductor of the 10$^{th}$ column of pixel circuit in an embodiment of a display panel according to the present disclosure.
Figure 39:
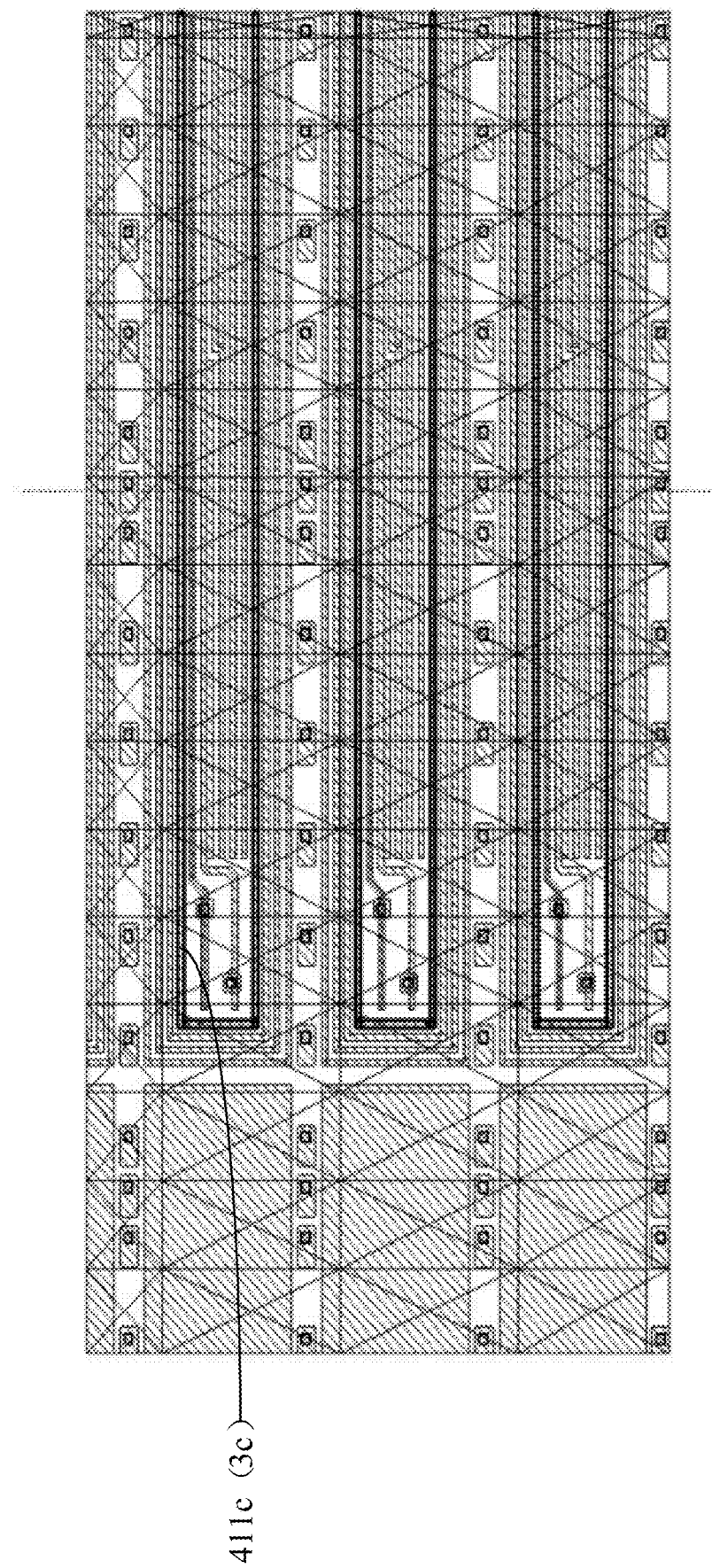
Figure 40:
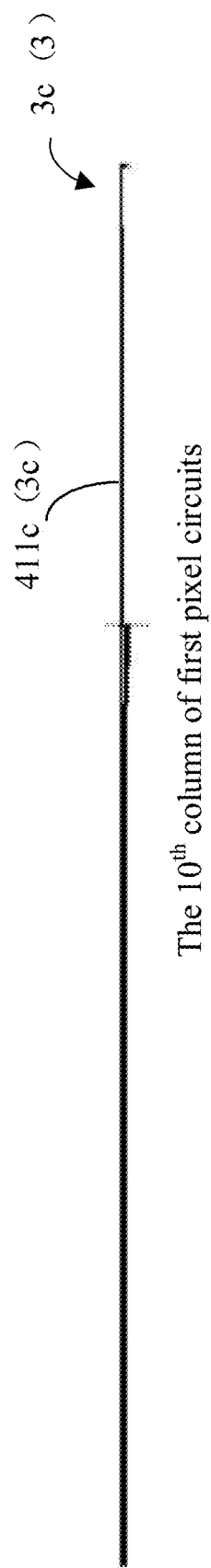
Figure 41:
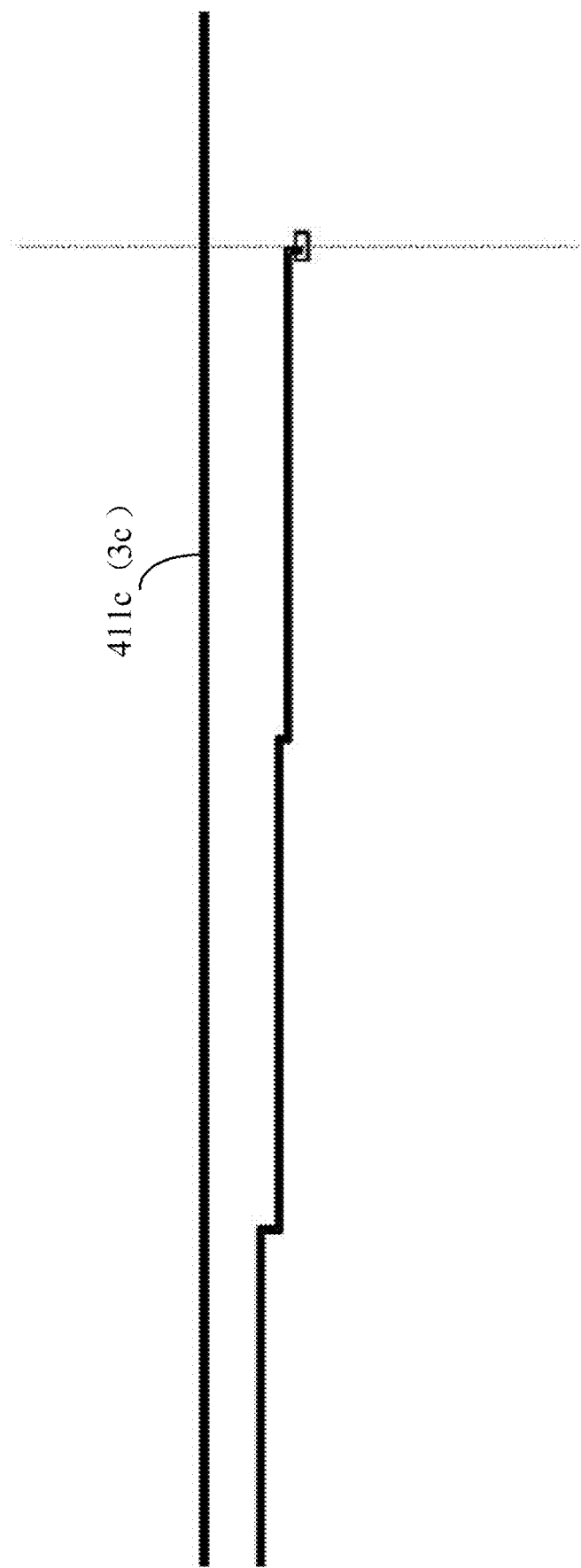
Figure 42:
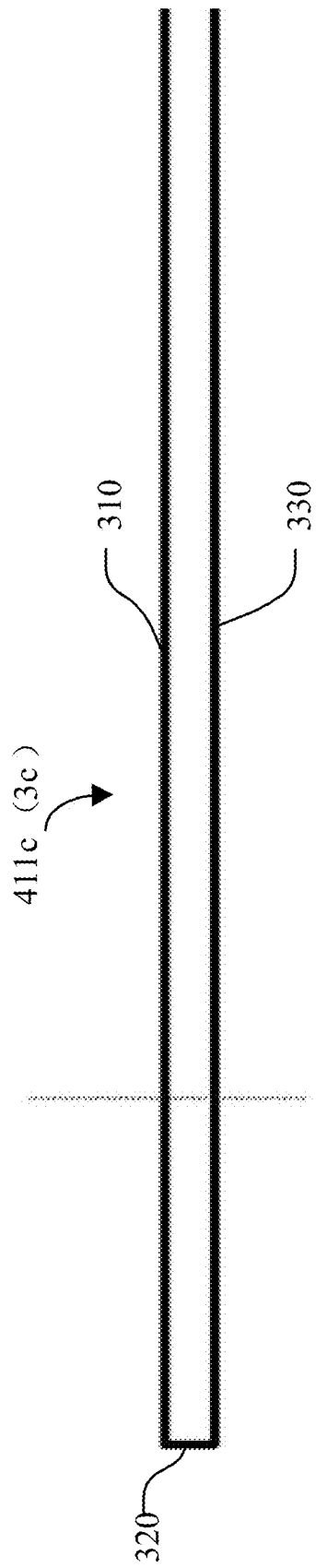

As shown in FIGS. 6, 11 and 18, in order to shield the interference of the lead 411 of the transfer layer 4 on the pixel circuit 10, a shielding layer 5 may be provided on one side of the drive transistor T3, close to the light-emitting layer 2, and a shielding signal, which may be a DC electrical signal, may be applied to the shielding layer 5, thereby reducing the interference with the pixel circuit 10, and preventing signal climb from being obstructed, so as to improve response speed.

In some embodiments of the present disclosure, the transmission line 600 may be shielded by the shielding layer 5, to prevent the transfer layer 4 from interfering with signals transmitted by the transmission line 600, i.e., to prevent the node N1 from being interfered with signal jump generated when the leads 411 are charged or discharged, thus preventing signal climb at the node N1 from being hindered, so as to improve response speed. Specifically, the shielding layer 5 may include a shielding portion 51 and a connection portion 52.

An orthographic projection of the transmission line 600 on the light-emitting layer 2 and that of the shielding portion 51 on the light-emitting layer 2 are at least partially overlapped. For example, the orthographic projection of the transmission line 600 on the light-emitting layer 2 may be located within an orthographic projection of the shielding portion 51 on the light-emitting layer 2. The shielding portion 51 and the second source and drain layer 005 may be located on the same layer, and made of the same material.

Furthermore, the connection portion 52 and the shielding portion 51 are located on the same layer, made of the same material, and connected to each other. The connection portion 52 may be connected to the power supply terminal VDD via the first source and drain layer 004, for receiving VDD signals, and the shielding layer 5 may be connected to the power supply terminal VDD in other ways, which is not particularly limited here. The VDD signals may be used as shielding signals, so as to produce shielding effect by inputting the VDD signals to the shielding portion 51, and other electrical signals may be applied to the shielding portion 51, as shielding signals, as long as they can produce shielding effect.

In addition, anti-interference is realized by shielding one side of at least one of the drive transistor T1 and the storage capacitor Cst, close to the light-emitting layer 2, by the shielding layer 5.

Further, the shielding layer 5 and the second compensation portion 32 may be located on the same layer, and made of the same material, the second compensation portion 32 is provided with a hollow portion 321, and the shielding layer 5 is located in the hollow portion 321, and is spaced apart from the inner wall of the hollow portion 321.

Embodiments of the present disclosure further provide a display device, which may include the display panel of any of the above embodiments, and its structure and beneficial effect may be referring to the above embodiments of the display panel, and will not be repeated herein.

Figure 47:
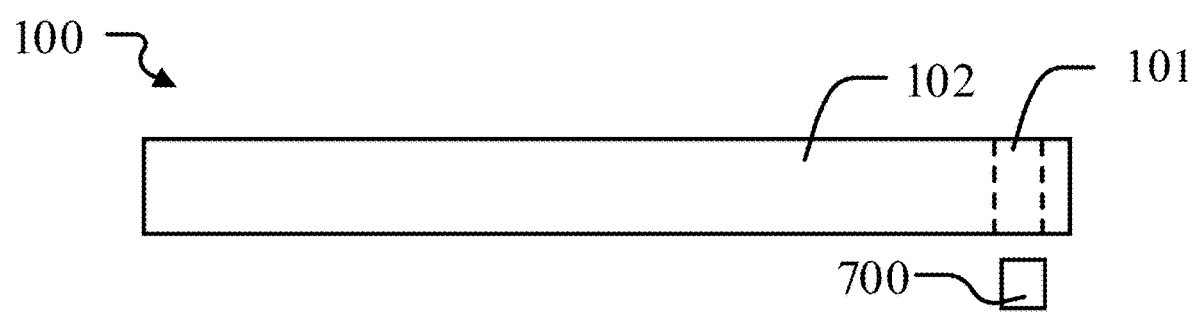
FIG. 47 is a schematic diagram of an embodiment of a terminal device according to the present disclosure.

Embodiments of the present disclosure further provide a terminal device, and as shown in FIG. 47, the terminal device may include a display panel 100 and a photographing device 700. Wherein:

The display panel 100 may be the display panel of any of the above embodiments, and its structure and beneficial effect may be referring to the above embodiments of the display panel, and will not be repeated herein.

The photographing device 700 may be provided on the backlight side of the display panel 100, i.e., the back side of the light emitting direction. For example, if the OLED light-emitting devices of the display panel 100 are of a top-emitting structure, i.e., they emit light in a direction distal to the drive backplane, the photographing device 700 may be provided on a side of the drive backplane 1, distal to the light-emitting functional layer 212. Furthermore, the photographing device 700 may directly face the transparent region 101 and be used to capture images through the transparent region 101. If the OLED light-emitting devices of the display panel 100 are of a bottom-emitting structure, the photographing device 700 may be located on a side of the light-emitting functional layer 212, distal to the drive backplane 1. The photographing device 700 may include a lens and a photoelectric sensor, and the specific structure of the photographing device 700 is not particularly limited here, as long as it can capture images.

The terminal device of the present disclosure may be an electronic device having displaying and photographing function, such as a mobile phone, a tablet computer, a television, etc., which will not be enumerated here.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A display panel, comprising:
    a drive backplane having a transparent region and a pixel region at least partially surrounding the transparent region, wherein a plurality of pixel circuits distributed in an array is provided in the pixel region, and the pixel circuits comprise a plurality of columns of first pixel circuits and a plurality of columns of second pixel circuits distributed along a row direction; and
    a light-emitting layer provided on one side of the drive backplane, and comprising a plurality of light-emitting devices distributed in an array, wherein the light-emitting devices comprises a plurality of first light-emitting devices located in the transparent region and a plurality of second light-emitting devices located in the pixel region, wherein:
    each of the first light-emitting devices is connected to one of the first pixel circuits via one of transparent electric conductors, and each of the second pixel circuits is connected to one of the second light-emitting devices,
    a deviation between delay time of a signal transmitted by any of the electric conductors and a standard delay time, is not greater than a deviation threshold,
    the display panel further comprises a transfer layer disposed on one side of the drive backplane, wherein the light-emitting layer is disposed on a surface of the transfer layer, distal to the drive backplane, the transfer layer comprises a plurality of lead layers being mutually insulated, each of the lead layers comprises a plurality of leads being mutually insulated, and
    at least a part of the electric conductors further comprise a first compensation portion connected to the lead of the electric conductor, and the first compensation portion and one of the lead layers are provided on a same layer, and are made of a same material.

2. The display panel according to claim 1, wherein, for two of the electric conductors connected to two of the first pixel circuits in a same row, an area of the electric conductor of the first pixel circuit closer to the transparent region is greater than an area of the electric conductor of the first pixel circuit farther to the transparent region.

3. The display panel according to claim 2, wherein:
    each of the leads extends from the transparent region to the pixel region;
    one of the first light-emitting devices is connected to one of the first pixel circuits via one of the leads; and
    each of the electric conductors comprises at least one of the leads.

4. The display panel according to claim 3, wherein the lead layers comprise at least a first lead layer, a second lead layer and a third lead layer distributed sequentially from the drive backplane towards the light-emitting layer, and
    the transfer layer further comprises:
    a first planarization layer, covering the first lead layer and a surface of the drive backplane, close to the light-emitting layer, wherein the second lead layer is provided on a surface of the first planarization layer, distal to the drive backplane;
    a second planarization layer, covering the second lead layer and a surface of the first planarization layer, close to the light-emitting layer, wherein the third lead layer is provided on a surface of the second planarization layer, distal to the drive backplane; and
    a third planarization layer, covering the third lead layer and a surface of the second planarization layer, close to the light-emitting layer; wherein the light-emitting layer is provided on a surface of the third planarization layer, distal to the drive backplane.

5. The display panel according to claim 1, wherein at least a part of the electric conductors further comprise a second compensation portion connected to the lead of the electric conductor, wherein the second compensation portion is provided in the drive backplane, and located in the pixel region, and
    in the row direction, an orthographic projection of the second compensation portion on the drive backplane and at least one of the first pixel circuits have an overlapping region.

6. The display panel according to claim 5, wherein:
    the pixel circuit comprises at least a drive transistor, a first reset transistor and a storage capacitor, a first electrode plate of the storage capacitor is multiplexed as a control terminal of the drive transistor, a first terminal of the first reset transistor is connected to the first electrode plate via a transmission line; and
    the drive backplane further comprises a shielding layer provided on one side of the drive transistor, close to the light-emitting layer, for receiving a shielding signal, wherein an orthographic projection of the shielding layer on the light-emitting layer and an orthographic projection of the transmission line on the light-emitting layer are at least partially overlapped.

7. The display panel according to claim 6, wherein the shielding layer comprises:
    a shielding portion, wherein the orthographic projection of the transmission line on the light-emitting layer is located within an orthographic projection of the shielding portion on the light-emitting layer; and
    a connection portion, wherein the connection portion and the shielding portion are provided on a same layer, and made of a same material, the connection portion is connected to the shielding portion, the connection portion and a second electrode plate of the storage capacitor are connected to a same power supply terminal, and the shielding signal is a power supply signal output from the power supply terminal.

8. The display panel according to claim 6, wherein the shielding layer and the second compensation portion are provided on a same layer, and made of a same material, the second compensation portion is provided with a hollow portion, and the shielding layer is disposed in the hollow portion, and is spaced apart from an inner wall of the hollow portion.

9. The display panel according to claim 5, wherein a length of the lead of at least a part of the electric conductors is greater than a distance between the first pixel circuit and the first light-emitting device in the row direction, to which the lead is connected.

10. The display panel according to claim 9, wherein:
the electric conductors comprise a first electric conductor, the lead of the first electric conductor is a first lead, the first lead extends along the row direction, and has a length greater than a distance between the first pixel circuit and the first light-emitting device in the row direction, to which the first lead is connected; and
the first electric conductor comprises the first compensation portion and the second compensation portion, a number of the first compensation portion of the first electric conductor is plural, the first compensation portions are connected to at least one side of the first lead along the row direction, a number of the second compensation portion of the first electric conductor is plural, and the second compensation portions are distributed along the row direction, and are connected to one another.

11. The display panel according to claim 10, wherein the first electric conductor further comprises a third compensation portion connected to the first lead, wherein the third compensation portion is provided in the drive backplane, and located locally in the transparent region.

12. The display panel according to claim 11, wherein the third compensation portion and the second compensation portion are provided on a same layer, and made of a same material.

13. The display panel according to claim 1, wherein:
the electric conductor comprises a second electric conductor, the lead of the second electric conductor is a second lead, and the second lead extends along the row direction, and has a length greater than a distance between the first pixel circuit and the first light-emitting device in the row direction, to which the second lead is connected; and
the second electric conductor comprises the first compensation portion connected to the second lead.

14. The display panel according to claim 9, wherein:
the electric conductor comprises a third electric conductor, and the lead of the third electric conductor is a third lead;
the third lead comprises a first segment, a second segment and a third segment, the first segment is connected to one of the first light-emitting devices, and extends to the pixel region along a row direction, the first segment has a length greater than a distance between the first pixel circuit and the first light-emitting device in the row direction, to which the third lead is connected; and
the second segment extends along a column direction, and is connected to one end of the first segment, located in the pixel region, and the third segment extends towards one side of the second segment, close to the transparent region in the row direction, and connected to one of the first pixel circuits.

15. The display panel according to claim 9, wherein:
the electric conductor comprises a fourth electric conductor, and the lead of the fourth electric conductor is a fourth lead,
the fourth lead comprises a first segment, a second segment and a third segment, the first segment is connected to one of the first light-emitting devices, and extends to the pixel region along a row direction, the first segment has a length greater than a distance between the first pixel circuit and the first light-emitting device in the row direction, to which the fourth lead is connected, the second segment extends along the column direction, and is connected to one end of the first segment, located in the pixel region, and the third segment extends towards one side of the second segment, close to the transparent region in the row direction, and connected to one of the first pixel circuits, and
the fourth electric conductor comprises the first compensation portion, the first compensation portion of the fourth electric conductor is located between the first segment and the third segment, and on one side of the second segment, close to the transparent region, and the first compensation portion of the fourth electric conductor is connected to at least one of the first segment, the second segment and the third segment.

16. The display panel according to claim 4, wherein:
a region of the light-emitting layer corresponding to the transparent region is divided into four light-emitting regions along a first central axis and a second central axis, wherein the first central axis is a central axis of the transparent region extending along a column direction, and the second central axis is a central axis of the transparent region along the row direction,
the light-emitting region comprises a first sub-region, a second sub-region, a third sub-region and a fourth sub-region being sequentially close to the first central axis along the row direction,
the lead connected to the first light-emitting device in the first sub-region is located on the first lead layer,
the lead connected to the first light-emitting device in the second sub-region is located on the second lead layer,
the lead connected to the first light-emitting device in the third sub-region is located on the third lead layer, and
the lead connected to the first light-emitting device in the fourth sub-region is located on at least one of the first lead layer, the second lead layer and the third lead layer.

17. The display panel according to claim 6, wherein the pixel circuit comprises an active layer, a first gate electrode layer, a second gate electrode layer, a first source and drain layer and a second source and drain layer distributed in a direction close to the light-emitting layer, wherein the shielding layer and the second source and drain layer are provided on a same layer, and made of a same material.

18. The display panel according to claim 17, wherein a material of the leads comprises at least one of indium tin oxide and indium gallium zinc oxide, and a material of the second source and drain layer comprises metal.

19. A display device, comprising:
a display panel, comprising:
a drive backplane having a transparent region and a pixel region at least partially surrounding the transparent region, wherein a plurality of pixel circuits distributed in an array is provided in the pixel region, and the pixel circuits comprise a plurality of columns of first pixel circuits and a plurality of columns of second pixel circuits distributed along a row direction; and
a light-emitting layer provided on one side of the drive backplane, and comprising a plurality of light-emitting devices distributed in an array, wherein the light-emitting devices comprises a plurality of first light-emitting devices located in the transparent region and a plurality of second light-emitting devices located in the pixel region;
wherein each of the first light-emitting devices is connected to one of the first pixel circuits via one of transparent electric conductors, and each of the second pixel circuits is connected to one of the second light-emitting devices, and wherein a deviation between delay time of a signal transmitted by any of the electric conductors and a standard delay time, is not greater than a deviation threshold; and a photographing device provided on a backlight side of the display panel, and directly facing the transparent region, for capturing images through the transparent region, wherein:

the display panel further comprises a transfer layer disposed on one side of the drive backplane, the light-emitting layer is disposed on a surface of the transfer layer distal to the drive backplane, and the transfer layer comprises a plurality of lead layers being mutually insulated, each of the lead layers comprising a plurality of leads being mutually insulated, at least a part of the electric conductors further comprise a first compensation portion connected to the lead of the electric conductor, wherein the first compensation portion and one of the lead layers are provided on a same layer, and are made of a same material.

* * * * *

UNITED STATES PATENT AND TRADEMARK OFFICE
CERTIFICATE OF CORRECTION

| | | |
|---|---|---|
| PATENT NO. | : 12,131,695 B2 | Page 1 of 1 |
| APPLICATION NO. | : 17/423885 | |
| DATED | : October 29, 2024 | |
| INVENTOR(S) | : Yudiao Cheng et al. | |

It is certified that error appears in the above-identified patent and that said Letters Patent is hereby corrected as shown below:

On the Title Page

After item (65) and before item (51), please insert item (30):
--Foreign Application Priority Data
Sep. 30, 2020 (CN) ............ PCT/CN2020/119673--

Signed and Sealed this
Seventeenth Day of December, 2024

Derrick Brent
*Acting Director of the United States Patent and Trademark Office*